(12) United States Patent
Peschel

(10) Patent No.: US 6,169,406 B1
(45) Date of Patent: Jan. 2, 2001

(54) VERY LOW FREQUENCY HIGH VOLTAGE SINUSOIDAL ELECTRICAL TESTING METHOD, SYSTEMS AND APPARATUS

(76) Inventor: Stanley G. Peschel, P.O. Box AH, Millerton, NY (US) 12546

( * ) Notice: Under 35 U.S.C. 154(b), the term of this patent shall be extended for 0 days.

(21) Appl. No.: 09/071,852

(22) Filed: May 2, 1998

(51) Int. Cl.$^7$ ................................................. G01R 31/12

(52) U.S. Cl. ............................ 324/548; 324/511; 324/555
(58) Field of Search ............................. 323/341; 315/274, 315/282; 324/548, 519, 522, 527, 540, 541, 544, 511, 555

(56) References Cited

U.S. PATENT DOCUMENTS

| | | |
|---|---|---|
| 3,310,735 | 3/1967 | Peschel . |
| 3,491,290 | 1/1970 | Peschel . |
| 3,515,986 | 6/1970 | Peschel . |
| 3,609,614 | 9/1971 | Schutz . |
| 3,643,105 | 2/1972 | Bantz et al. . |
| 3,761,853 | 9/1973 | Schutz et al. . |
| 3,781,639 | 12/1973 | Peschel . |
| 3,886,412 | 5/1975 | Peschel . |
| 4,825,171 | 4/1989 | Lefeldt . |
| 5,477,113 | * 12/1995 | Christoffersson ................. 323/341 |

FOREIGN PATENT DOCUMENTS 0427551    5/1991   (EP) .

OTHER PUBLICATIONS

Biddle™ VLF Test Systems—from AVO International—pp. 9–8 and 9–9.
Customer Communication of HDW Electronics, Inc. dated Mar. 4, 1994—(one page).
*Reflexion* (The Magazine of Hagenuk Measurement Technology—No. 1—Oct. 1993 (seven pages with cover).

Drawings of DE 3629352 C2 published Feb. 15, '90 (4 pages) with "Brief Description of the 0.1 Hz Vlf test set" (one page) and "Translation of claims of german patent DE 3629352 C2"(one page).

(List continued on next page.)

\* cited by examiner

*Primary Examiner*—Safet Metjahic
*Assistant Examiner*—Jose M. Solis
(74) *Attorney, Agent, or Firm*—G. Kendall Parmelee

(57) ABSTRACT

Very low frequency (VLF) high voltage (HV) sinusoidal electrical test waves provide for testing AC electrical power installations and equipment having large electrical capacitances. VLF HV sinusoidal electrical waves are suitable for testing characteristics and/or qualities of insulation on long, buried electric power cables. Capacitance of a load being tested by VLF HV sinusoidal waves is discharged during a second half of each positive half-wave and during a second half of each negative half-wave by using a sequence of resistive discharge paths. Each successive discharge path in a sequence has less resistance than its predecessor for creating a sequence of progressively-reduced discharge Time Constants. Solenoid-operated switch contacts bring successive discharge paths into action. Also, solenoid-operated switch contacts reverse polarity to create positive and negative half waves of the VLF HV sinusoidal electrical test waves. To avoid inadvertent switch closure, downward spring-bias requires solenoids be energized for overcoming spring force and gravity to close switches upwardly. AC voltage is amplitude-modulated sinusoidally by moving a brush along transformer taps arranged with sine-function voltage differences. Alternatively, such modulation is achieved by a revolving heart-shaped-cam cyclically operating in opposite directions a variable autotransformer brush. Stepping-up amplitude-modulated AC voltage to 40 kilovolts or more, then rectifying and polarity reversing successive half waves creates VLF HV sinusoidal test waves.

59 Claims, 35 Drawing Sheets

OTHER PUBLICATIONS

Principals of Radar—McGraw–Hill, 1946—Title page and pp. 2–17 to 2–21.

"Investigation of alternative after laying tests for MV cables" by Kalkner W., Bach R., Plath R., Zhiyong Wei:—Technical University of Berlin—Germany, pp. 395 through 402 [B3 Test Methods (3) ]Jan. 3rd International Conference on Polymer Insulated Power Cable (JI Cable '91).

"High Voltage VLF Testing of Power Cables" by G.S. Eager, C. Katz, B. Fryszczyn, J. Densley and B.S. Bernstein:—IEEE Transactions on Power Delivery, vol. 12, No. 2, Apr. 1997, pp. 565 through 570.

"Effect of D.C. Testing Water Tree Deteriorated Cable and a Preliminary Evaluation of V. L. F. as Alternate" by G.S. Eager, B. Fryszczyn, C. Katz, H.A. ElBadaly, and A.R. Jean:–IEEE Transactions on Power Delivery, vol. 7, No. 3, Jul. 1992, pp. 1582 through 1591.

"A New Type of VLF High Voltage Generator Used for On–site Tests of Power Cables" by Wei Xinlao, Wang Yonghong, Chen Qingguo, and Ma Sen:–Harbin University of Science and Technology—Harbin, Heilongjiang, P.R. China, reported in Proceedings of the 5th International Conference on Properties and Applications on Dielectric Materials at Seoul, Korea on May 25–30, 1997 [15PO5], pp. 1113 through 1115, with cover sheet, page 1 of 1.

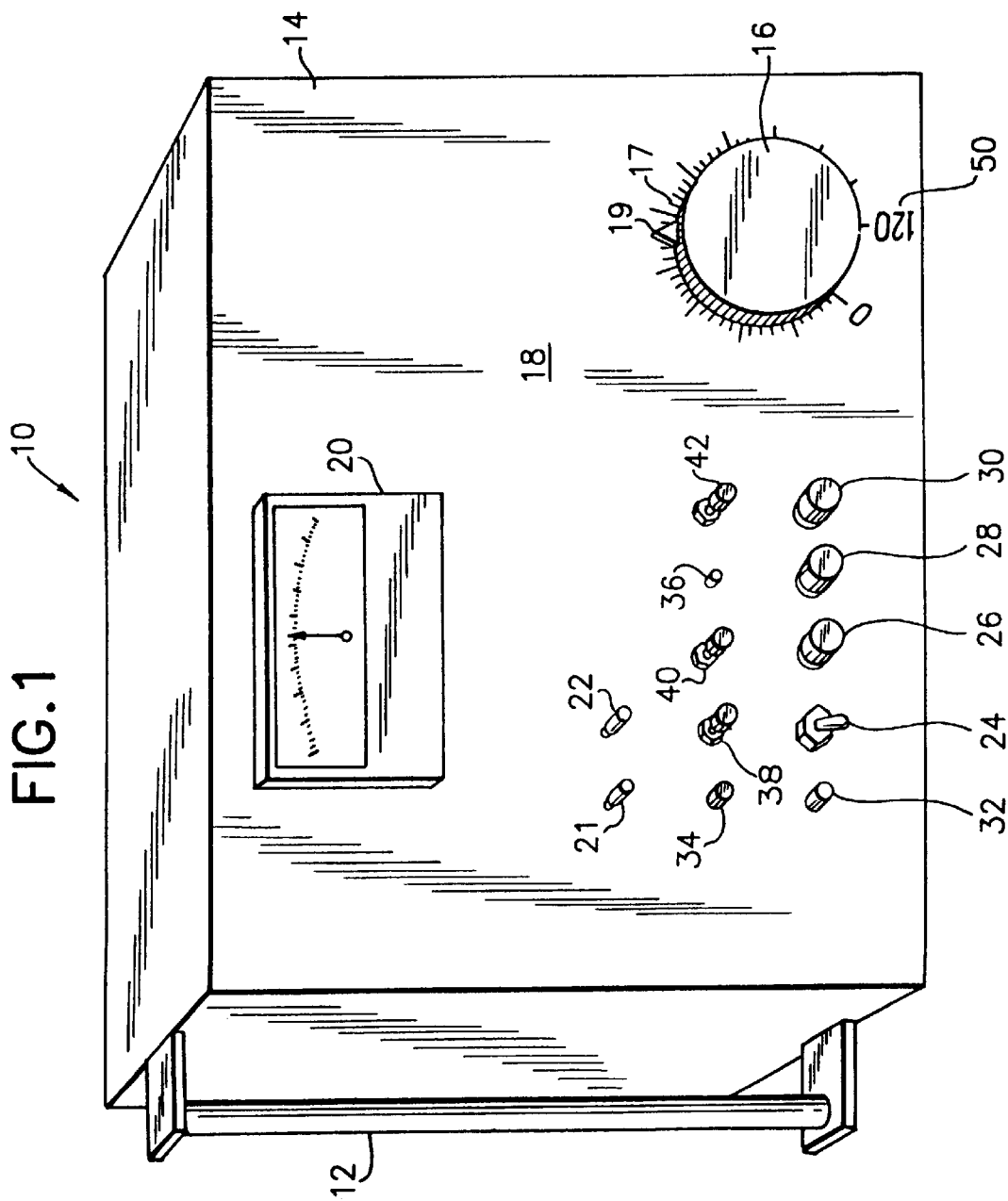

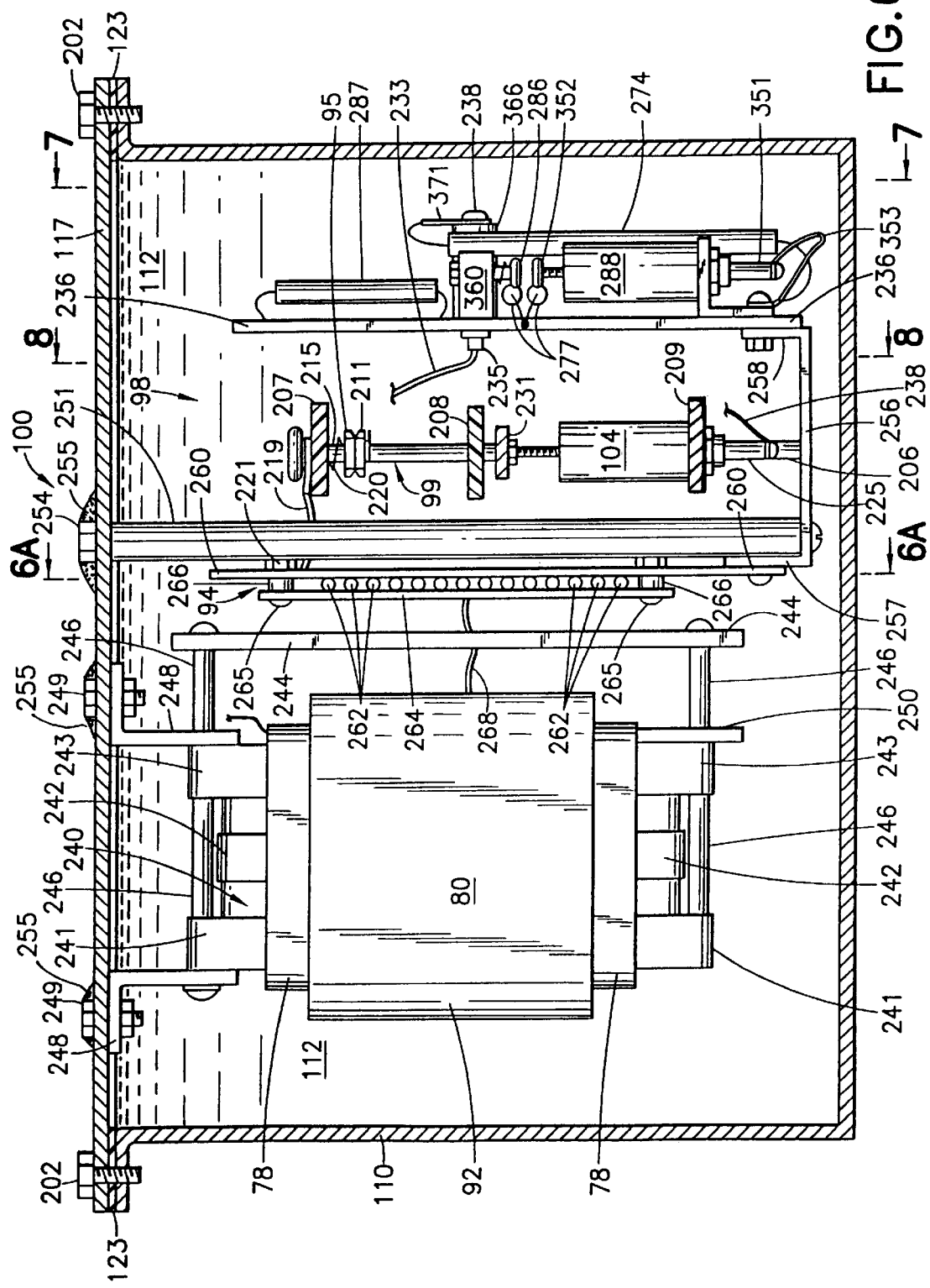

AC-VOLTAGE-MODULATION AUTOTRANSFORMER

| Angle: | Sine: | Tap Location (Turns): | Current-Limiting Resistors 186 Ohms: |
|---|---|---|---|
| 90° | 1.0000 | Full-346 | 0 |
| 85° | .9962 | 344 | 0.027 |
| 80° | .9948 | 340 | 0.041 |
| 75° | .9659 | 333 | 0.072 |
| 70° | .9397 | 324 | 0.085 |
| 65° | .9063 | 313 | 0.115 |
| 60° | .8660 | 299 | 0.127 |
| 55° | .8192 | 283 | 0.154 |
| 50° | .7660 | 265 | 0.165 |
| 45° | .7071 | 244 | 0.188 |
| 40° | .6428 | 222 | 0.198 |
| 35° | .5736 | 198 | 0.217 |
| 30° | .5000 | 173 | 0.225 |
| 25° | .4226 | 146 | 0.239 |
| 20° | .3420 | 117 | 0.245 |
| 15° | .2588 | 89 | 0.254 |
| 10° | .1737 | 60 | 0.257 |
| 5° | .0872 | 30 | 0.262 |
| 0° | 0 | No Turns | 0 |

FIG. 14

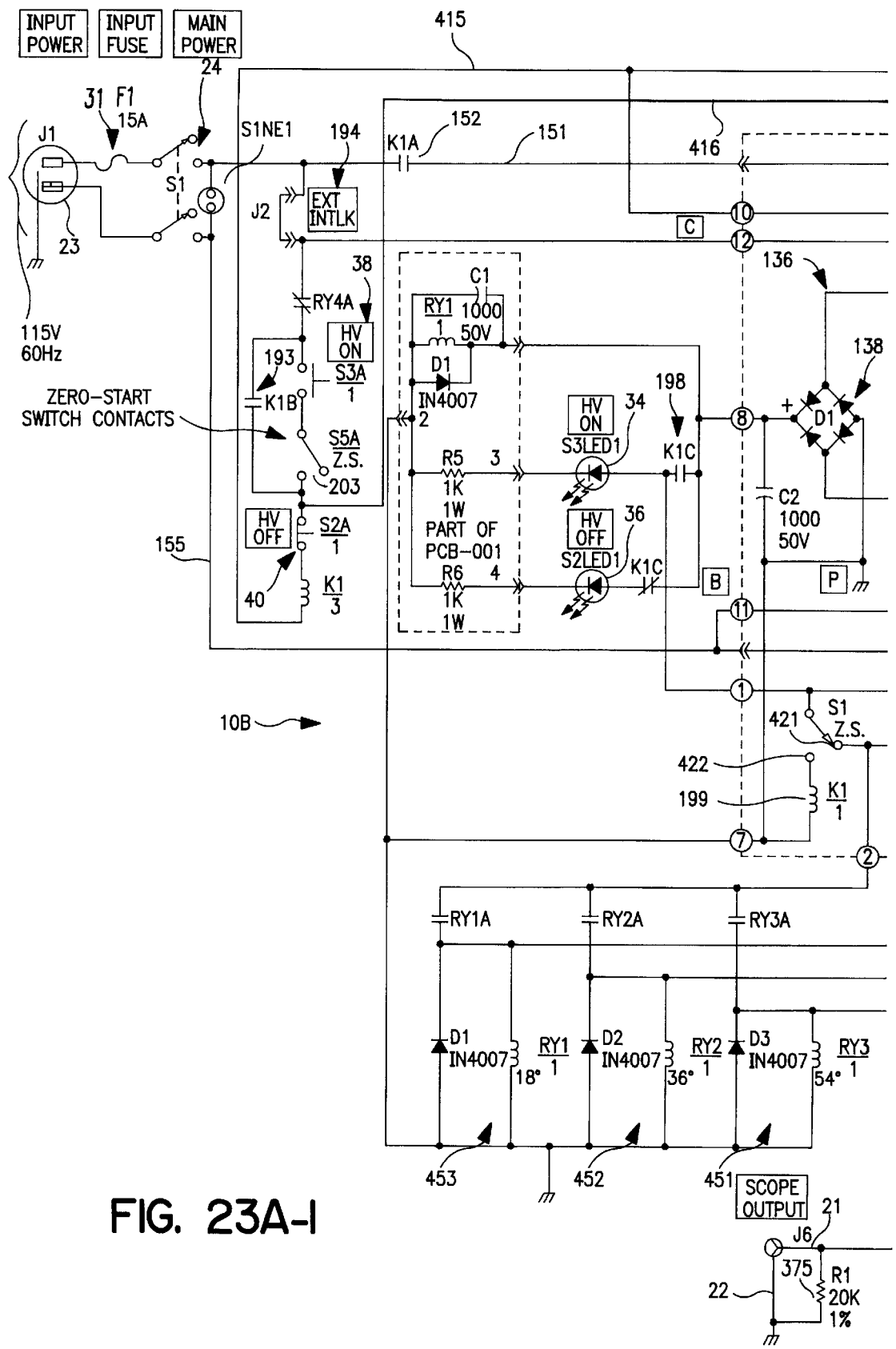
FIG. 23A-I

VERY LOW FREQUENCY HIGH VOLTAGE SINUSOIDAL ELECTRICAL TESTING METHOD, SYSTEMS AND APPARATUS

FIELD OF THE INVENTION

The present invention is in the field of Very Low Frequency ("VLF") High-Voltage ("HV") electrical testing of alternating current ("AC") electrical installations and equipment which have large capacitances, for example such as VLF HV testing of characteristics and/or qualities of insulations on long lengths of buried electric power distribution cables, testing of insulation in large rotating AC machines and other AC apparatus which exhibit large capacitance values under HV test conditions. As used herein, the terms "Very Low Frequency", "VLF" and "very low frequency" mean a frequency below about 1 Hz.

BACKGROUND

It was previous practice to test HV insulation of lengths of underground electric power distribution cables by applying HV direct current (DC) test voltages. Years ago, HV insulation for buried cables included oil-impregnated paper surrounding conductors. This insulation was encased in an outer protective jacket such as a lead sheath or other suitable protective conductive conduit. The application of HV DC test voltage to lengths of such prior buried cables would charge up the capacitance existing between their conductors and their jackets, sheaths or conduits to a peak residual voltage charge level substantially equal to the HV DC test voltage being applied. But a residual voltage charge resulting from such a test did not significantly damage cable insulation, because prior types of insulation allowed such residual charges soon to leak away.

HV DC testing of service-aged buried cable having dielectric comprising cross-linked solid polyethylene (XLPE) is undesirable for at least two reasons: (a) Such testing causes space charge to accumulate in the dielectric which results in increased electric stress locally, notably in the vicinity of "water trees" which have penetrated into the dielectric material of the buried cable. Such local electric stress therefore can result in subsequent failure in service which otherwise would not have occurred. And, (b) HV DC testing is ineffective in identifying quality problems other than major damage to the insulation. This ineffectiveness of HV DC in identifying quality problems applies to cables having other dielectric materials such as polyethylene (PE) or extruded Polyethylene rubber (EPR), not just to those having XLPE dielectric.

Various non-DC HV test systems have become commercially available in recent years. They are used instead of HV DC testing of modern buried power cables, AC machines and other HV AC electrical equipment which have large capacitances. However, these non-DC HV test systems available today do not provide advantages such as those provided by embodiments of the invention herein described.

For example, accompanying is a two-page write-up by AVO International on their BIDDLE ("TM") Very Low Frequency Test Systems. This write-up states:

> Each Biddle VLF Test System consists of two main units: a control console and a high-voltage, oil-filled tank (either 85 kV or 100 kV). Red warning beacon and reusable shipping container are available options. Operating at a frequency of 0.1 Hertz, these systems have the capability of testing the largest rotating machines. An increasing amount of test data is proving the feasibility of substituting a 0.1-Hertz test for the normal 50/60-Hertz test, It is noted that Biddle's test system has specifications as follows:

| SPECIFICATIONS | | |
|---|---|---|
| CAT. NO. | 682983 | 682990 |
| VLF Crest Output Voltage | 85 kV | 100 kV |
| Rated Load Capacitance | 0.4 μF | 1.0 μF |
| Rated DC Output | ±85 kV, 10 mA | ±100 kV, 50 mA |
| Equivalent 50-Hz Rating* | 60 kV 1130 kVA | 70 kV 1540 kVA |
| Equivalent 60-Hz Rating* | 60 kV 1360 kVA | 70 kV 1850 kVA |

*The Equivalent 50-/60-Hz Rating is the rating that would be needed to energize the rated load capacitance at the same crest test voltage as the VLF Test System.

| Input Supply |
|---|
| 240 Vac ± 10%, 1φ, 50/60 Hz with ground, NEC 50 A |
| 277 Vac ± 10%, 1φ, 50/60 Hz with ground, NEC 50 A |

Biddle's description states:

| Maximum Input Current Required |
|---|
| At 240 V in dc mode, 45 A continuous; in VLF mode, 70 A intermittent |
| At 277 V in dc mode, 40 A continuous; in VLF mode, 60 A intermittent |

Also, Biddle's description sets forth:

| Dimensions |
|---|
| HV Power Supply, 85 kV (oil-filled) |
| Cat. No. 682983 42 H × 27 W × 37 D in. 106.1 H × 69.1 W × 94.1 D cm HV Power Supply, 100 kV (oil-filled) |

It is noted that Biddle's information sheets set forth the dimensions of their 85 kV (oil-filled) system but do not state the dimensions of their 100 kV system. Therefore, to provide a comparison between the Biddle system and a system embodying the present invention, the Biddle 85 kV (oil-filled) system will be used as a basis for comparison.

The "Rated Load Capacitance" of the Biddle CAT No. 682983 is 0.4 micro Farads ($\mu$F). The embodiment of the present invention described first can test loads having capacitance levels up to about 2.2 $\mu$Fs at 0.05 Hz, i.e., more than five times the testing capability of Biddle's unit. Embodiments of the invention are described later which are adapted to test loads at High Voltage at Very Low Frequencies of 0.1 Hz, 0.05 Hz, 0.02 Hz, etc.

Moreover, this Biddle unit in its Very Low Frequency (VLF) mode requires input power of 240 Volts at 70 Amperes intermittent, which represents an intermittent input power of 16.8 kilovolt Amperes (kVA). In contrast, during testing operations the sine-function test wave embodiment of the invention first described herein uses an average input of about 8 Amperes at 120 Volts, i.e., about 0.96 kVA. Its intermittent peak power is only about 1.44 kVA, which is less than about 9% of the intermittent kVA drawn by the Biddle 85 kV system. Moreover, during continuous stand-by, the disclosed method and systems require only a very modest power input, i.e., less than input into a typical household bread toaster. This stand-by input for the method and system first disclosed herein is only about 4 Amperes at 120 V, i.e., less than 0.48 kVA.

It is noted that Biddle describes their 85 kV power supply as measuring 42 inches (H) by 27 inches (W) by 37 inches (D), thereby having slightly more than 41,900 cubic inches of volume. A gallon contains 231 cubic inches. Thus, this Biddle oil-filled power supply has a volume of more than 180 gallons. Transformer oil weighs about 8 pounds per gallon. Hence, such a power supply, if filled only with transformer oil, would weigh more than 1,400 pounds. Since this HV Biddle unit also includes components of greater specific weight than its oil content, i.e., such as transformer iron and conductors of copper, its overall weight likely exceeds one Ton.

In contrast, HV units described herein have volumes less than 5½ gallons and weigh less than about 75 pounds including transformer oil and all internal components.

Typical underground electrical power distribution cables having XLPE, PE or EPR dielectric are operated by power companies at voltages usually in a range from about 5 kV up to about 35 kV. Such buried cables with a length of about 15,000 feet to about 25,000 feet (about 3 to 5 miles) often exhibit a total capacitance of about 2.2 microFarads ($\mu$F). After such a length of cable has been buried, the power company will test it before connecting it to a power distribution substation. Attempting to use HV DC test procedures for such a buried cable having XLPE, PE or EPR insulation is not advisable for reasons already explained above.

SUMMARY OF THE DISCLOSURE

A method, systems and apparatus embodying the invention enable a length of buried HV power distribution cable, for example about 3 to 5 miles long and having a capacitance of about 2.2 $\mu$F, to be tested conveniently by Very Low Frequency Sine-Wave Voltage up to a peak voltage level exceeding the cable's intended peak AC operating voltage. Moreover, the illustrative embodiments of this invention overcome or substantially reduce the inconveniences, inefficiencies and awkward handling problems associated with a heavy, bulky HV power supply such as Biddle's described above, likely weighing more than a Ton. In addition to the Biddle power supply, there also is a Biddle control unit, which is estimated to weigh more than 500 pounds.

In accordance with the disclosed method, a sequence of steps is employed for producing very low frequency Sine-Wave HV test voltage, i.e., VLF HV sinusoidal test waves, for testing insulation in HV AC electrical power equipment. The first step is amplitude modulating an infeed of readily-available AC voltage supplied from a conventional, household-voltage-level AC power source, for example having a voltage of about 120 volts (RMS). Such amplitude modulating of the AC voltage is done in a predetermined repetitive half-cycle sine-wave pattern at Very Low Frequency (VLF). For example, this VLF is 0.05 Hertz having a Period "P" (FIG. 2) of twenty seconds per two half cycles of a substantially pure sinusoidal shape of the amplitude modulation envelope. Then, the half cycles of sinusoidally-modulated AC voltage are stepped up by an HV transformer to a desired high AC voltage, for example to 40 or 60 kilovolts. Finally, the resulting very-low-frequency-modulated HV AC is rectified and polarities of successive rectified half cycles are reversed for creating full-cycles of VLF HV sine-wave test voltage (FIG. 10).

As a further feature, AC voltage is adjusted over a range from zero up to the full voltage level available from this source. Such adjustment of incoming AC voltage provides control of peak levels of the VLF HV sinusoidal test waves. For example, an incoming AC voltage at 120 V results in a VLF HV sinusoidal test wave peak voltage level of 40 kV (or 60 kV in a higher-voltage unit). Reducing this incoming AC voltage to 90 V or 60 V or 45 V results in VLF HV peak levels of 30 kV or 20 kV or 15 kV, respectively, (or 45 kV or 30 kV or 22.5 kV for a 60 kV unit, etc.) and so forth for other adjustments of the AC voltage.

As the magnitude of the voltage of a VLF VH test wave applied to a capacitive test load is increased during a first half of a half cycle of a sinusoidal test wave, the voltage appearing across the load will match (will closely follow) the sine-shape envelope of the applied test waves. However, during a second half of a half cycle of a sinusoidal test wave (when the voltage applied to the load is decreasing), a capacitive load (if not suitably discharged) will retain some portion of its residual charged voltage. Thus, if not discharged, the voltage appearing across the load (the load voltage) can "escape" from being controlled by the sine-wave envelope of the decreasing applied voltage. Then, the escaped load voltage will remain in an uncontrolled status above the envelope of decreasing applied voltage.

The disclosed method, system and apparatus prevent the voltages of capacitive test loads from escaping from control during a time of decreasing voltage of the envelope of an applied VLF sinusoidal test wave. The method, system and apparatus force discharge voltages of capacitive test loads to remain "under" (beneath) the envelopes of applied VLF sinusoidal test waves. The disclosed test method, system and apparatus employ a sequence of resistance discharges providing a preselected sequence of progressively reduced Resistance-Capacitance (RC) Time Constants. These progressively reduced Time Constants are brought into action at preselected points during decreasing voltage quadrants Q and Q' (FIG. 10) of VLF sinusoidal test waves. These progressively reduced Time Constants are designed such that plotted curves of their exponential-discharge voltages remain "under" the envelopes of decreasing test voltages intended to be applied to capacitive loads. Moreover, shapes of these exponential, progressively reduced Time Constant discharges and points at which they are switched into action are designed to save Wattage of electrical power needed for creating VLF HV test wave envelopes of sinusoidal shape applied across capacitive test loads.

Electro-mechanical switching serves to decrease the effective values of resistance of the discharge paths being used during preselected portions of the envelopes of VLF HV test waves during their decreases, thereby providing a preselected sequence of exponential discharges of preselected Time Constants. Voltage drops beneath test-wave envelopes (which otherwise would occur during such sequences of exponential discharges) are "filled in" by applied power to maintain intended sinusoidal test wave shapes. By virtue of preselected sequencing of preselected discharge Time Constants this "fill-in" by applied power is provided without consuming large amounts of electrical power. Thus, applied voltages readily force resultant VLF sinusoidal test waves applied to capacitive test load voltages closely to follow intended sinusoidal test-wave envelope shapes.

By virtue of saving electrical power needed to "fill in" during decreases of sinusoidal test wave envelopes, embodiments of the invention having VLF High voltage sinusoidal output test voltages peaking at 40,000 volts or more intermittently draw a peak current of only about 11 to 12 Amperes at 120 Volts (about 1.44 kVA) during operation. Thus, one technician can readily transport the HV output unit which weighs less than about 75 pounds.

Moreover, as a fail-safe factor, a high-ohmic resistor always is connected across a capacitive load being tested. Therefore, if there is any failure or loss of power being supplied, this resistor will discharge the capacitive load within relatively few seconds.

In accord with aspects of a first system embodying the invention, AC electricity is fed to a transformer having a sequence of taps on a winding for providing a sequence of output voltages corresponding to preselected points on an AC voltage envelope of a VLF half-cycle sine-wave. In other systems embodying the invention, this transformer is a variable transformer whose output brush is operated in a predetermined manner for providing the AC voltage of a VLF half-cycle sine-wave.

In the first system, the taps are connected to respective contacts arranged in a planar circular array. An electrical brush mounted on a revolvable, brush-carrying arm has an axis of revolution positioned at the center of the circular array. This brush is spring-biased toward the array. The brush-carrying arm is revolved at slow speed by a drive motor for bringing the brush into engagement with successive contacts of the array in make-before-break engagement. Resistors connected in circuit in series between respective transformer taps and their contacts in the array minimize short-circuit current flow through windings of the tapped transformer. These resistors are scaled in respective resistance values so as to correspond with respective voltage differentials occurring between successive contacts. Thus, short-circuit current flows through various windings of the transformer are kept to similar acceptable minimal amperage levels. The alternating current supplied from the revolving electrical brush moving over the circular array of contacts provides an amplitude-modulated AC voltage having a half-cycle envelope of very low frequency sine-wave shape corresponding to the voltage of half cycles of a VLF HV sinusoidal test wave.

In embodiments of the invention having a variable transformer, for example such as a toroidal-wound transformer available from Warner Electric of Bristol, Connecticut, under the POWERSTAT mark, the movable brush is slowly moved so that the envelope of AC being supplied from the movable brush is a VLF half cycle corresponding to a half cycle of the desired VLF HV sinusoidal test wave.

In either embodiment, this amplitude-modulated AC voltage is stepped up to a desired HV level by a step-up transformer. The stepped-up voltage is rectified. Each successive rectified half cycle is reversed in polarity for creating the VLF HV sinusoidal test wave.

In the embodiment of the invention wherein the brush-carrying arm is slowly revolved over a circular array of contacts, it is revolved one full revolution in a first direction (for example counterclockwise) for generating a VLF half cycle of an AC sine-wave modulated envelope. Then, the arm is revolved one full revolution in a second opposite direction (for example clockwise) for generating a second VLF half cycle of the AC sine-wave modulated envelope.

In the disclosed embodiments of the invention, polarity of rectification of the stepped-up high voltage is reversed each time motion of a movable brush is reversed for reversing polarity of successive half cycles of the VLF HV test wave, thereby providing full-cycle VLF HV test waves.

Among advantages provided by the illustrative embodiments of the invention are those resulting from the fact that they can create and apply VLF HV sinusoidal test waves to an HV electrical load, wherein the test waves have an essentially pure sine-wave shape. Moreover, these results are achieved in dealing with test loads having a capacitance of 2.2 $\mu$F at a frequency of 0.05 Hz and at a voltage level up to 40 kV or 60 kV or more.

Moreover, the essentially pure sinusoidal shape of the VLF HV test waves being applied to the electrical load under test is not load-sensitive up to a load level of 2.2 microFarads, i.e., is not dependent upon cable length (not dependent upon capacitance of the electrical load being tested) for cable lengths having capacitance values up to 2.2 microFarads.

It is noted that higher-voltage-rated underground electric power distribution cables often exhibit less capacitance per mile of length than lower-voltage-rated cables of the same length. Higher voltage cables have a thicker layer of dielectric between the central conductor and their jackets, sheaths or conduits. Thus, there is greater spacing between two conductive elements. Hence there is less capacitance between them per mile of cable length.

Polarity of the rectified HV is reversed by actuation of DC-energized solenoids. Thus, advantageously, the solenoid-energizing voltage is independent of the inherent alternating magnitude of an AC voltage supply. Switching is done by actuation of these solenoids when the envelope of the stepped-up AC voltage is at or very near zero so that insignificant voltage and insignificant current are encountered at switch contacts during switching.

A heavy duty wire-wound resistor in series with the cable connected to a capacitive load limits current discharge from the load in event of a flash-back occurring in the HV output unit, thereby protecting the test equipment.

Also, movable contacts of all HV relays are closed by upward motion occurring during energization of relay solenoids. In other words, movable components of HV relays are down in relation to the earth's gravitation in their open positions when they are not energized. Thus, the relays must be energized for moving their components upwardly into closed position, thereby moving up against the force of gravity. Consequently, these HV relays can not accidentally become "closed" because their solenoids intentionally must be energized for closing the relay contacts.

BRIEF DESCRIPTION OF THE DRAWINGS

The invention, together with further objects, features, advantages and aspects thereof, will be more clearly understood from the following detailed description considered in conjunction with the accompanying drawings which are not drawn to scale with the emphasis instead being placed upon clearly illustrating the principles of the invention. Like reference numerals indicate like elements, like components or similar structures throughout the different views.

The accompanying drawings, which are incorporated in and constitute a part of the specification, illustrate presently preferred embodiments of the invention and, together with the general description set forth above and the detailed description of the preferred embodiments set forth below, serve to explain the principles of the invention. In these drawings:

As shown in FIG. 2, AC voltage being modulated has a frequency of 60 Hertz (Hz). Two half cycles of the amplitude-modulated Voltage are shown having a time duration "P" of 20 seconds, so that a Very Low Frequency (VLF) High-Voltage (HV) test wave (FIG. 10) created from this amplitude modulated AC Voltage envelope (FIG. 2) has a Period P of 20 seconds (FIG. 10), which corresponds with a frequency of 0.05 Hz.

FIG. 6 is a cross-sectional view of VLF HV unit whose circuit diagram is shown in FIG. 5B. Its conductive case is oil-filled.

FIG. 7 shows two solenoid-actuated HV switches and associated resistors for keeping downward-sloping portions of voltages appearing across capacitive loads "beneath" (and in relatively close conformance with) decreasing portions of envelopes of applied VLF HV sinusoidal test waves.

FIG. 8 shows solenoid-actuated HV polarity-reversing switches for reversing polarity of the rectified HV for providing HV sinusoidal test waves.

FIG. 12 shows three exponential voltage discharge curves: a first starting at 90°, then a second starting at 42° before 180° (namely starting at 138°) and a third starting at 18° before 180° (namely starting at 162°), wherein each successive discharge curve has a reduced Time Constant compared with the immediately preceding discharge curve.

FIG. 14 is a listing of values of the sine function in increments of 5° from 90° to 0°. FIG. 14 shows tap locations in terms of numbers of turns on an autotransformer included in the AC-voltage-modulation apparatus shown in FIG. 11. FIG. 14 also shows ohmic values of current-limiting resistors connected in circuit with respective taps.

FIG. 24 shows four exponential discharge curves of progressively reduced Time Constants. A first starts at 90°; a second starts at 54° before 180° (namely at 126°); a third starts at 36° before 180° (namely at 144°); and a fourth starts at 18° before 180° (namely at 162°).

DETAILED DESCRIPTION OF A PREFERRED EMBODIMENT OF THE INVENTION

Figure 3:
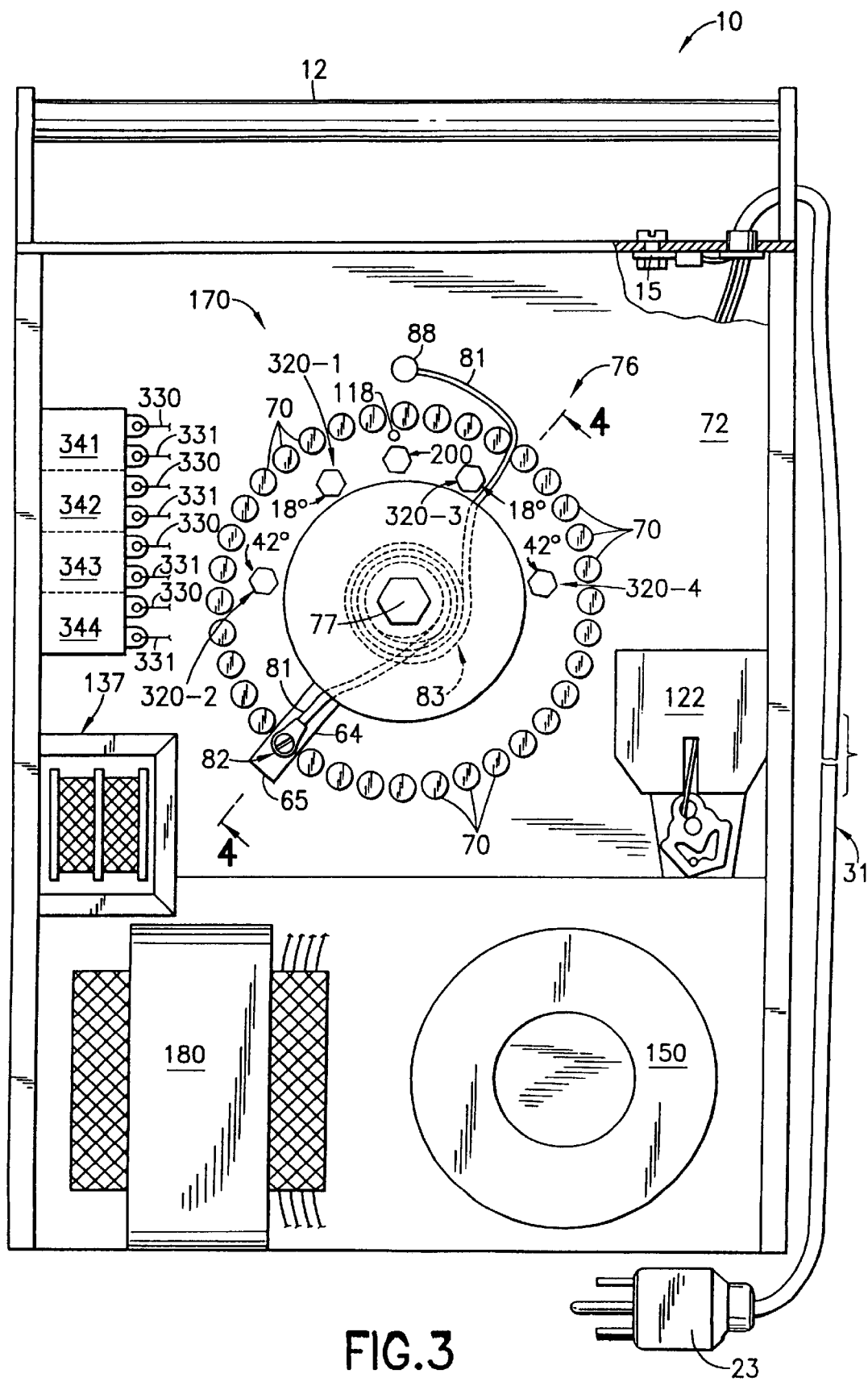
FIG. 3 is an elevational view of the control unit shown in FIG. 1 with the unit standing on one end and with its housing opened.
Figure 5A:
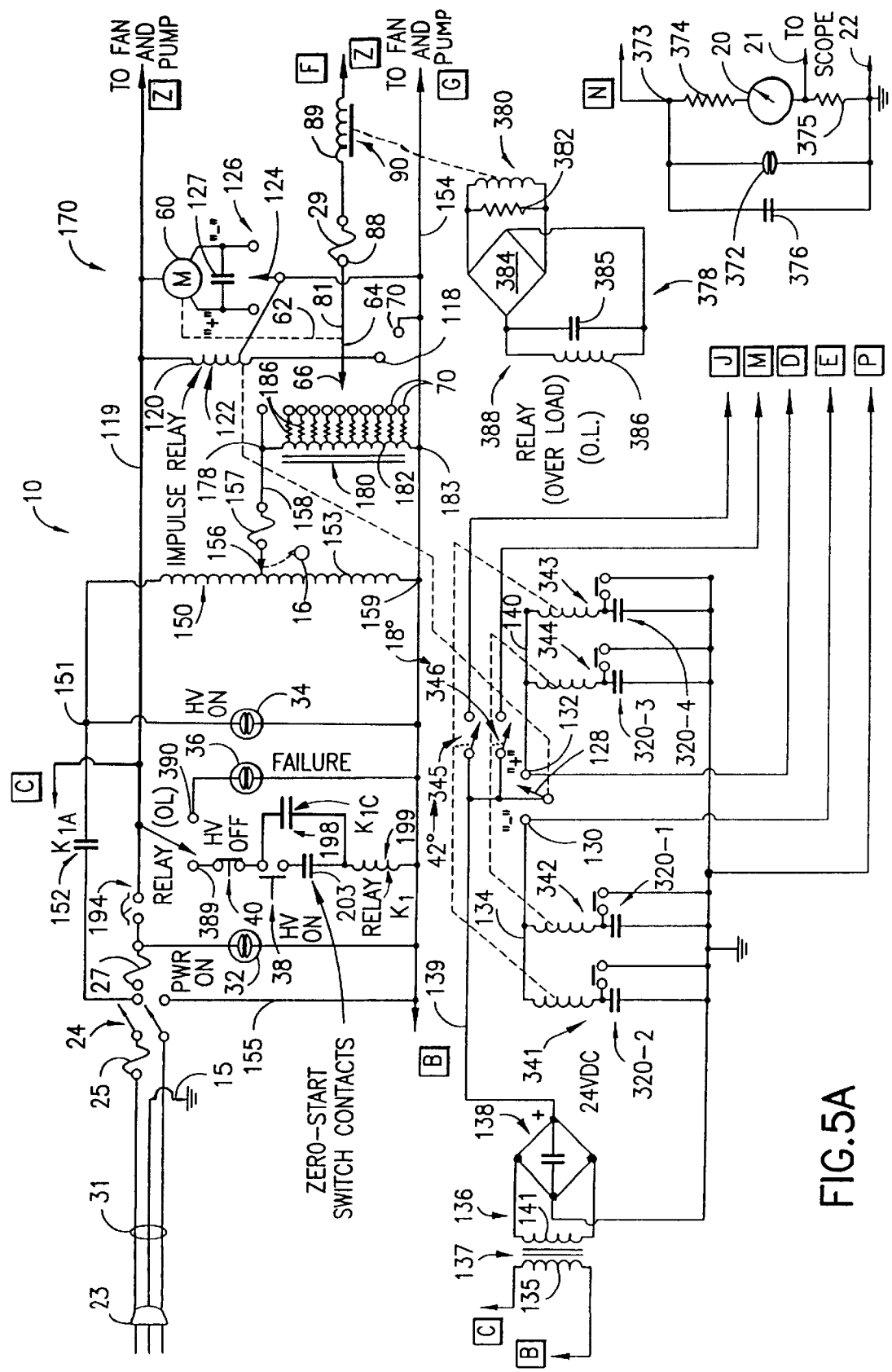
FIG. 5A shows a diagram of circuits in the control unit shown in FIGS. 1, 3 and 4.

With reference to the drawings in greater detail, it is noted that the control section (control unit) 10 (FIG. 1) of a system embodying the present invention and for practicing the method of the invention is relatively compact, is light-in-weight and is conveniently portable, being equipped with a handle 12 on one end. This control unit 10 as shown weights less than 40 pounds and is housed in an electrically-conductive case 14, for example made of aluminum or stainless steel, which is grounded as shown at 15 (FIGS. 3 and 5A). A turnable control knob 16 on a control panel 18 enables the voltage of an alternating current (AC) infeed to be adjusted from zero volts AC up to conventional line voltage, for example such as 120 volts (RMS) AC, as is shown on a scale 17 associated with a pointer 19 on the knob.

Figure 5B:
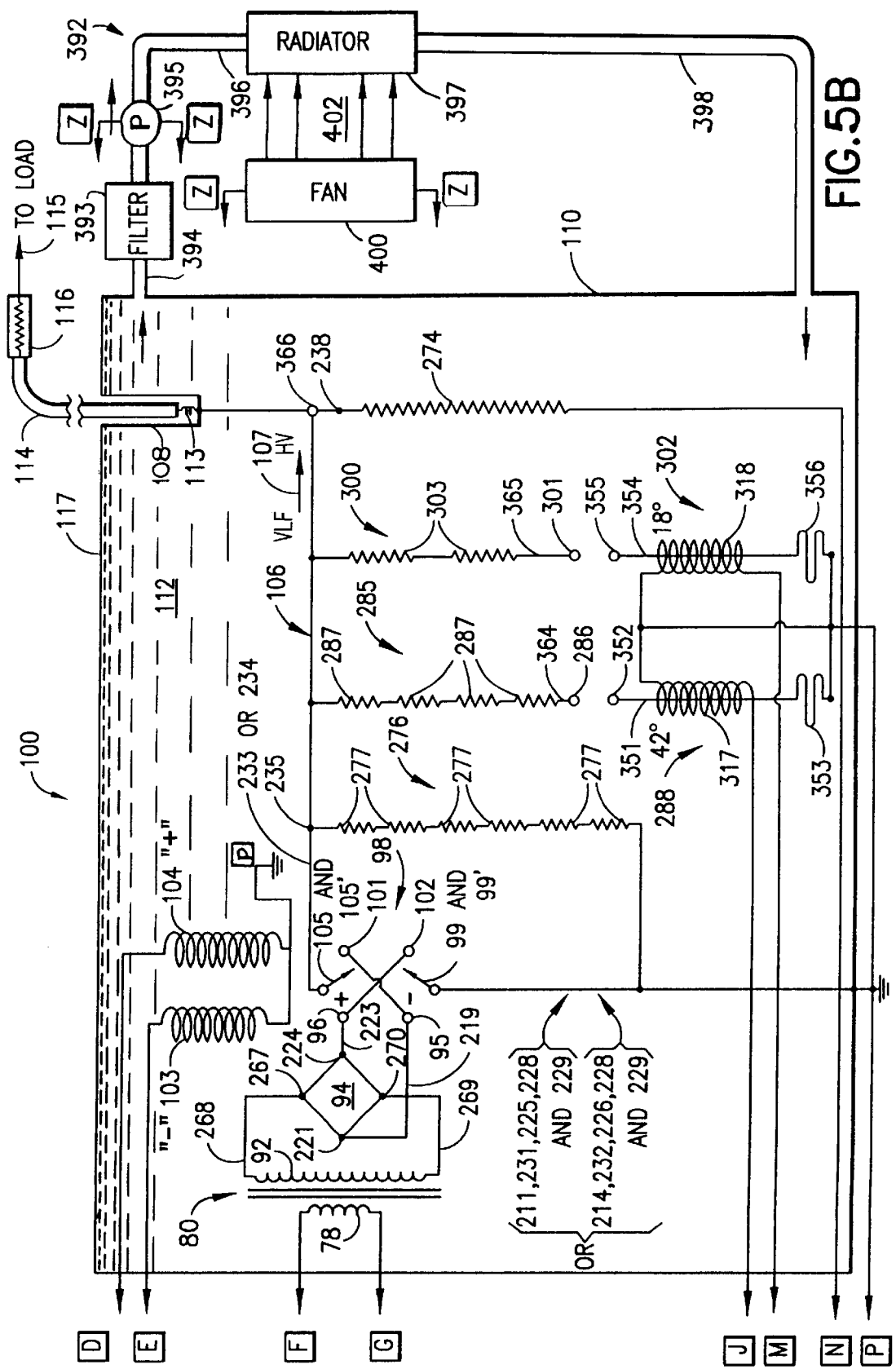
FIG. 5B shows a diagram of circuits in a VLF high-voltage (HV) output unit shown in FIGS. 6, 7 and 8, which is connectable to a capacitive HV "LOAD" as is indicated in this FIG. 5B for testing insulation in this load.
Figure 7:
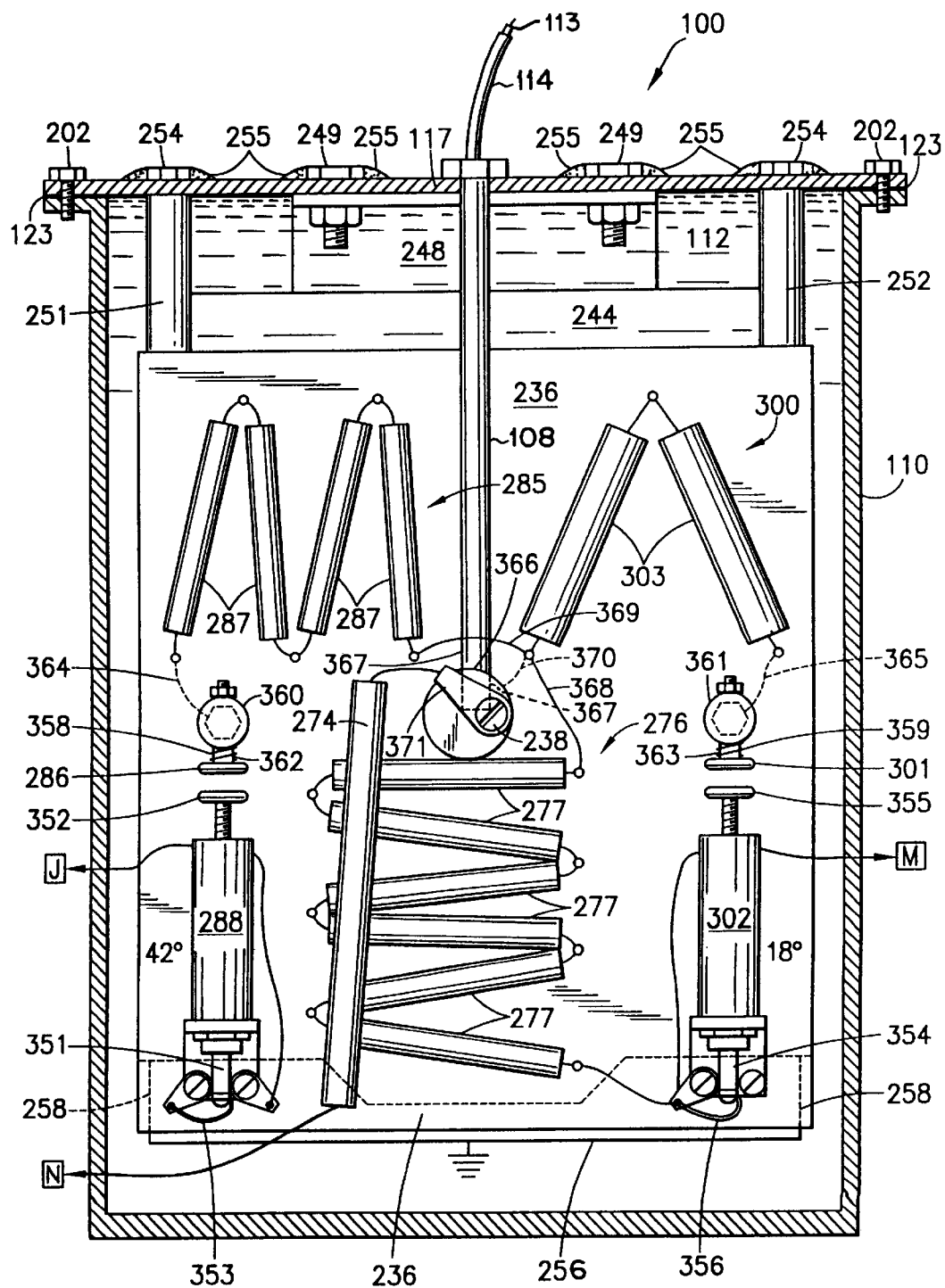
FIG. 7 is an enlarged cross-sectional view of the VLF HV output unit taken along the plane 7—7 in FIG. 6.
Figure 8:
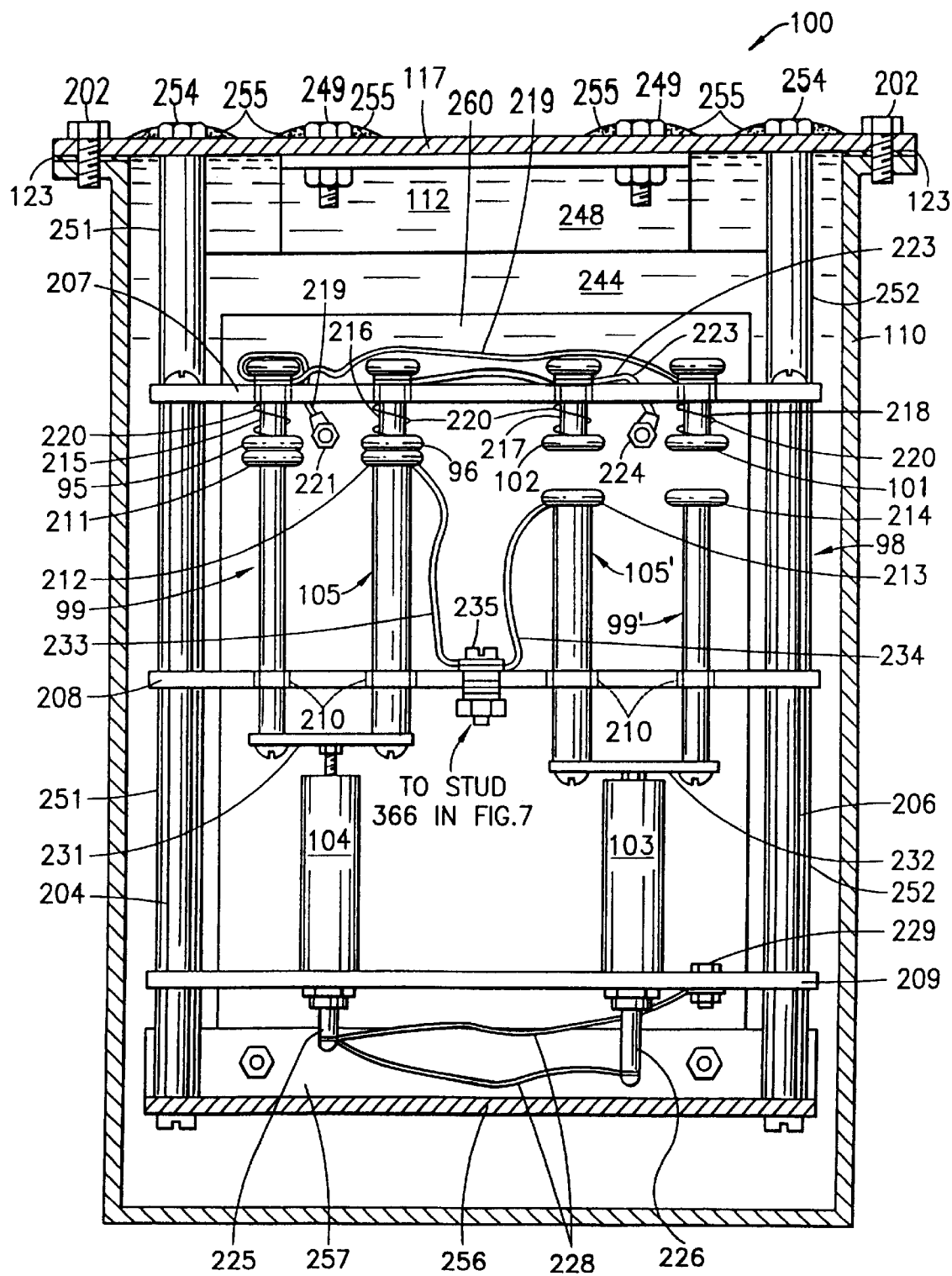
FIG. 8 is an enlarged cross-sectional view of the VLF HV output unit taken along the plane 8—8 in FIG. 6.
Figure 10:
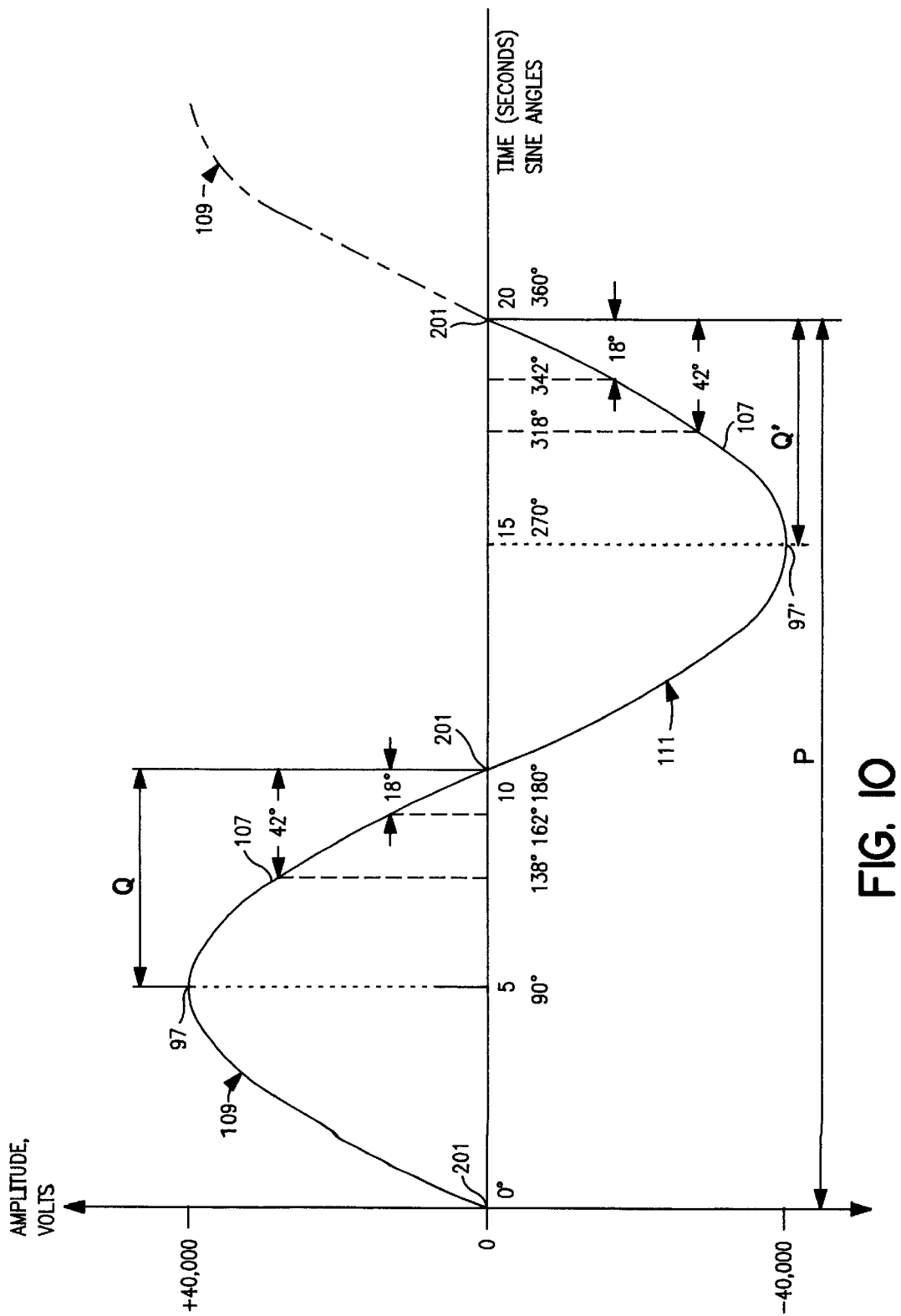
FIG. 10 is a plot versus time of one full wave (having a period "P") of high-voltage (HV) test waves which are indicated by reference 107 in FIG. 5B as being applied to a capacitive HV "LOAD" under test.

The purpose of adjusting the input AC voltage is to adjust the peak voltage of very low frequency (VLF) high voltage (HV) sinusoidal test waves 107 (FIG. 10). These test waves 107 are applied to a capacitive "LOAD" (FIG. 5B) under test. They are created by VLF high voltage output apparatus (VLF HV unit) 100 whose circuit is shown in FIG. 5B and whose construction is shown in FIGS. 6, 7 and 8, described later. A meter 20 (FIG. 1) as shown has a range from plus 40 kilovolts through zero to minus 40 kilovolts for indicating the voltage of the HV test waves 107 (FIGS. 5B and 10) being provided on a line 106 connected to the LOAD being tested.

A pair of terminal posts 21 and 22 are available for connecting the control unit 10 to any desired electrical instrument, such as oscilloscope or harmonic analyzer. A main on-off switch 24 turns on or off AC power infeed from a plug 23 (FIG. 5A) insertable into a conventional 120 volt 60 Hz AC supply socket. A power cord 21 extends from plug 24 to unit 10, and incoming power passes through a protective fuse 25. Three fuse holders 26, 28 and 30 enable convenient insertion and removal of respective cartridge fuses 27, 29 and 157 (FIG. 5A). Three signal lights 32, 34 and 36 are shown, for example being green, red and white, respectively, for indicating: infeed power is on, HV power feed is on, and LOAD insulation being tested has failed. Also, three on-off push buttons 38, 40 and 42 are shown for turning on HV power feed, for turning off HV power feed and for setting an interlock 194 (FIG. 5A), respectively.

The interconnections D, E, F, G, J, M, N, P and Z in FIGS. 5A and 5B extending between control unit 10 and HV output unit 100 are bundled in a cable (not shown) which has multi-contact connectors on each end for removable attachment to a suitable connector (not shown) mounted in one side of the case 14 of control unit 10 and for removable attachment to a suitable connector (not shown) mounted in the top of the HV unit case 110 (FIGS. 5B, 6, 7 and 8).

Figure 2:
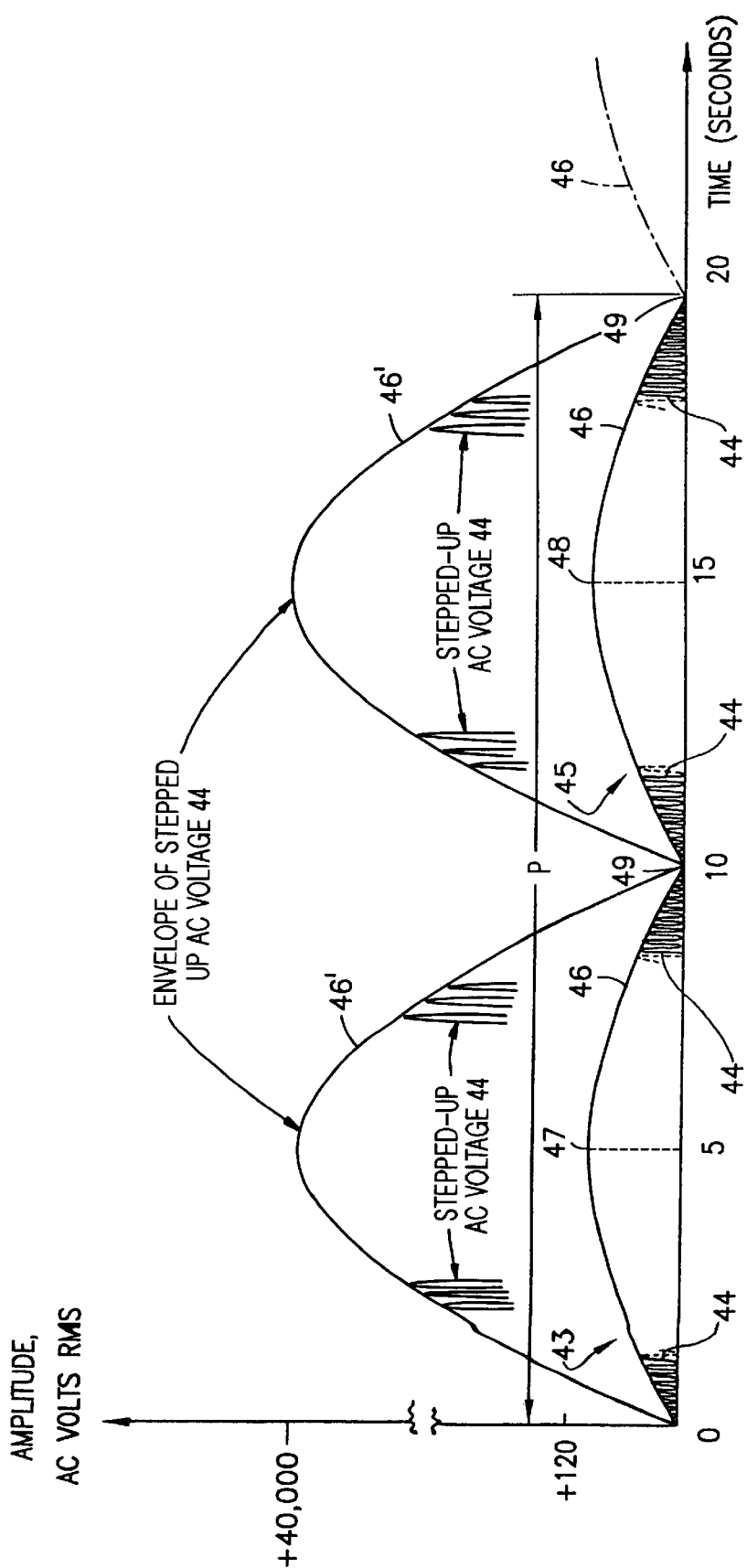
FIG. 2 is a plot versus time of an envelope of an AC voltage which is shown being amplitude modulated over an amplitude range from zero to about 120 Volts RMS.
Figures 1, 18A:
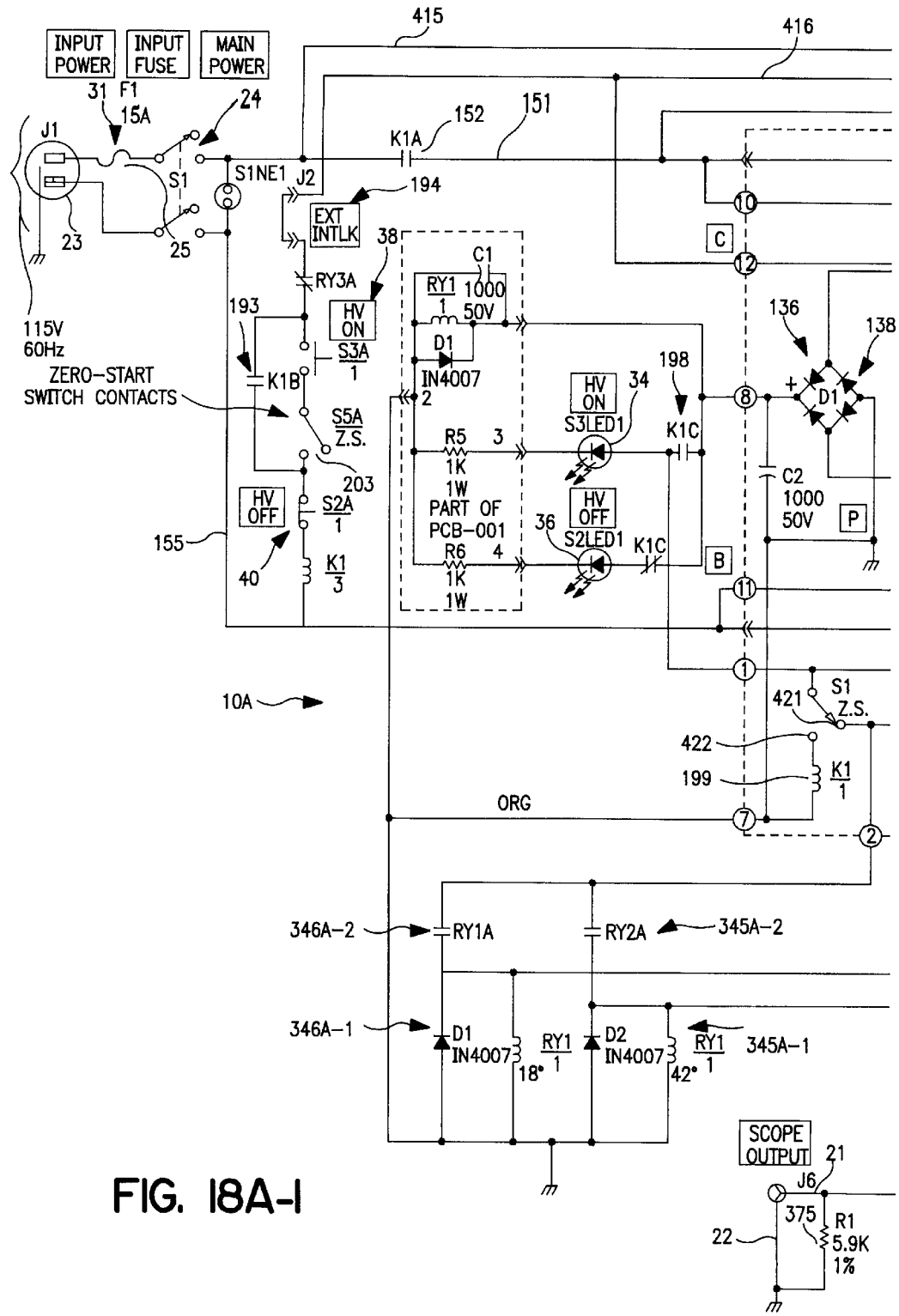
FIG. 1 is a perspective view of a control unit shown for providing Very Low Frequency (VLF) amplitude modulation of voltage of 60 Hertz (Hz) Alternating Current (AC). This control unit also can be arranged to amplitude modulate and to provide adjustable voltage levels of 50 Hz or 60 Hz AC input, thereby controlling VLF High Voltage (HV) sinusoidal test waves supplied from a VLF HV unit shown in FIGS. 6, 7 and 8, as will be explained. In this control unit the supplied 60 Hz AC is shown as being adjustable over a range from zero to about 120 volts (RMS—Root Mean Square-Voltage). This control unit in FIG. 1 has a handle on one end for convenient hand-carry, which is readily accomplished, since it weighs less than about 40 pounds.
FIG. 18A shows a diagram of circuits in the control unit illustrated in FIGS. 15, 16 and 17.
Figures 2, 18A:
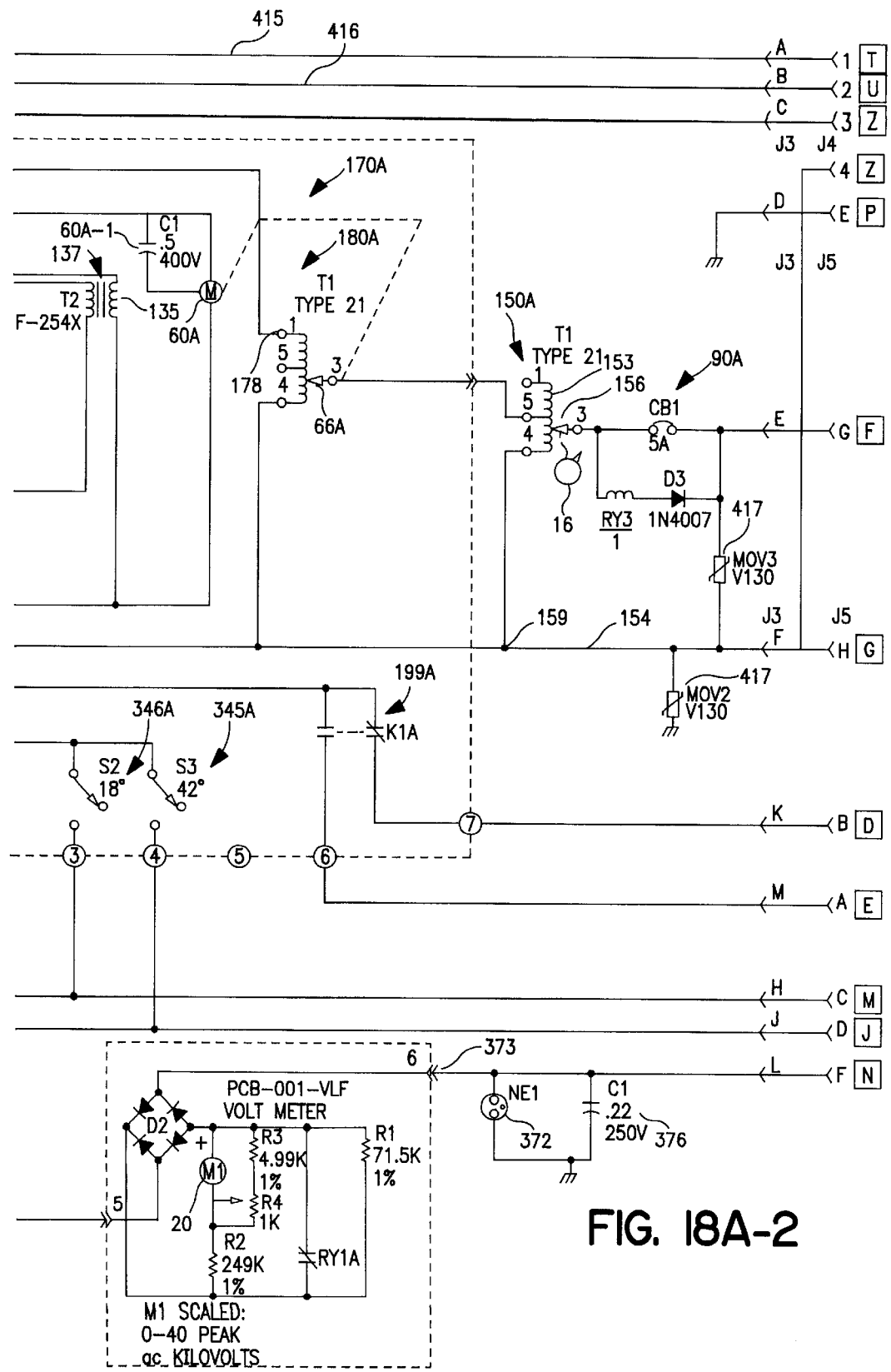

In FIG. 2 is shown two half cycles 43 and 45 included in one full cycle, i.e., in one full Period P, of an envelope 46 of a very low frequency (VLF) amplitude-modulated AC voltage. For example, the AC voltage 44 being modulated is a conventional 60 Hertz (Hz) line voltage of 120 volts RMS. For providing an amplitude-modulated envelope 46 as shown having peak values at 47 and at 48 both shown as 120 volts positive (+), the control knob 16 is turned to its full-scale position "120" shown at 50 (FIG. 1). One full period, i.e., one full cycle, of the envelope 46 is shown as having a Period P extending for a time duration of 20 seconds, i.e., having a total time period of 20 seconds, thus being at a frequency of 0.05 Hz. Zero-voltage points are shown at 49. It is noted that each half cycle 43 and 45 of the envelope 46 as shown has a configuration which is very close to the shape of a pure (substantially undistorted) half of a sine wave.

It is to be understood that a system embodying the present invention and employing the method of this invention is capable of providing any desired half-cycle wave shape of an amplitude-modulated envelope 46. This frequency of 0.05 Hz of an envelope 46 having an essentially pure half-sine-wave shape is a preferred modulation envelope shape and frequency for creating test waves 107 (FIG. 10) for testing buried HV power cables.

Figure 25:
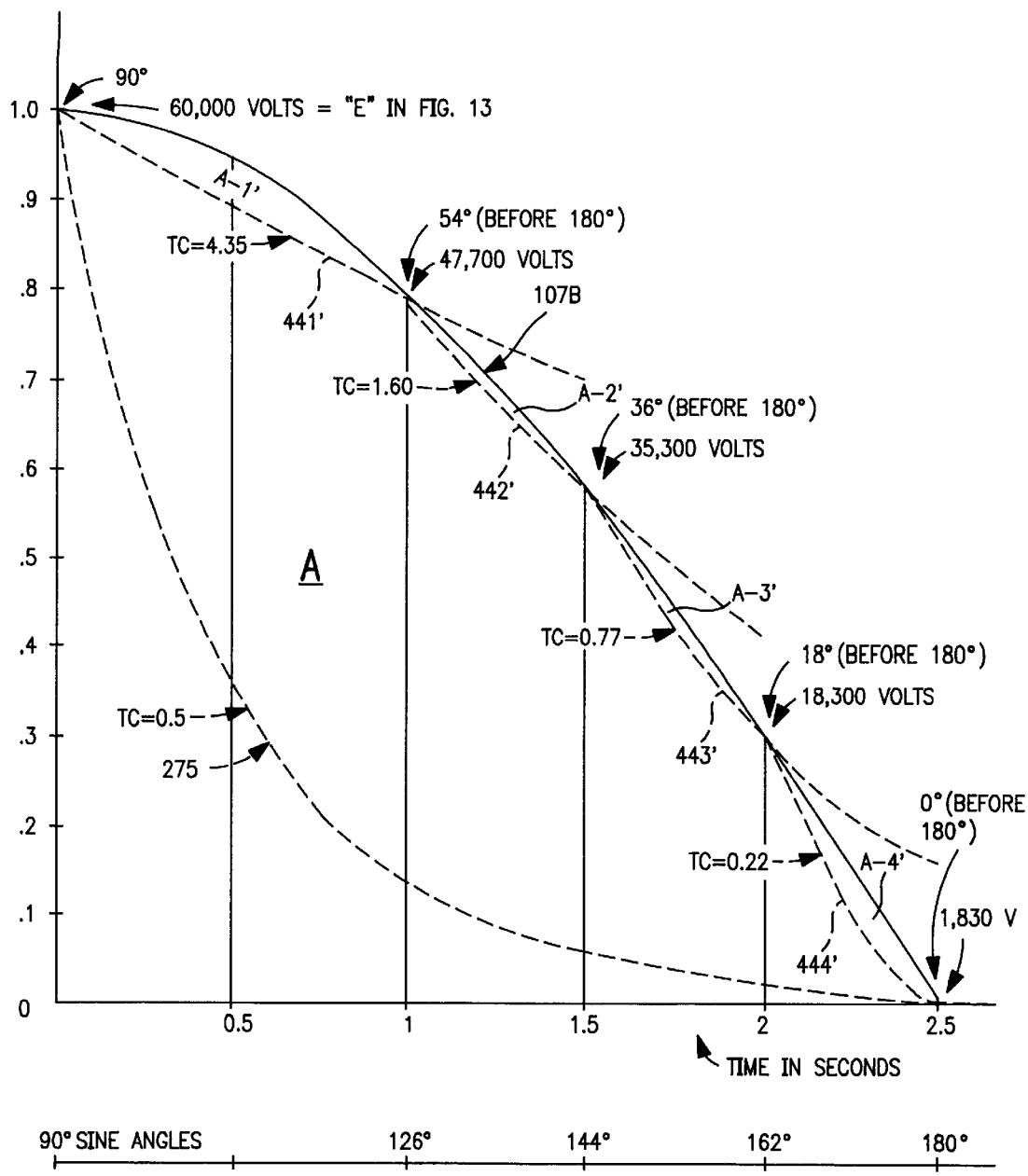
FIG. 25 is a plot similar to FIG. 24, except that the VLF HV sinusoidal test wave has a frequency of 0.1 Hz for testing a capacitive LOAD of about 1.1 $\mu$F.
Figure 26:
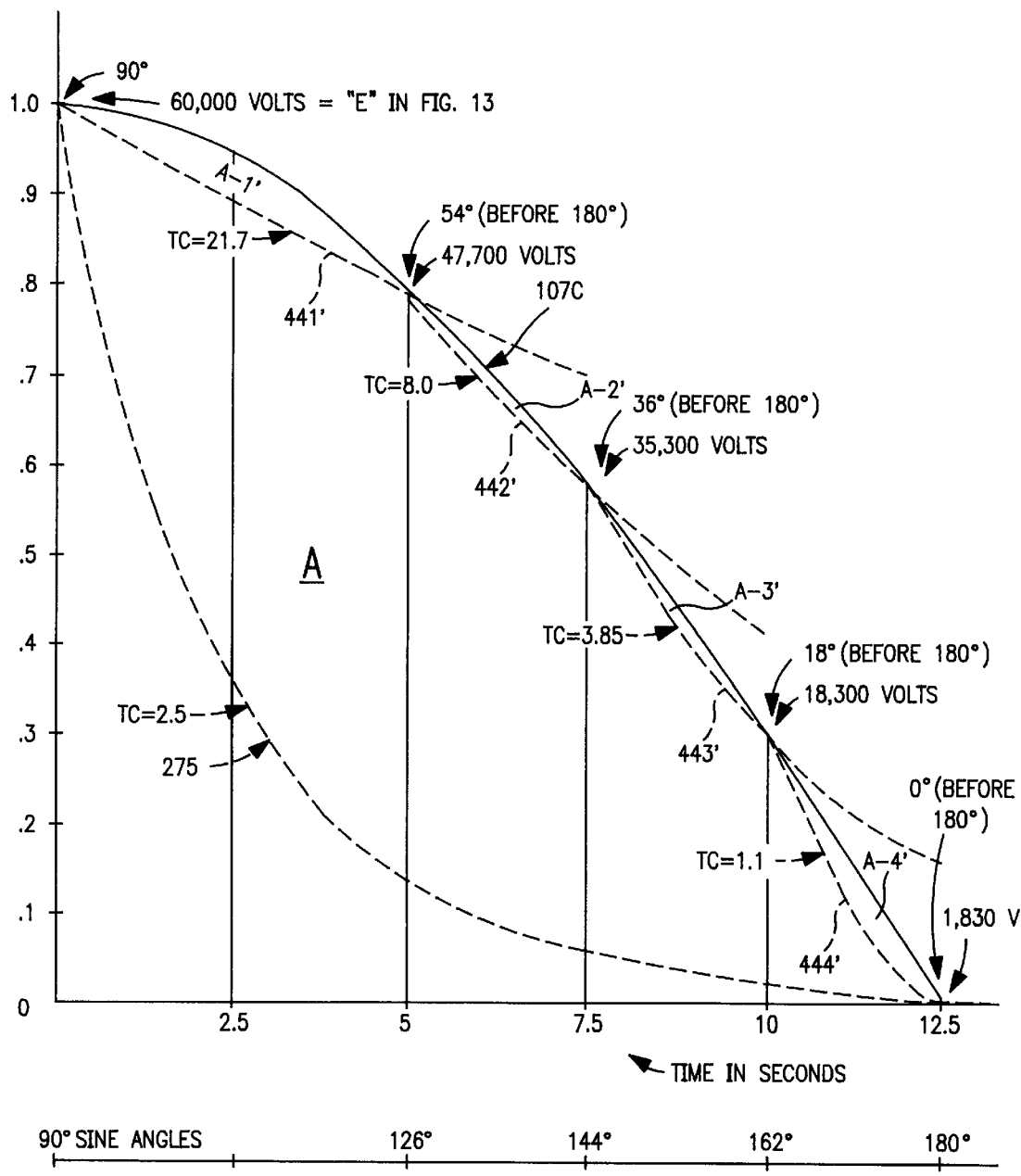
FIG. 26 is a plot similar to FIGS. 24 and 25, except that the VLF HV sinusoidal test wave has a frequency of 0.02 Hz for testing a capacitive LOAD of about 5.5 $\mu$F.

In addition to a VLF HV sinusoidal test wave of frequency 0.05 Hz, FIGS. 25 and 26 relate to VLF HV sinusoidal test waves of frequencies 0.1 Hz and 0.02 Hz, respectively.

Method and Apparatus for Adjusting Voltage Levels of the VLF HV Sinusoidal Test Wave For adjusting the voltage levels of the output VLF HV sinusoidal test waves 107 (FIGS. 5B and 10) applied to a capacitive LOAD being tested, there is AC-voltage-adjustment apparatus 150 (FIG. 5A) connected in circuit with power in-feed switch 24. The energizing circuit for this apparatus 150 is traced from a contact of switch 24 through a line 151 including a pair 152 of contacts of an On/OFF relay K1 (to be described later) through a winding 153 of apparatus 150 and through a terminal connection 159 to a line 154 connected by a lead 155 to the other contact of switch 24. For example, the apparatus 150 as shown is a commercially-available "POWERSTAT" AC voltage-adjusting transformer having a rating of about 1,000 watts at 120 volts.

AC output voltage from apparatus 150 is adjusted by control knob 16 (FIG. 1) which traverses a brush contact 156 along connections of winding 153 for adjusting the output voltage in a range from zero to 120 volts. Adjusted AC voltage output is fed through a fuse 157 (for example rated at 10 amperes) and through a line 158 to a terminal 178 of an AC voltage-modulating autotransformer 180.

Method and Apparatus for Creating a Desired Shape for the VLF HV Test Waves 107 (FIG. 10)

Apparatus 170 (FIGS. 3, 4, 5A and 11) embodying the invention and employing a method embodying the invention creates half-cycle envelope shapes 46 (FIG. 2) for use in creating successive half cycles of the HV test wave voltage 107 (FIGS. 5B and 10) being applied to a capacitive LOAD under test. This half-wave-shape-creating apparatus 170 includes an AC-voltage-modulating autotransformer 180 whose upper terminal 178 of its winding 182 is supplied by line 158 with an adjusted AC voltage shown as set at a desired level manually determined by using knob 16 as is described above.

The AC-voltage-modulating, wave-shape-creating apparatus 170 is shown including a small reversible synchronous motor 60 (FIGS. 4 and 5A), for example such as a 6 RPM Reversible Synchronous Motor rated at 7 Watts made by Emerson Electric Co. of Princeton, Ind. The motor shaft 62 revolves a non-conductive arm 64 which is affixed to the shaft 62 by a set screw 63 and carries near its outer end 65 a contact brush 66, for example formed of copper. The brush 66 includes a stud 67 slidable in a conductive socket 68 mounted in the arm 64. This stud is biased by a compression spring 69 for urging the brush 66 toward contacts 70 mounted in a circle 76 on a non-conductive panel board 72. The motor 60 is attached to the rear of panel board 72 by suitable fasteners 73 shown as bolts and nuts. The motor shaft 62 extends through a bushing 74 in the panel board 72 and revolves arm 64 in a plane parallel with the panel board so that brush 66 (see also FIG. 3) successively engages contacts 70 in a circular array 76 in make-before-break engagement. These contacts 70 are arranged uniformly spaced in the circular pattern 76 (FIGS. 3 and 11) concentric with the axis of rotation 77 of the revolving arm 66.

In order for the revolving brush 66 to be connected through a connection F (FIG. 5A) leading to a primary winding 78 (FIG. 5B) of a step-up transformer 80 (FIG. 6), there is an insulated flexible conductor 81 connected by a terminal 82 to the conductive brush socket 68. For increasing its flexibility and for reducing its flexural stress, the conductor 81 has a plurality of turns 83 extending around a hub 84 of a wide-flanged spool 86 having a hub stud 87 affixed by a set screw 63 to the motor shaft 62 so that spool 86 turns along with arm 64. The flexible conductor 81 is connected via terminal 88 (FIG. 3) on the panel board to the fuse 29 which is in circuit in series with a primary winding 89 of a current transformer 90. This current transformer monitors amperage of current flowing from revolving contact 66 through flexible conductor 81, through terminal 88 and fuse 29 and through connections F and G to the primary winding 78 of the HV step-up transformer 80 (FIGS. 5B and 6).

As explained later in detail, the step-up transformer 80 has its secondary winding 92 connected to an HV bridge rectifier 94 (FIG. 5B). In effect, this bridge rectifier 94 demodulates the stepped-up AC voltage 44' (FIG. 2) being fed from the secondary winding 92 so that a stepped up amplitude modulation envelope 46' (FIG. 2) is obtained. The polarity of this amplitude modulation envelope 46' is reversed in polarity at zero voltage points 49 (FIG. 2) every half cycle for forming VLF HV sinusoidal test waves 107 (FIG. 10) applied to a capacitive LOAD being tested.

Figure 11:
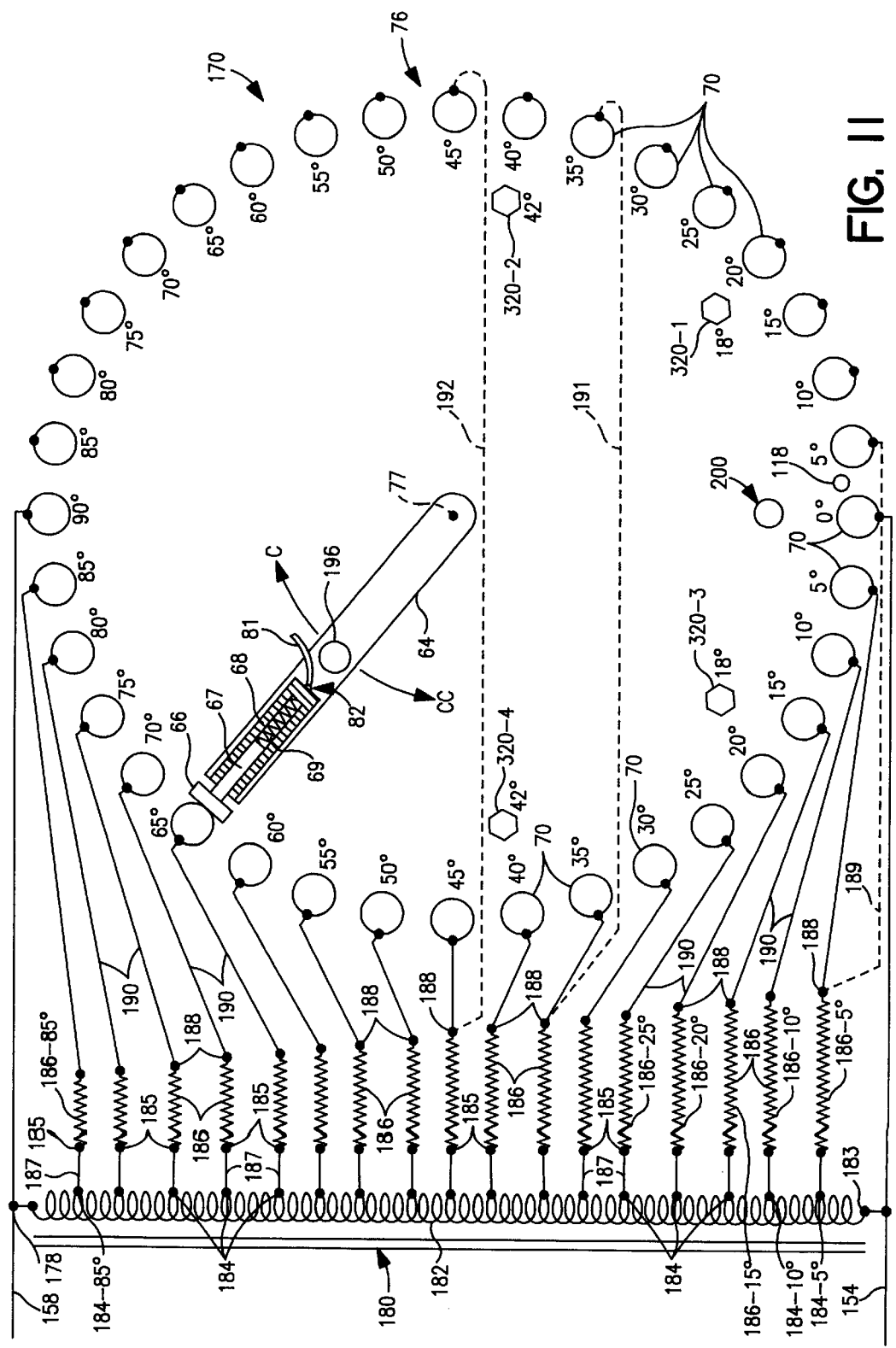
FIG. 11 is a schematic diagram for illustrating operation of AC-voltage-modulation apparatus in a first embodiment of the present invention.

As illustrated schematically in FIG. 11, the winding 182 is shown including seventeen taps 184 whose locations along winding 182 are listed in FIG. 14 as being at numbers of turns counted from the zero-voltage terminal 183. For example, a tap 184-5° (FIG. 11) which is connected through a resistor 186-5° to contact 70 at electrical 50 on the sine-function-shaped modulation envelope 46 (FIG. 2) is located at a count of 30 turns from zero-voltage terminal 183. A tap 184-10° connected through a resistor 186-10° to the contact 70 at electrical 100 in envelope 46 is located 60 turns from terminal 183, and so forth; with tap 184-85° connected through a resistor 186-85° to contact 70 at electrical 85° being located 344 turns from terminal 183.

It is noted that the full circular array 76 of contacts 70 shown in FIG. 3 extends mechanically over a circular range of 360° (mechanical degrees). The motor 60 is reversed to change direction of revolution of brush contact arm 64 after each half cycle 43 and 45 of a Period P (FIG. 2) of amplitude modulation envelope 46. This travel-reversal of brush contact arm 64 occurs at each zero voltage point 49 when the brush engages reversing contact 118. In other words, during a Period P (FIG. 2) in this embodiment, the arm 64 revolves 360° (mechanical degrees) counterclockwise for producing half wave 43 (FIG. 2) plus another 360° (mechanical degrees) clockwise for producing half wave 45 (FIG. 2), and so forth for each successive period P. Therefore, each 10° of mechanical motion of arm 64 creates 5° of electrical movement along a sine-function-shaped half cycle 43 or 45 (FIG. 2) of a Period P of amplitude modulation envelope 46.

For convenient circuit illustration, FIG. 11 shows 0° and impulse-relay-control contact 118 and ZERO-START reed switch 198 at the bottom of circular array 76, whereas FIG. 3 shows them on panel 72 at the top of array 76. FIG. 11 correctly shows interrelationships, as will be seen and understood by placing FIG. 11 upside down adjacent to FIG. 3.

As the arm 64 (FIG. 11) moves its brush contact 66 counterclockwise CC from engagement with electrical 90° contact 70 to engagement with electrical 0° contact 70, one-quarter of a Period P of the amplitude modulation envelope 46 (FIG. 2) is created. This one-quarter is a decreasing-voltage quarter wave extending for five seconds from the peak value 47 or 48 to the zero voltage point 49. It is interesting to note that 1,200 cycles of the AC voltage 44 occur during one full wave having a Period P of 20 seconds and 300 cycles of AC voltage occur during one-quarter of the wave.

As already explained, the brush contact 66 moves in make-before-break engagement with successive contacts 70 in the array 76 (FIG. 3). Therefore, as it travels, the brush 66 creates a short-circuit conduction path between each successive two adjacent contacts 70. To limit the shorting current flowing through turns of the winding 182 between shorted contacts 70, a plurality of resistors 186 (FIG. 11) are used each having a terminal 185 and a terminal 188. Respective terminals 185 of these resistors 186 are connected by respective leads 187 to respective taps 184 and respective resistor terminals 188 are connected by leads 190 to respective contacts 70.

The voltage difference "ΔV" between successive taps 184 is determined from differences between sine values listed in FIG. 14. For example, the sine values for 5° and 10° are 0.0872 and 0.1737, respectively. Thus, the voltage difference ΔV between contacts 70 at 5° and 10°, when operating at 120 Volts AC applied across winding 182 between terminals 178 and 183 is determined:

$$\Delta V \, 5° \text{ to } 10° = 120 \times (\text{sine } 10° - \text{sine } 5°) \quad (1)$$

$$= 120 \, (0.1737 - 0.0872)$$

$$= 120 \, (0.0865) = 10.38 \text{ volts}.$$

Similarly, the voltage difference ΔV between contacts at 15° and 10° is determined:

$$\Delta V\ 15°\ \text{to}\ 10° = 120 \times (\text{sine}\ 15° - \text{sine}\ 10°) \quad (2)$$
$$= 120\ (0.2588 - 0.1737)$$
$$= 120\ (0.0851) = 10.21\ \text{volts}.$$

And, the voltage difference ΔV between contacts at 20° and 15° and also at 25° and 20° is determined, respectively:

$$\Delta V\ 20°\ \text{to}\ 15° = 120 \times (\text{sine}\ 20°\ \text{sine}\ 15°) \quad (3)$$
$$= 120\ (0.3420 - 0.2588)$$
$$= 120\ (0.0832) = 9.98\ \text{volts}.$$
$$\Delta V\ 25°\ \text{to}\ 20° = 120 \times (\text{sine}\ 25°\ \text{sine}\ 20°) \quad (4)$$
$$= 120\ (0.4226 - 0.3420)$$
$$= 120\ (0.0806)\ 9.67\ \text{volts}.$$

For this embodiment it was decided to limit the shorting current in tap-to-tap turns of winding 182 to an upper limit of approximately 20 Amperes. Using the equation E=IR, where E, I and R, respectively, are voltage, current and resistance, the ohmic values needed to limit shorting-current flow to about 20 Amperes between successive contacts at 5°, 10°, 15°, and 20°, and so forth, are determined as follows:

$$R = E/I = \frac{\Delta V\ 5°\ \text{to}\ 10°}{I} = \frac{10.38\ \text{volts}}{20\ \text{amps}} = 0.519\ \text{ohms} \quad (5)$$

$$R = E/I = \frac{\Delta V\ 15°\ \text{to}\ 10°}{I} = \frac{10.21\ \text{volts}}{20\ \text{amps}} = 0.511\ \text{ohms} \quad (6)$$

$$R = E/I = \frac{\Delta V\ 20°\ \text{to}\ 15°}{I} = \frac{9.98\ \text{volts}}{20\ \text{amps}} = 0.499\ \text{ohms} \quad (7)$$

$$R = E/I = \frac{\Delta V\ 25°\ \text{to}\ 20°}{I} = \frac{9.67\ \text{volts}}{20\ \text{amps}} = 0.484\ \text{ohms} \quad (8)$$

Since there are two resistors in each shorting path between successive contacts 70 (except for contacts at 90° and 0°), the ohmic values determined from equations 5, 6, 7 and 8, and so forth, are judiciously divided and distributed among successive resistors 186. For example, the five resistors 186-5°, 186-10°, 186-15°, 186-20° and 186-25° have resistance values of about 0.262 ohms, 0.257 ohms, 0.254 ohms, 0.245 ohms and 0.239 ohms, respectively, as shown in FIG. 14.

Figure 15:
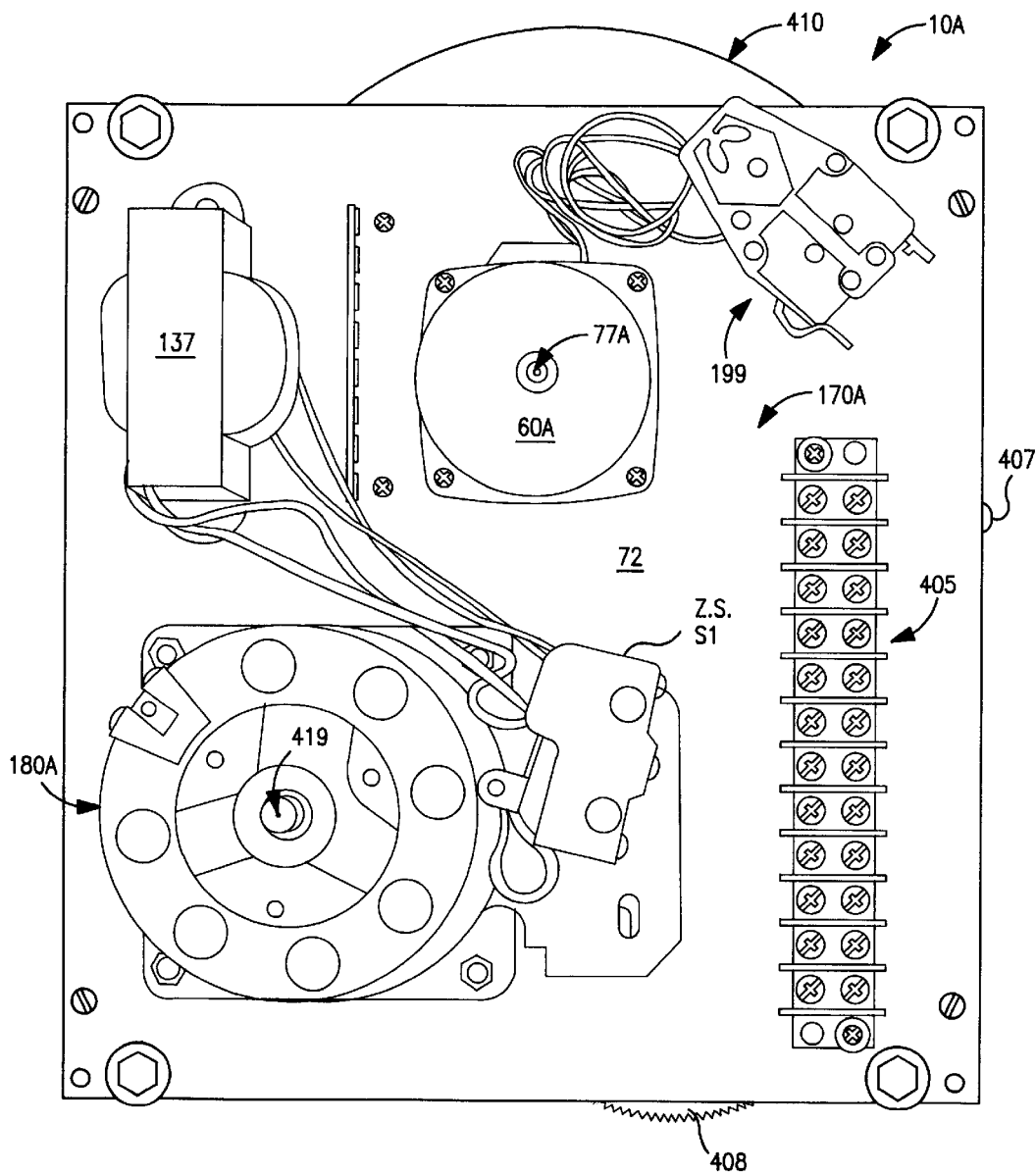
FIG. 15 shows an elevational view of a modified control unit 10A for providing VLF amplitude modulation of the voltage of 50 Hz or 60 Hz Alternating Current (AC) of 220 volts RMS. In this control unit 10A, which is shown with its housing opened, a revolving face cam drives a gear train for producing oscillating motion. This oscillating motion drives a movable reversible contact brush of a variable transformer in alternate clockwise and counterclockwise directions.

Continuing these determinations for a current limit of about 20 amperes results in the approximate respective resistance values in circuit with respective contacts as listed in FIG. 15.

It is noted that the shorting path between contacts 70 at 90° and 85° includes only one resistor 186-85°. Similarly the shorting path between contacts 70 at 5° and 0° includes only one resistor 186-5°. The voltage difference between contacts 70 at 90° and 85° is only:

$$\Delta V\ 90°\ \text{to}\ 85° = 120 \times (\text{sine}\ 90° - \text{sine}\ 85°) \quad (9)$$
$$= 120\ (1 - 0.9962)$$
$$= 120\ (0.0038) = 0.46\ \text{volts}.$$

Thus, with a current-limiting resistor 186-85° of 0.027 ohms, the shorting current between contacts 70 at 90° and 85° is only about 17 amperes.

However, the voltage difference between contacts 70 at 5° and 0° is:

$$\Delta V\ 5°\ \text{to}\ 0° = 120 \times (\text{sine}\ 5° - \text{sine}\ 0°) = 120\ (0.0872 - 0) = 120\ (0.0872) = 10.46\ \text{volts}.$$

Therefore, with a current-limiting resistor 186-5° of 0.262 ohms, the shorting current through the 30 turns of winding 182 between contacts at 5° and 0° is about 41 amperes. Since these turns in circuit with resistor 186-5° are at one end of the autotransformer winding, their heat is dissipated without undue effect during the brief time while contacts 70 at 5° and 0° are being shorted by brush contact 66.

It is noted that all of the contacts 70 shown in the right half of array 76 in FIG. 11 at respective positions in the arc from 85° to 5° are respectively connected to the same resistor terminals 188 as are corresponding contacts in the arc from 85620 to 5° in the left half of this array. For example contact 70 at 5° in the right half of array 76 is connected by a lead 189 (shown dashed) to the same resistor terminal 188 as is contact 70 at 5° in the left half of the array. Similarly, contacts 70 at 35° and 45° on the right are connected respectively by leads 191 and 192 to the same resistor terminals 188 as contacts 70 at 35° and 45° on the left. Other leads similar to leads 189, 191 and 192 extend from contacts in the right half of the circular array 76 to respective resistor terminals 188, and these other leads are omitted from FIG. 11 for clarity of illustration.

Thus, it will be understood that respective resistors 186 and respective turns of winding 182 twice conduct AC current flow while the arm 64 is sweeping one full revolution around the array 76 of contacts 70.

The resistors 186 are formed from suitable bare resistance wire capable of carrying at least 20 Amperes for brief moments of about one second or less without overheating. This resistance wire is cut accurately to lengths needed for providing respective resistors 186 having ohmic values approximating those listed in FIG. 14. It is noted from these listed values that the 5° resistor 186 is almost ten times the length of the 85° resistor. To accommodate their varying lengths, these resistance wires are arranged in spaced helical coils with their respective terminals 185 and 188 preferably being mounted for providing spacings between neighboring resistors of at least about ¼th of an inch for allowing heat-dissipating air circulation to occur between such mounted resistance wires within the case 14 (FIG. 1). Also, it is preferred that resistor 186-5° be positioned above the others when the case 14 is stood on end in its operating position with the handle 12 at the top for facilitating heat dissipation into the top of the case from this particular resistor.

In order to reverse the direction of travel of arm 64 (FIGS. 3, 4 and 11) after each full revolution, there is a contact 118 near the array 76. This contact 118 is closely adjacent to the contact 70 at the 0° position in the array. Thus, when the travelling brush contact 66 engages the contact 70 at the 0° position it also engages this contact 118, thereby connecting this contact 118 to the line 154 (FIG. 5A) causing AC power to flow from line 119 through a winding 120 of a bi-stable impulse relay 122 (FIGS. 3 and 5A), for example made by Potter & Brumfield of Princeton, Ind. 47671.

This energization of winding 120 of impulse relay 122 shifts positioning of a motor-reversing arm 124 (FIG. 5A) from one to the other of a pair of motor-current-flow-reversal contacts 126, thereby reversing rotation of synchronous motor 60. A capacitor 127, as is conventional for the motor 60, is shown connected across reversal contacts 126 for minimizing sparking when the reversing arm 124 switches AC power from one to another of these contacts. For example, the left contact 126 is for causing motor 60 to revolve arm 64 counterclockwise CC (FIG. 11) for creating a first half cycle 43 of amplitude modulation envelope 46 (FIG. 2), which corresponds with a positive (+) half cycle 109 (FIG. 10) of the VLF HV sinusoidal test waves 107, and right contact 126 is for causing motor 60 to revolve arm 64 clockwise C (FIG. 11) for creating a second half cycle 45 of amplitude modulation envelope 46, which corresponds with a negative (−) half cycle 111 (FIG. 10) of the VLF HV sinusoidal test waves 107. Thus, for convenience of reference, the contacts 126 are marked as "+" and "−".

Energization of impulse relay 122 also shifts positioning of a switch arm 128 (FIG. 5A) between contacts 130 and 132 for controlling time-constants of resistive discharge of the capacitance of a LOAD under test, as will be explained later. Switch arm 128 remains in engagement with contact 132 (which is marked as "+" for convenience of reference) during a first half cycle 43 of the envelope 46 (FIG. 2) extending from TIME "0" to TIME "10" seconds.

At the conclusion of this counterclockwise full revolution, the contact 118 (FIGS. 3 and 5A) again is engaged by revolving brush contact 66 for again energizing winding 120 of impulse relay 122, thereby moving motor-reversing arm 124 into engagement with the right "−" contact 126 for causing control arm 64 to make one full clockwise C revolution around the circular array 76 during a second half cycle 45 of the amplitude modulation envelope 46. This latter energization of impulse relay 122 shifts switch arm 128 (FIG. 5A) into engagement with contact (which is marked as "−" for convenience of reference). Switch arm 28 now remains in engagement with contact 130 during a second half cycle 45 of envelope 46 (FIG. 2) extending as shown from TIME "10" seconds to TIME "20" seconds.

Method and Apparatus for Providing Start of the Test Waves 107 (FIG. 10) at Zero Voltage Before the system 10 (FIGS. 1 and 5A) and 100 (FIG. 5B) can be started to produce VLF HV sinusoidal test waves 107 (FIG. 10), several safety-related switches must be closed. The first of these is external interlock 194. This interlock may be interconnected with switches (not shown) on a test cage door, protective fence or barrier surrounding a test site, etc., and must be closed to permit high voltage to be turned on.

Additionally, contacts 389 of an overload relay 388 (described later) must be closed. The closed state of contacts 389 always will be the case before high voltage is switched on, i.e., before relay K1, 199 is energized.

The system 10 and 100 is arranged for VLF HV sinusoidal test waves 107 (FIG. 10) to be applied to a capacitive LOAD (FIG. 5B) initially starting at a zero voltage level, called "ZERO START". To produce such ZERO-START, there is a ZERO-START switch 200 (FIGS. 3 and 11) whose contacts 203 (FIG. 5A) are in series with HV ON push-button 38. Contacts 203 of switch 200 (FIG. 11) must be closed to energize relay K1, 199.

Operation of HV unit 100 (FIG. 5B) is initiated by closure of safety interlock mechanism 194 and by closing power-on switch 24. With both interlock 194 and main switch 24 closed, motor 60 becomes energized and revolves arm 64 (FIG. 3). While arm 64 is revolving, then temporarily depressing HV ON switch 38 for a few seconds will allow revolving arm 64 to reach its 0° position whereat magnet 196 will actuate the reed switch 200 for closing contacts 203, thereby energizing relay 199. Energized relay winding 199 closes its contacts K1A, 152 and K1C, 198. Closing contacts K1C, 198 retains energization of relay K1, 199. Closing contacts K1A, 152 energizes HV ON lamp 34 and energizes AC-voltage-adjustment apparatus 150, thereby energizing AC-voltage amplitude modulation apparatus 170. (Motor 60 continues running, unless overload relay 388 de-energizes relay K1, 199, thereby simultaneously opening its two contacts K1C, 198, and K1A, 152, for immediate shut-down of the system comprising control unit 10 and HV unit 100.) After HV ON lamp signals that HV output 107 is occurring, the operator releases HV ON switch 38.

Since ZERO-START contacts 203 become closed only when arm 64 reaches its 0° position whereat brush 66 engages zero voltage contact 70 located at 0° (FIG. 11), the HV sinusoidal test wave output 107 of VLF HV system 10 and 100 always starts from zero amplitude.

Method and Apparatus for Producing Polarity Reversal of the VLF HV Sinusoidal Test Waves 107 (FIG. 10) at Zero Voltage Points As already explained, the amplitude modulated AC 44 (FIG. 2) is fed from brush contact 66 (FIG. 5A) through flexible conductor 81, through terminal 88, fuse 29, and primary winding 89 of current transformer 90, through connection F to the primary winding 78 of the step-up transformer 80 (FIG. 5B). A return circuit for this primary winding is completed through connection G to the line 154. The secondary winding 92 of transformer 80 feeds a greatly stepped-up voltage to a bridge rectifier 94 whose output is fed to a pair of contacts 95, 96 (FIGS. 5B and 8) of a polarity-reversing relay 98 having a second pair of contacts 101 and 102.

This polarity-reversing relay 98 (FIG. 8) includes a pair of operating solenoids 103 and 104 which serve to switch polarity of the rectified output from bridge rectifier 94. This polarity reversal produces the VLF HV sinusoidal test waves 107 (FIG. 10) which are fed from the HV reversing relay 98 along a conductor 106 as shown by arrow 107 leading to the lower end of a high-voltage output well bushing 108 (FIGS. 5B and 7) installed in the cover 117 of an oil-filled tank 110 which encloses the unit 100. A reference number 112 indicates regular, uninhibited transformer oil which fills tank 110, whose removable cover 117 holds a suitable seal 123 for preventing oil leakage. The conductor 106 is connected to a conductor 113 in a HV-insulated cable 114 having a convenient length for example such as 25 feet or more, with a terminal 115 (FIG. 5B) for connection to an HV AC capacitive LOAD to be tested, for example such as a buried underground power distribution cable.

A heavy-duty, wire-wound resistor 116 (FIG. 5B) at the output end of cable 114 is in series between the conductor 113 of the cable and the terminal 115. This resistor 116 serves as protection for the HV unit 100 if a flash-back flow of current occurs from a capacitive LOAD into the HV tank 110. For example, this wire-wound resistor 116 as shown is long (about ten inches) and has a resistance of 25,000 ohms for limiting any arc-over current flowing from a capacitive LOAD at 40,000 Volts to 1½ to 2 Amperes, thus preventing the oil-filled tank from damage.

In order to energize one or the other of the solenoids 103 or 104 of the polarity-reversing relay 98, the impulse relay 120 (FIG. 5A) (in addition to controlling the motor-reversing switch arm 124) also controls a switch arm 128 (FIG. 5A). For example, while motor-reversing switch arm 124 engages motor control contact 126 labelled "(+)" for revolving arm 64 a full revolution counterclockwise, the switch arm 128 is engaged during this full counterclockwise revolution with a contact 132 also labelled "+". This "+" label for contacts 126 and 132 indicates in this example that these are the active contacts during creation of the positive half cycle 109 (FIG. 10) of VLF HV sinusoidal test waves 107. This half cycle 109 is created from the modulated sine-function-shaped half cycle 43 of the amplitude modulated AC power 44 (FIG. 2). Similarly, the label "−" for contacts 126 and 130 indicates in this example that these are the active contacts during creation of the negative half cycle 111 (FIG. 10) of the VLF HV sinusoidal test waves 107.

Since the impulse relay 120 is triggered each time that the arm 64 reaches the 0° position (FIG. 11) at which position impulse-relay-control contact 118 is located, polarity reversal occurs at each zero voltage point 49 (FIG. 2) of the amplitude modulated AC, which corresponds with each zero voltage point 201 of the VLF HV sinusoidal test waves 107 (FIG. 10).

During engagement of the switch arm 128 with its "+" contact 132, a circuit is completed from a 24 Volt direct current (DC) power supply 136 (FIG. 5A) through connection D to the solenoid 104 with a return connection through grounded line P for energizing this solenoid 104 with direct current, thereby lifting contact-carrying members 99, 105 (FIG. 8) SO that their raised contacts 211, 212 are engaged with HV relay contacts 95 and 96, respectively (as is illustrated in FIG. 8), for applying a positive half cycle 109 (FIG. 10) of the VLF HV sinusoidal test waves 107 (FIG. 10) fed through line 106 to the capacitive LOAD being tested.

Similarly, while the switch arm 128 engages its "−" contact 130, a circuit is completed from the power supply 136 through connection E to the solenoid 103 with a return through grounded line P, thereby lifting contact-carrying members 99' and 105' (FIG. 8) so that their raised contacts 214, 213 are engaged with HV relay contacts 101 and 102, respectively, for applying a negative half cycle 111 (FIG. 10) of the VLF HV sinusoidal test waves 107 fed through line 106 to the capacitive LOAD being tested.

The 24 Volt DC power supply 136 includes a step-down transformer 137 whose primary winding 135 has a connection C to AC supply line 119 and has a connection B to AC line 155 which is grounded as indicated at 15 when on-off switch 24 is closed. The secondary winding 141 is connected to a bridge-rectifier and filter-capacitor circuit 138 serving to energize with 24 Volt DC the line 139 connected to control arm 128. While control arm 128 engages "+" contact 132 during a positive half cycle 109 (FIG. 10) of the HV test wave 107, a lead 140 is energized by 24 Volt DC. While control arm 128 engages "−" contact 130 during a negative half cycle 111 of the HV test wave 107, another lead 134 is energized by 24 Volt DC. As will be explained later, the leads 140 and 134 are used to energize respective relays during respective positive and negative half cycles 109 and 111 of the VLF HV sinusoidal test waves 107 (FIG. 10). These respective relays actuate a sequence of resistance-discharge circuits, thereby creating a sequence of RC circuits of progressively-reduced Time Constants for controlling the shape of discharge voltage, so that this voltage remains "under" (beneath) the envelope of the applied VLF HV sinusoidal test waves during the second half of each half cycle, for example during the second half "Q" (FIG. 10) of the half cycle 109 being applied to the capacitive LOAD under test.

HV Polarity-Reversing Relay Apparatus 98

FIG. 8 shows a suitable construction for the HV polarity-reversing relay apparatus 98. All of this apparatus 98 is supported (hung) from the cover 117 by means of a pair of vertical posts 251 and 252 so that removal of a plurality of suitable cover fasteners 202, shown as machine screws, allows the cover together with this apparatus 98 plus the HV transformer 80 (FIG. 6) plus all of the other components shown in FIGS. 6, 7, and 8 to be lifted conveniently out of the oil-filled tank 110.

A pair of vertical struts 204 and 206 are attached to and are upstanding from a conductive (aluminum) channel 256 (seen most clearly in FIG. 6). This channel is supported by the twin posts 251 and 252. These vertical struts 204 and 206 support three horizontal parallel bars 207, 208 and 209. The upper two horizontal bars 207 and 208 are formed of suitable, stiff, non-conductive material, for example, fiber-reinforced plastic. The lowest horizontal support bar 209 is formed of stiff, electrically-conductive material, for example aluminum. It is grounded to the cover 117 through the conductive struts 204, 206 to the conductive channel 256 and through the conductive posts 251 and 252 to the cover 117. The solenoids 103, 104 are mounted on the grounded lowest bar 209. The intermediate insulative bar 208 has guide holes 210 for freely guiding vertically-movable contact-carrying members 99, 105 and 99', 105'.

The contact-carrying members 99, 105 are lifted up by energizing solenoid 104 during the positive half cycles 109 (FIG. 10) of the VLF HV sinusoidal test waves 107. In FIGS. 6, 7 and 8, these contact-carrying members 99 and 105 are shown held up by DC energization of this solenoid 104. In this embodiment of the invention they are held up during ten seconds in their up (closed) position where their contacts 211 and 212 respectively engage HV relay contacts 95 and 96 for these ten seconds. The other movable contact-carrying members 99', 105' become lifted up for their ten seconds by DC energization of solenoid 103 during the negative half cycles 111 (FIG. 10) of the VLF HV sinusoidal test waves. The contact-carrying members 99' and 105' are shown in their low (open) position, where their contacts 213 and 214 are spaced from HV relay contacts 102 and 101, respectively, because solenoid 103 is not now being energized.

By virtue of using DC energization from the power supply 136 (FIG. 5A) for actuating (lifting) the respective contact-carrying members 99, 105 and 99', 105', their operation is independent of the amplitude modulated AC voltage 44 (FIG. 2). Also, by requiring that the respective solenoid 104 or 103 must be energized to lift respective movable components 99, 105 or 99', 105' into closed position, an advantageous result is that their respective HV contacts do not accidentally become closed. For relay closure to occur, DC energization must be supplied to the solenoid 104 or 103 from the 24 volt DC power supply 136 (FIG. 5A).

The upper insulative support bar 207 carries HV relay contacts 95, 96, 102 and 101, which are mounted at the lower ends of four short, vertically-movable, conductive rods 215, 216, 217 and 218. These rods are vertically slidable relative to their support bar 207 being guided by suitable holes in this support bar and being spring-biased downwardly toward closed position by helical compression springs 220 which encircle each of these rods. The purpose of these springs 220 is to provide resilient, upwardly-movable compliance for holding the respective relay contacts 95, 96 and 102, 101 firmly in engagement with their respective opposed contacts 211, 212 and 213, 214 without allowing contact bounce nor jitter. Thus, at an instant when either solenoid 104 or 103 is energized, the movable contacts are quickly moved up and hit against their opposite contacts which resiliently yield by slight upward movement of their rods against spring-bias force, without allowing contact bounce nor jitter during their respective 10-second closure intervals.

Upper ends of conductive rods 215 and 220 are connected by a flexible insulated wire 219 and a terminal 221 (FIGS. 8 and 6) to an output terminal 221 (FIGS. 5B and 6A) of the HV bridge rectifier 94. Similarly, upper ends of conductive rods 216 and 217 are connected by another flexible insulated wire 223 and a terminal 224 (FIG. 8) to the other output terminal 224 (FIGS. 5B and 6A) of this HV bridge rectifier.

Vertically slidable within the respective solenoids 104 and 103 are respective armature rods 225 and 226 made of electrically-conductive ferromagnetic material. These armature rods 225 and 226 are vertically movable along the axes of their respective solenoids 103 and 104. Lower ends of these conductive armature rods are connected by a very flexible braided conductor 228 to a grounding terminal 229 on conductive bar 209. Mounted on upper ends of armature rods 225 and 226 are vertically-movable conductive brackets 231 and 232, respectively, for example made of aluminum, which carry the vertically-movable members 99, 105 and 99', 105', respectively.

The two contact-carrying members 99 and 99' are conductive, for example being made of aluminum. Thus their carried contacts 211 and 214 are respectively grounded by circuits traced (i) from contact 211 through member 99, bracket 231, armature rod 225 and flexible conductor 228 to grounding terminal 229 or traced (ii) from contact 214 through member 99, bracket 232, armature rod 226, and flexible conductor 228 to grounding terminal 229.

The other two vertically-movable members 105 and 105' which carry contacts 212 and 213 are stiff insulating rods. Their contacts 212 and 213 are connected by flexible leads 233 and 234, respectively, to a common terminal 235 (Also seen in FIG. 6). This common terminal 235 is connected through an insulative panel 236 formed of stiff plastic to a conductive stud 366 (FIG. 7) having on its outer end another terminal 238, which is operatively associated with resistive discharge apparatus shown in FIG. 7 to be described later.

It is to be noted that HV relay contacts 95 and 211, 96 and 212, 101 and 213, and 102 and 214 are in the shape of enlarged toroids. Also the upper ends of upwardly-movable, spring-biased rods 215, 216, 217 and 218 have enlarged toroids mounted on them. These enlarged toroids serve for relieving high voltage stresses adjacent to their exterior surfaces which are bathed with transformer oil 112.

HV Voltage-Step-Up Transformer Apparatus

The HV voltage-step-up transformer 80 (FIG. 6) has a core 240 formed by a strip of grain-oriented transformer iron wound to provide a rectangular window as known in the transformer art. This core strip is shown held in its tightly wound configuration by three straps 241, 242 and 243. For supporting the whole transformer 80 and also for supporting an insulating panel 244 there are four non-magnetic horizontal rods 246 (only two are seen in FIG. 6) for example non-magnetic rods of aluminum, captured by the two straps 241, 243. The electrically insulating panel 244 supplements transformer oil 112 in providing insulation between HV secondary winding 92 and HV bridge rectifier apparatus 94. The two upper rods 246 extend through suitable holes in a pair of non-magnetic angle-strip brackets 248 (seen also in FIGS. 7 and 8). For example these non-magnetic brackets 248 are aluminum. They are attached to the cover 117 by suitable fasteners 249 shown as bolts and nuts.

It is noted that the heads of bolts passing through the cover 117 are soldered to this cover as is shown by reference numbers 255. This soldering 255 provides good thermal conductivity to the cover and also provides good electrical grounding to the cover which itself is grounded at 15 (FIG. 3). The heads of bolts 254 holding support posts 251 and 252 are soldered to the cover. A rigid strip 250 (FIG. 6) of insulative material, which is held by the two lower rods 246, positions the lower portion of transformer 80 in relation to the panel 244 and inserts additional insulation between lower portions of the HV winding 92 and the HV bridge rectifier 94.

The primary winding 78 is split in two halves wound through the window of core 240 and respectively encircling two legs of the core as known in the art. The two halves of HV secondary winding 92 encircle, respectively, the two halves of primary winding 78, so that the HV secondary winding is spaced farther from the core 240 as known in the art.

HV Bridge Rectifier Apparatus

The HV bridge rectifier 94 (FIGS. 5B, 6 and 6A) is supported by two thermally and electrically conductive vertical posts 251 and 252 (seen in FIG. 8), for example formed of aluminum tubing. These posts are hung from the cover 117 by conductive fasteners, for example bolts 254 whose heads are soldered at 255 to the cover 117 for good heat conduction and for electrical grounding to the cover, which is grounded at 15 (FIG. 3).

The vertical conductive posts 251 and 252 support a horizontal conductive channel 256 (FIG. 6), for example of aluminum, whose flange 257 is attached to and supports an insulative panel 260 on which is mounted the HV bridge rectifier 94 and whose flange 258 is attached to and supports the insulative panel 236. Also, the vertical struts 204 and 206 (FIG. 8) are attached to and are supported by the channel 256.

Figure 6A:
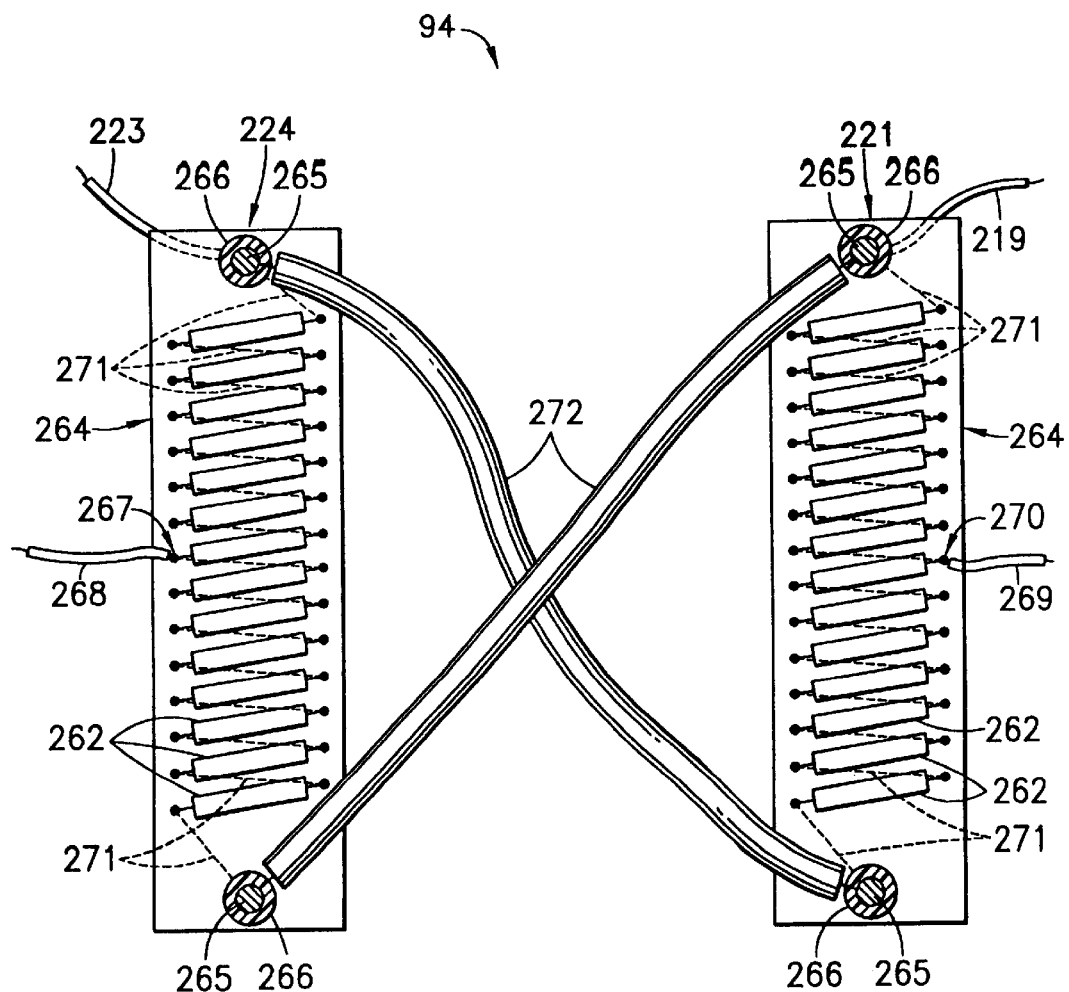
FIG. 6A is an enlarged partial sectional view taken along the plane 6A—6A in FIG. 6 showing an HV bridge rectifier.

The bridge rectifier 94 (FIG. 5B) comprises a multiplicity of solid-state diodes 262 (FIGS. 6 and 6A) interconnected in series to form a bridge circuit 94 as is shown in FIG. 6A. The terminals of these diodes 262 are mounted on a pair of vertical parallel insulative strips 264 (FIG. 6A). Dotted lines 271 show that terminals of successive diodes 262 are connected in series and also show that terminals of upper and lower diodes 262 on each mounting strip 264 are connected to respective nearby bolts 265. These two strips 264 are mounted in spaced parallel relation to the insulative panel 260 by four bolts 265 secured by nuts with insulative spacers 266 around the bolts. Two thickly-insulated wires 272 complete the circuit of the HV bridge rectifier 94 by connecting respective bolts 265 (output terminals 221 and 224) at upper ends of the two mounting strips 264 with respective bolts at lower ends of the opposite mounting strip.

The upper two bolts 265 and nuts which hold upper ends of the vertical strips 264 serve as output terminals 221 and 224 (FIGS. 5B and 8) of the HV bridge rectifier 94. In FIGS. 5B, 6A and 8 are seen the rectifier output terminals 221 and 224 connected, respectively, by flexible insulated wires 219 and 223 to the upper ends of vertically-movable rods 215, 218 and 217, 216 (FIG. 8) whose lower ends carry contacts 95, 101 and 102, 96.

In FIGS. 6 and 6A is seen an insulated wire lead 268 (shown also in FIG. 5B) extending from one end of the HV secondary winding 92 to one input side 267 of the HV bridge rectifier. There is another insulated wire lead 269 (FIGS. 5B and 6A) extending from the other end of the secondary winding 92 to the other input side 270 of the HV bridge rectifier.

Method, System and Apparatus Providing Preselected Time Constants for Capacitance Discharge at Predetermined Points During Decreasing Applied Test Voltage For Minimizing Power Consumption While Keeping Load Voltage "Below" and in Close Conformance With Decreasing Quadrants of Sinusoidal Test Voltage Waves As was explained in the introduction, during the first halves of half cycles of Very Low Frequency High Voltage sinusoidal test waves 107 (FIG. 10) (i.e., during the first half extending from point 201 to point 97 of half cycle 109 and during the first half extending from point 201 to point 97' of half cycle 111) the magnitude of voltage appearing across a capacitive test "LOAD" (FIG. 5B) will match (will closely follow) the sine-shape envelope of the applied test waves 107. However, during second halves (i.e., during the second half, which is called quadrant Q, extending from point 97 to point 201 of half cycle 109 and during the second half, which is called quadrant Q', extending from point 97' to point 201 of half cycle 111) the magnitude of voltage appearing across a capacitive test "LOAD" (FIG. 5B) can "escape" from being controlled by the sine-shape envelope of the applied test waves. This escape from control occurs because a capacitive test LOAD, if not discharged, will retain residual charged voltage. Then, the escaped voltage appearing across the capacitive test LOAD will remain in an uncontrolled status above the envelope of decreasing applied voltage.

The disclosed method, system and apparatus employ a sequence of preselected resistance discharges providing a preselected sequence of progressively-reduced Resistance-Capacitance (RC) Time Constants. These progressively-reduced Time Constants are brought into action at preselected points during decreasing voltage quadrants Q and Q' of VLF HV test waves 107. These progressively-reduced Time Constants are designed such that plotted curves of their exponential-discharge voltages will remain "under" (will closely follow) the sine-shape envelope of decreasing test voltages intended to be applied to a capacitive test LOAD (FIG. 5B). Moreover, shapes of these exponential, progressively-reduced Time Constant discharges and points at which they are switched into action are designed to save Wattage of electrical power needed for creating VLF HV test wave envelopes 107 (FIG. 10) of sinusoidal shape applied across capacitive test LOADs.

Figure 13:
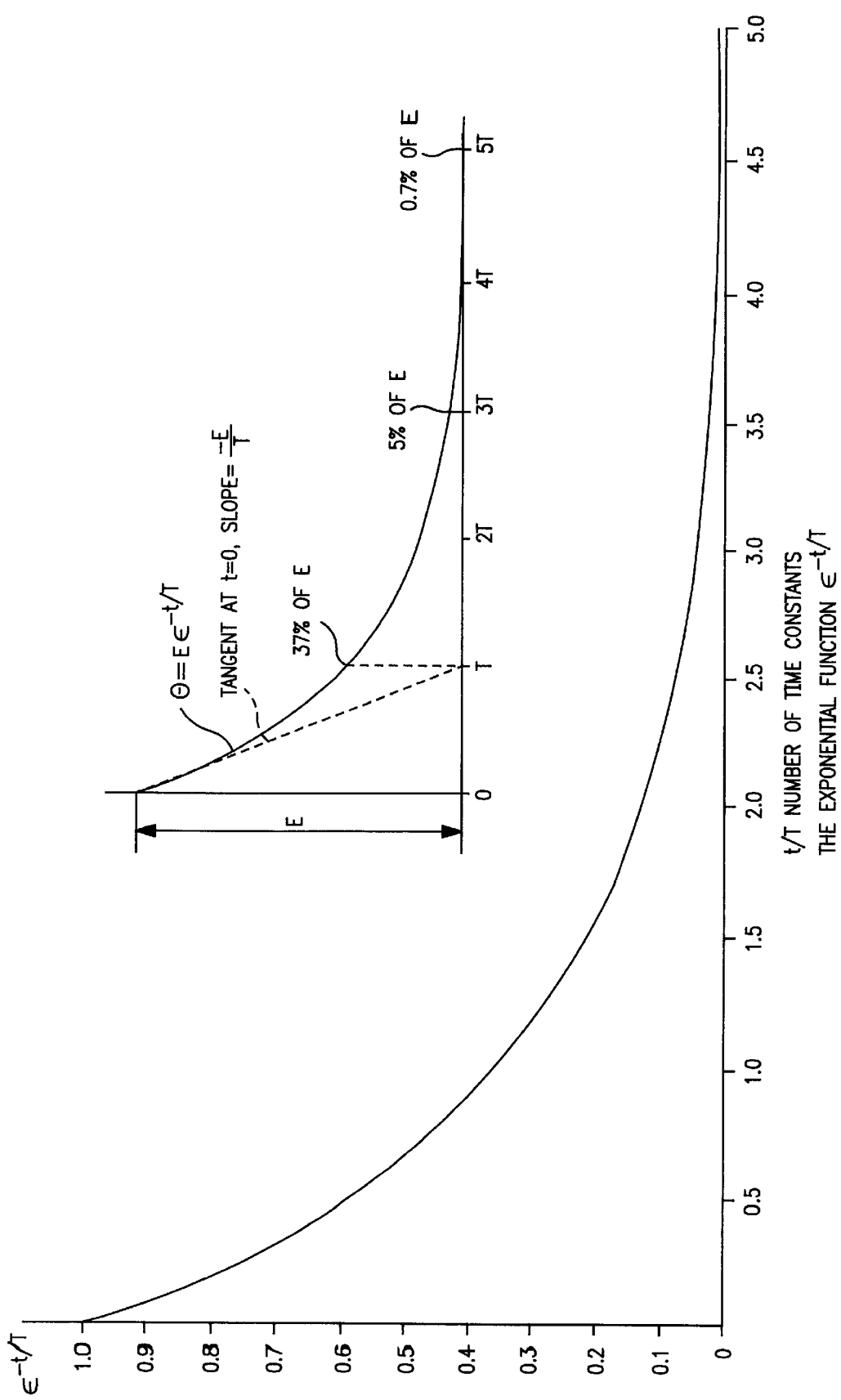
FIG. 13 is based on a reference book plot of the exponential function $\epsilon^{-t/T}$ for resistive discharge of a capacitor. Values of this exponential function are plotted along the vertical axis and numbers of Time Constants ("T") are plotted along the horizontal axis. Also, an inset shows a plot of decreasing voltage across a capacitor during resistive discharge, starting with an initial voltage "E" across the capacitor.

As is illustrated in FIG. 13, an electric charge has been applied to a capacitor, and this charge causes a voltage "E" to appear across the capacitor. This initial voltage E is discharged through a resistor almost to a zero remaining voltage of 0.7% of E after a time "5T" has passed. In other words, the initial voltage is decreased by 99.3%, which is effectively to zero. "5T" means that a time duration of five Time Constants has occurred. A Time Constant ("TC") of discharge of a capacitor through a resistor is calculated by multiplying ohmic resistance R of the resistor times the capacitance C of the capacitor:

$$\text{Time Constant (TC)} = RC \tag{11}$$

In this example as shown in FIG. 5B the capacitive "LOAD" being tested is assumed to have a capacitance C equal to 2.2 microFarads ($\mu F$). The highest voltage levels at points 97 and 97' (FIG. 10) on the VLF HV sinusoidal test waves 107 are assumed to be at plus and minus 40,000 Volts.

Figure 12:
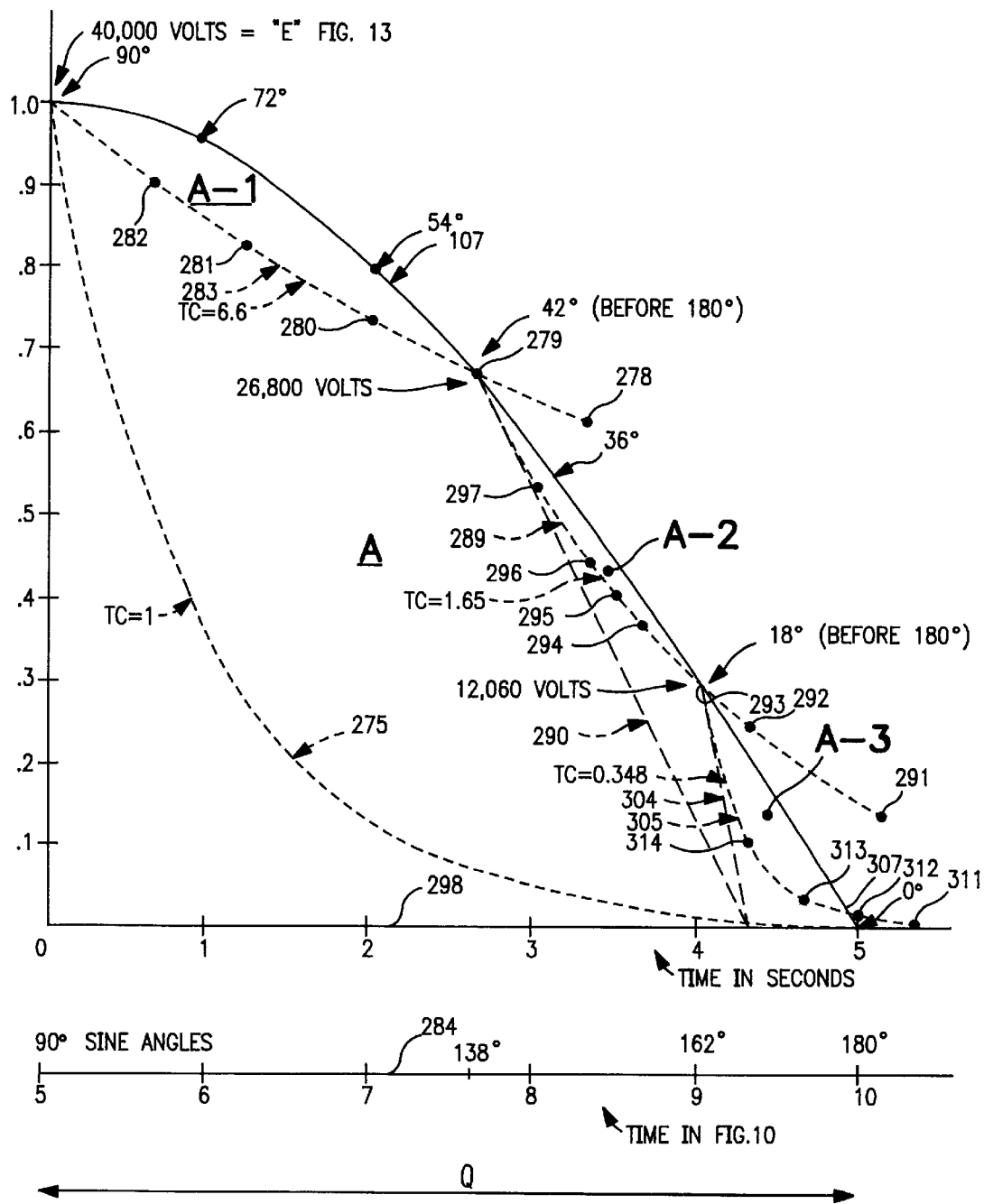
FIG. 12 is an enlarged plot of one-quarter of a period P, i.e., a quarter Q (FIG. 10) of decreasing voltage, of the VLF HV sinusoidal electrical full wave having period P shown in FIG. 10.

FIG. 12 is an enlargement of a decreasing voltage quadrant "Q" (FIG. 10) of the VLF HV sinusoidal test waves 107 shown in FIG. 10. In FIG. 10 this decreasing voltage is shown occurring during quadrant Q, which extends for five seconds from Time "5" to Time "10" SECONDS in FIG. 10.

Similarly, in FIG. 12 this decreasing quadrant Q of a sinusoidal test wave 107 is shown ON TIME Scale 284 as extending from TIME "5" to TIME "10" SECONDS.

Assume that a single resistor is used for discharging the 2.2 $\mu F$ LOAD from an initial peak voltage of 40,000 volts down to a final voltage of about 0.7% of this initial voltage, i.e., down to about 280 Volts. Then, this single resistor in circuit with 2.2 $\mu F$ must provide five Time Constants within five seconds from TIME "5" to TIME "10" in FIG. 12. Therefore, the Time Constant provided by this single resistor is one second, and so its ohmic value is calculated as follows:

$$TC = 1 = RC = R \times 2.2 \, \mu F. \tag{12}$$

Rearranging (12) gives $$R = \frac{1}{2.2 \times 10^{-6}} = \frac{10^6}{2.2} = 454{,}500 \text{ ohms} \tag{13}$$

The exponential discharge of a 2.2 $\mu F$ capacitor from an initial peak voltage of 40,000 volts produced by such a single 454,500 Ohm resistor is shown in FIG. 12 by a dashed curve 275.

It is noted that a 454,500 Ohm resistor with 40,000 volts applied at peak 97 (FIG. 10) would be drawing a peak amperage calculated as follows:

$$\text{Peak } I = \frac{E}{R} = \frac{40{,}000 \text{ Volts}}{454{,}500 \text{ ohms}} = 0.088 \text{ Ampere.} \tag{14}$$

This 0.088 Ampere of peak current at a peak voltage of 40,000 volts is a peak power drain in kVA calculated:

$$\text{Peak kVA} = EI = 0.088 \text{ Ampere} \times 40{,}000 \text{ Volts} = 3{,}520 \text{ VA (3.52 kVA)} \tag{15}$$

The electric power input from plug 23 is at 120 volts. Thus, a peak power drain of 3.52 kVA would cause a peak input Amperage calculated:

$$\text{Peak Input Amperage} = \frac{3{,}520 \text{ VA}}{120 \text{ Volts}} = 29.3 \text{ Amperes.} \tag{16}$$

A system and apparatus including a control unit 10 and an HV unit 100, which could handle 3.52 kVA of peak power calling for a peak input of 29.3 Amps at 120 Volts, would be much heavier and less efficient than the present preferred embodiment. It is believed that such a 3.52 kVA system and apparatus would be too heavy to be carried by one person.

In effect, a 454,500 Ohm discharging resistor would require sufficient power input so as to "fill in" the area A (FIG. 12), which represents the difference between the exponential-discharge curve 275 in FIG. 12 and the desired predetermined sinusoidal shape (FIG. 10) of discharge quadrant Q of test waves 107.

In the absence of such a 454,400 Ohm resistor, the power required to fully charge 2.2 $\mu F$ to a peak voltage 105 (FIG. 10) of 40 kV in five seconds from TIME "0" SECONDS to "5" SECONDS in FIG. 10 is calculated as follows, wherein "i" is the current, "C" is the capacitance, "E" is the peak voltage and "t". is the time:

$$i = \frac{CE}{t} = \frac{2.2 \times 10^{-6} \times 40 \times 10^3}{5} = .0176 \text{ Amps}. \quad (16)$$

Thus, the power in VoltAmperes required to produce this peak voltage of 40 kV across a capacitance of 2.5 μF without resistance drain of 454,500 Ohms is:

$$VA = EI = 40 \times 10^3 \text{ Volts} \times 0.0176 \text{ A} = 704 \text{ VA} \quad (17)$$

In summary, it is seen that the presence of a 454,500 Ohm discharge resistor connected across a 2.2 μF capacitor which is intended to be charged to a peak voltage of 40,000 volts increases the input power from 704 VoltAmperes for the capacitor alone to 3,520 VA for the resistor plus 704 VA for the capacitor, which is a total of 4,224 VA.

A current-limiting, meter-connection resistor 274 (FIGS. 5B, 6 and 7) is shown connected at 366 (shown as a conductive stud in FIGS. 6 and 7) to the output line 106, which is connected through a connection N (FIG. 5A) in series with the meter 20. Resistance of this meter-connection resistor 274 is 60 MegOhms, which is sufficiently large that its very small current-drain effect can be disregarded in the following description.

In accord with a method, system and apparatus as shown embodying the invention, an electromechanically-driven switching system changes the ohmic value of discharging resistance as discharge is occurring, thus keeping a sequence of exponential discharge waveshapes of progressively-reduced Time Constants close to the desired predetermined decreasing voltage envelope 107 of the VLF HV sinusoidal test waves shape 107 (FIG. 10) during each decreasing voltage quadrant Q and Q'.

For example in this illustrative embodiment it was decided to provide a first resistance discharge path 276 (FIGS. 5B and 7) having a total of 3,000,000 ohms. This first resistance path 276 is shown in FIG. 5B connected between HV output line 106 and the grounded return line P. This 3 MegOhm resistance path 276 as shown comprises six resistors 277 connected in series as illustrated in FIG. 5B and having their terminal leads mounted on the insulative panel 236 arranged in a zigzag pattern (shown in FIG. 7). For example, each of these six resistors 277 is a 12 Watt, 500 kOhm resistor immersed in oil. The Time Constant for discharging 2.2 μF through 3 MegOhms is calculated:

$$TC = RC = 2.2 \times 10^{-6} \times 3 \times 10^6 = 6.6 \text{ seconds}. \quad (18)$$

FIG. 13 shows that at one-half of a Time Constant, i.e., at "0.5", the exponential discharge curve provided by a resistor passes through a voltage point of about 0.6 of the initial voltage E. Since the 3,000,000 Ohm resistor 276 provides a Time Constant of 6.6 seconds, then at one-half of this TC, namely at 3.3 seconds, the exponential discharge provided by this resistor 276 is 0.6 of the initial voltage E. This 0.6 fractional amount of the initial voltage of 40,000 volts occurring at TIME 3.3 SECONDS is plotted in FIG. 12 at the point 278. Voltage points plotted in FIG. 12 for an exponential discharge with a Time Constant of 6.6 seconds are listed below. In order to correlate plotted points in FIG. 12 with the TIME scale "5" to "10" SECONDS for quadrant Q in FIG. 10, a second TIME scale 284 running from "0" to "5" SECONDS is set forth in FIG. 12.

TABLE I

Table for a Time Constant (TC) of 6.6 Seconds:

| Fraction of TC | TIME in SECONDS | Fraction of E | Plotted Points in FIG. 12 |
|---|---|---|---|
| 0.5 | 3.3 | about 0.60 | 278 |
| 0.4 | 2.67 | about 0.67 | 279 |
| 0.3 | 1.98 | about 0.74 | 280 |
| 0.2 | 1.32 | about 0.81 | 281 |
| 0.1 | 0.66 | about 0.90 | 282 |

The exponential discharge curve having a Time Constant of 6.6 seconds passing through the above-listed plotted points is shown in FIG. 12 dashed at 283. This curve 283 is seen to "escape" above the desired predetermined sine-function test wave 107 at about plotted point 279, which is close to the angle of 42° on the sine-function curve 107 and which is at about 2.67 seconds on the first TIME scale 298 in FIG. 12.

At the voltage peak 97 (FIG. 10) of 40 kV this 3 MegOhm resistance 276 draws only a current of about 0.013 Amps, being a peak power drain of about 530 Watts, which added to the charging power (Equation 17) of 704 Watts, makes an intermittent total peak power consumption of about 1,230 Watts. At 120 volts input, this intermittent peak power of 1,230 Watts requires only an intermittent peak current input of about 10 to 11 Amperes.

Since the first exponential discharge curve 283 having a Time Constant of 6.6 seconds "escapes" above the desired sine-function envelope 107 at the 42° point, the design is to switch into action at this 42° point a 2nd resistance discharge path 285 (FIGS. 5B and 7) so as to provide a sequence of exponential progressively-reduced Time Constant discharge curves which are kept "beneath" the test wave 107. For example, in this embodiment, the design provides this second resistance discharge path 285 (FIGS. 5B and 7) having a total of 1,000,000 Ohms. This second resistance path 285 is shown in FIG. 5B connected between HV output line 106 and an HV contact 286 of a switching relay 288 to be described later. This 1 MegOhm resistance path 285 comprises four resistors 287 shown connected in series in FIG. 5B with their terminal leads shown in FIG. 7 mounted on the insulative panel 236 arranged in a zigzag pattern. Each of these four resistors 287 is a 30 Watt, 250 KiloOhm resistor immersed in oil.

At the instant when the resistance path 285 is switched into action, it becomes connected in parallel with resistance path 276. The two resistance paths 276 and 285 in parallel provide a combined total effective resistance of 750,000 ohms.

The 2nd Time Constant for discharging 2.2 μF through 750,000 ohms is calculated:

$$\text{2nd } TC = RC = 2.2 \times 10^{-6} \times 0.75 \times 10^6 = 1.65 \text{ seconds}. \quad (19)$$

At the 42° point on test wave curve 107 (FIG. 12) the new initial voltage ("2nd E") at start of a second exponential discharge having the above-calculated 2nd Time Constant of 1.65 seconds is 0.67 (from TABLE I)×40,000 volts=about 26,800 volts. This 2nd exponential discharge curve is shown dashed at 289 in FIG. 12, starting at 42° (which is at TIME 2.67 in FIG. 12).

In order to plot points for this second exponential discharge curve 289, the actual discharge time in seconds is added to 2.67 SECONDS in FIG. 12 to obtain the plotted points.

Also, in FIG. 13 a tangent is shown starting at time=0 with a slope of –E/T. Such a tangent can be drawn for the 2nd exponential discharge curve 289. This tangent 290 for curve 289 is drawn in dash lines from the 2nd E of 26,800 volts at the 42° point 279 on test wave curve 107 and extends down to a point at 4.32 SECONDS (which is obtained by adding one TC of 1.65 seconds (from Equation 19) to the 42° TIME of 2.67 SECONDS).

TABLE II

Table for a Time Constant (TC) of 1.65 Seconds:

| Fraction of one TC | TIME in SECONDS | Fraction of 2nd E (26,800 V) | Plotted Points in FIG. 12 |
|---|---|---|---|
| 1.5 | 2.475 + 2.67<br>5.145 | about 0.22 (from FIG. 13)<br>(5,900 V)<br>at 0.15 on Vertical Scale | 291 |
| 1.0 | 1.65 + 2.67<br>4.32 | about 0.37 (from FIG. 13)<br>(9,920 V)<br>at 0.25 on Vertical Scale | 292 |
| 0.8 | 1.32 + 2.67<br>3.99 | about 0.45 (from FIG. 13)<br>(12,060 V)<br>at 0.30 on Vertical Scale | 293 |
| 0.6 | 0.99 + 2.67<br>3.66 | about 0.55 (from FIG. 13)<br>(14,740 V)<br>at 0.37 on Vertical Scale | 294 |
| 0.5 | 0.83 + 2.67<br>3.50 | about 0.60 (from FIG. 13)<br>(16,080 V)<br>at 0.40 on Vertical Scale | 295 |
| 0.4 | 0.66 + 2.67<br>3.33 | about 0.67 (from FIG. 13)<br>(17,960 V)<br>at 0.45 on Vertical Scale | 296 |
| 0.2 | 0.33 + 2.67<br>3.00 | about 0.81 (from FIG. 13)<br>(21,700 V)<br>at 0.54 on Vertical Scale | 297 |

This 2nd exponential discharge curve 289 having a second Time Constant of 1.65 seconds passing through the above-listed plotted points is seen to "escape" above the desired predetermined sine-function test wave 107 close to plotted point 293 at 3.99 SECONDS on Time Scale 298 which is at 18° corresponding with 0.30 on the Vertical Scale at a voltage of about 12,060 Volts.

Since the second exponential discharge curve 289 with a Time Constant of 1.65 seconds "escapes" above the desired sine-function envelope 107 at the 18° point, the design is to switch into action at this 18° point a 3rd resistance discharge path 300 of 200,000 ohms, so as to continue the sequence of exponential progressively-reduced Time Constant discharge curves. This 200 kOhm discharge path 300 is shown in FIG. 5B connected between HV output line 106 and an HV contact 301 of a switching relay 302 to be described later. This 200,000 ohm resistance path 300 as shown in FIG. 5B comprises two resistors 303 connected in series with their terminal leads being mounted on the panel 236 as shown in FIG. 7. Each of these two resistors 303 is a 20 Watt, 100,000 Ohm resistor immersed in oil.

The three resistance paths 276, 285 and 300 in parallel provide a combined total effective resistance of 158,000 Ohms.

The 3rd time constant for discharging 2.2 μF through 158,000 Ohms is calculated:

$$3rd\ TC = RC = 2.2 \times 10^{-6} \times 1.58 \times 10^5 = 0.384\ \text{seconds.} \quad (20)$$

The new initial voltage ("3rd E") is about 12,060 volts at start of the 3rd exponential discharge curve shown dashed at 305 (FIG. 12). A tangent 304 to this 3rd curve 305 is shown by a dashed line, and it starts at plotted point 293 at 18° at TIME 3.99 seconds on scale 298 and at a voltage of about 12,060 volts. This tangent 304 extends down to a point at 4.338 SECONDS (which is obtained by adding one TC of 0.348 Seconds to the 18° TIME on scale 298 of 3.99 SECONDS).

TABLE III

Table for a Time Constant (TC) of 0.348 Seconds:

| Fraction of TC | TIME in SECONDS | Fraction of 3rd E (12,060 V) | Plotted Points in FIG. 12 |
|---|---|---|---|
| 1 | 0.348 + 3.99<br>4.34 | 0.37 (from FIG. 13)<br>(4,460 V)<br>at 0.11 on Vertical Scale | 314 |
| 2 | 0.696 + 3.99<br>4.69 | 0.136 (from FIG. 13)<br>(1,640 V)<br>at 0.041 on Vertical Scale | 313 |
| 3 | 1.04 + 3.99<br>5.03 | 0.05 (from FIG. 13)<br>(603 V)<br>at 0.015 on Vertical Scale | 312 |
| 4 | 1.39 + 3.99<br>5.38 | 0.02 (from FIG. 13)<br>(241 V)<br>at 0.006 on Vertical Scale | 311 |

It is seen that this 3rd exponential discharge curve 305 having a TC of 0.348 seconds crosses the sine function curve 107 at point 307, which is at 0.015 on the vertical scale, at approximately 600 V. It is noted that 600 V is only 0.15% of the initial E of 40,000 V.

It is seen that a summation of three areas A-1, A-2, A-3 located between sequential exponential progressively-reduced Time Constant discharge curves 283, 289, 305 and sine-function test wave shape 107 is very much less than area A located between a single exponential discharge curve 275 and this test wave shape 107. Therefore, it will be appreciated that very much less power is needed to "fill in" between these three sequential exponential progressively-reduced Time Constant discharge curves 283, 289, 305 and test wave shape 107 than would be needed to "fill in" area A between the single exponential discharge curve 275 and test wave shape 107.

Figure 9:
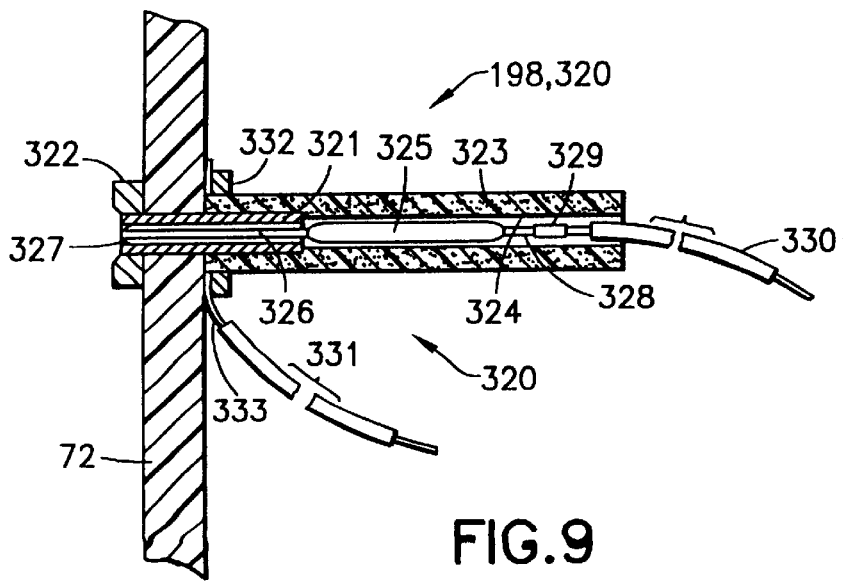
FIG. 9 is an enlarged cross-sectional view of a magnetically-actuated reed switch. These switches are used in the control unit, as is shown in FIG. 3, and they are actuated by a magnet (FIG. 4) of a revolvable control arm.

In order to switch resistance discharge paths 285 and 300 sequentially into action at preselected points of 42° and 18° along sine-function voltage curve 107 (FIG. 12), there are two relays 288 and 302 (FIGS. 5B and 7) having windings 317 and 318, respectively. These windings 317, 318 are energized as now will be explained. On the panel board 72 (FIGS. 3 and 4) are mounted four reed switch assemblies 320 (shown at 320-1, 320-2, 320-3 and 320-4) preferably constructed as shown in FIG. 9. As shown these reed switch assemblies include a hollow electrically-conductive, ferromagnetic threaded stud 321 screwed through the panel 72 and secured by a ferromagnetic nut 322. A stiff non-magnetic insulative protective sleeve 323 is screwed onto the hollow stud and projects outward from the panel 72 providing a bore 324 for supporting a reed switch 325. One lead 326 of the reed switch extends within the hollow stud 321 and is soldered at 327 to the stud. The other lead 328 is soldered at 329 to an insulated wire 330. Another insulated wire 331 is connected to the stud 321 by a nut 332 and a terminal 333 captured between this nut 332 and the panel 72.

In effect, the front ferromagnetic nut 322 and ferromagnetic stud 321 serve as an extended pole piece for each reed switch 325. Thus, the magnet 196 (FIG. 4) carried by the revolving arm 64 actuates (closes) contacts within the respective reed switch assemblies 320-1, 320-2, 320-3 and 320-4 as the revolving arm 64 moves past these respective reed switch assemblies.

Four pairs of insulated wires 330 and 331 are shown in FIG. 3. These pairs of wires extend from the four reed switch assemblies 320-1, 320-2, 320-3 and 320-4, and they are connected to respective terminals of four self-holding relays 342, 341, 344 and 343, as is shown in FIG. 3.

Operation of Electrical and Mechanical Components for Providing a Sequence of Exponential Discharges having Progressively-Reduced Time Constants For Closely Matching Sinusoidal Discharge of an HV Capacitive "LOAD"

For explaining operation, assume that revolving arm 64 has just arrived at the 0° position in FIGS. 3 and 11. Thus, the brush contact 66 on this arm has just engaged impulse-relay control contact 118 (FIGS. 5A and 11) so that motor-control contact arm 124 (FIG. 5A) has just become engaged with "+" contact 126 for causing motor M to begin revolving brush-carrying arm 64 counterclockwise. Simultaneously, the impulse relay 122 causes relay arm 128 to engage with "+" contact 132. Thus, reed-switch assemblies 320-4 and 320-3 are energized by 24 V DC supplied from line 132 through arm 128 and contact 132 to line 140, but contacts within their respective reed switches 325 remain open until they subsequently will be magnetically actuated.

Figure 4:
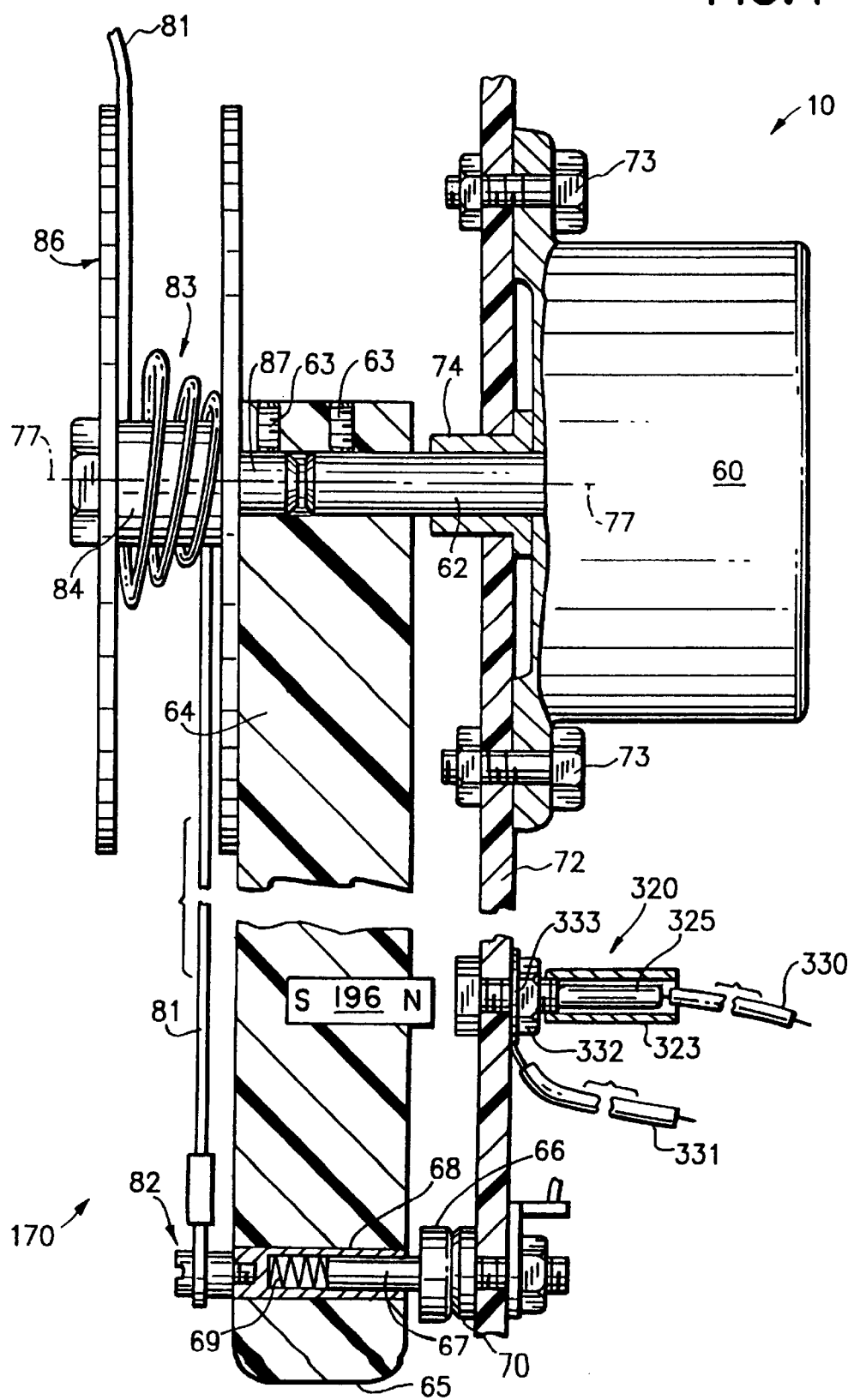
FIG. 4 is an enlarged partial cross-sectional view taken along the line 4—4 in FIG. 3, more clearly illustrating a rotatable contact-carrying control arm and its motor drive.

Also, the main switch 24 has just been turned on, then with revolving arm 64 just arriving at the 0° position in FIGS. 4 and 11, the zero-start reed switch 198 will be actuated by the magnet 196 for providing start of the test waves 107 (FIG. 10) at zero voltage as was explained above.

The line 134 (FIG. 5A) is not energized by 24 V DC during counterclockwise revolving of brush-carrying arm 64. Thus, the reed-switch assemblies 320-1 and 320-2 are not energized. Consequently, magnetic actuation of contacts within reed switches 325 of these assemblies 320-1 and 320-2 has no effect upon the method, system and apparatus embodying the invention.

Thus, with reference to FIG. 11, the arm 64 is assumed to have just reversed and now is revolving counterclockwise CC. Brush contact 66 sweeps into successive engagement with contacts 70 from 0° to 90°, thereby producing as shown in FIG. 2 a first half of a half wave of amplitude modulation envelope 46 from zero voltage at point 0 to peak 47. Also, the magnet 196 sweeps past reed-switch assemblies 320-1 and 320-2, but momentary closure of contacts in their reed switches 325 (FIGS. 4 and 9) has no effect, since these two reed-switches are not energized, as was explained above.

The arm 64 (FIG. 11) continues revolving counterclockwise CC from 90°. Thus, brush contact 66 sweeps into successive engagement with contacts 70 from 90° to 0°, thereby producing a second half of a half wave of amplitude modulation envelope 46 from peak voltage at point 47 to zero voltage at point 49. As arm 64 (FIG. 11) is revolving counterclockwise CC, the magnet 196 sweeps past and momentarily actuates reed switch assembly 320-4 located at 42° (electrical degrees, not mechanical degrees) and then subsequently sweeps past and actuates reed switch assembly 320-3 located at 18°. Successive momentary actuation of these reed switch assemblies 320-4 and 320-3 (FIG. 5A) at 42° and 18° produces successive closure of self-holding relays 345 and 346, thereby successively energizing lines J and M (Please see also FIG. 5B) for successively energizing windings 317 and 318 of High Voltage relays 288 and 302 (Please see also FIG. 7) for successively connecting in circuit the second and third resistance discharge paths 285 and 300.

The resistance discharge path 285 remains in circuit in parallel with resistance discharge path 276 while arm 64 sweeps counterclockwise CC (FIG. 11) from 42° to 0° for providing capacitive discharge as shown by the curve 289 in FIG. 12. The resistance discharge path 300 remains in circuit in parallel with both of resistance paths 276 and 285 while arm 64 sweeps counterclockwise from 18° to 0° for providing capacitive discharge as shown by the curve 305 in FIG. 12. Thereby is produced a sequence of exponential discharges as is shown by curves 283, 289 and 305 of a capacitive LOAD, and this sequence has progressively-reduced Time Constants closely matching the desired sinusoidal (sine-function) test wave 107 in FIG. 12 from point 97 at TIME 5 seconds to point 201 at TIME 10 seconds.

When the arm 64 completes a counterclockwise CC (FIG. 11) revolution, arrival of its brush contact 66 at the 0° position connects impulse-relay control contact 118 with 0° contact 70 thereby triggering impulse relay 122 (FIG. 5A) for engaging relay arm 124 with "−" contact 126 for commencing to revolve arm 64 clockwise C. Also, this triggering of impulse relay 122 causes relay arm 128 to engage with "−" contact 130 (FIG. 5A). Thus, reed-switch assemblies 320-2 and 320-1 are energized while reed-switch assemblies 320-3 and 320-4 are deenergized. Consequently, actuation by magnet 196 of reed contacts within assemblies 320-3 and 320-4 has no effect while the arm 64 is swinging clockwise C from 0° to 90° (FIG. 11). During continued clockwise revolving of arm 64 from 90° to 0°, the reed-switch assemblies 320-2 and 320-1 are successively actuated at 42° and 18°, thereby producing a sequence of exponential discharges of progressively-reduced Time Constants during the second half (quadrant Q' in FIG. 10) of the half wave 111 of VLF High Voltage test waves 107. This sequence of exponential discharges provided during quadrant Q' are in negative-voltage correspondence with, i.e., are mirror images of, the sequence of exponential discharge curves 283, 289 and 305 in FIG. 12, thereby closely matching the desired VLF HV sinusoidal (sine-function) test wave 107 (FIG. 10) in quadrant Q' extending from point 97' at TIME 15 seconds to point 201 at TIME 20 seconds.

HV OUTPUT WELL

In FIGS. 6 and 7, a large-diameter conductive stud 366 is shown connecting the terminal 235 to the terminal 238. This stud 366 has a top socket 367 (shown in dashed outline in FIG. 7) into which is connected a lower end of an output well bushing 108 (FIGS. 5B and 7). The HV output line 106 extending to stud 366 in FIG. 5B is shown in FIGS. 6, 7 and 8 as comprising flexible lead 233 (or 234) and terminal 235 which is connected to stud 366.

It is noted that contacts 286, 352 and 301, 355 are toroidal shaped for relieving voltage stresses in the oil 112 near their surfaces. The conductive studs 360, 361 and 366 have relatively large diameters for similarly relieving voltage stresses.

Output Voltage Metering and Indicator Lamp Circuit

A circuit for the output voltage meter 20 and for a neon meter lamp 372 is traced from stud 366 (FIGS. 5B and 7) through a terminal and through resistor 274 (60 MegOhms), through connection N to a terminal 373 (FIG. 5A), through a resistor 374 (for example of 100,000 Ohms) through meter 20 (for example rated at 500 micro Amperes, +40 to −40 kiloVolts) to the terminal 21 and through a resistor 375 (for example of 5,000 Ohms) to the grounded terminal 22. A smoothing capacitor 376 (for example rated at 0.47 $\mu$F) is shown connected across terminals 373 and 22.

Overload Protection and Dielectric Failure Indication Circuit

An overload protection and dielectric failure indication circuit 378 includes current transformer 90 with its primary winding 89 in series with connection F and its secondary winding 380 connected across a resistor 382 and a bridge rectifier 384. A filter capacitor 385 and a winding 386 of an OVERLOAD (O.L.) RELAY 388 are shown connected across this bridge rectifier. Upon occurrence of an overload current flow through winding 89, the OVERLOAD relay 388 becomes tripped, flipping its switch arm from a contact 389 to a contact 390, thereby immediately shutting down both control unit 10 and HV unit 100 and energizing a FAILURE signal lamp 36 indicating that dielectric has failed in the LOAD being tested.

Transformer Oil Cooling and Filtering

As shown in FIG. 5B, transformer oil 112 is drawn from the High Voltage tank 110 and is circulated through a cooling and filtering circuit 392. This circuit includes a filter 393, whose inlet 394 communicates with hot oil in an upper portion of the tank, and a positive-displacement hydraulic pump 395, draws oil through the filter and feeds filtered oil through a tube 396 to an air-cooled radiator 397. Cooled oil is returned from the radiator through a tube 398 communicating with a lower portion of the tank. A pancake-type fan 400 blows ambient air flow 402 through radiator 397 for cooling oil circulated through the radiator. This circuit 392 is protected by enclosure in a rigid shroud 399 (FIG. 18B) mounted on the side of the tank 110. The fan 400 draws ambient air into this protective shroud through a grilled inlet opening in one side and directs air flow 402 through the radiator which is mounted adjacent to a grilled outlet in the other side of the shroud opposite to the fan. As an example, suitable components which may be used in this circuit 392 comprise the following: a positive-displacement hydraulic pump 395, such as a "WINPRO" Pump commercially available from Winpro, Inc. in Farmingdale, N.Y., a hydraulic filter 393 such as commercial available from Parker Filtration Hydraulic Filter Division in Metamora, Ohio 43540, Part No. 926543-03C having a replaceable can-type filter cartridge, and a radiator for example such as an automobile, passenger-compartment heater radiator, for example such as a heater radiator used in a 1997 Ford "TAURUS" automobile.

The pump 395 and fan 400 are energized through connections Z, Z (FIGS. 5B and 5A) leading to the AC-energized lines 119 and 154.

DETAILED DESCRIPTION OF OTHER PREFERRED EMBODIMENTS OF THE INVENTION

In FIGS. 15, 16, 17 and 18A is shown another embodiment, i.e., another configuration of a control unit 10A. This second control unit 10A performs functions similar to functions performed by the first control unit 10 shown in FIGS. 1, 3, 4, 5A and 11; however, this second control unit 10A incorporates significant changes or differences in comparison with the first control unit. These significant differences are described below:

a) Instead of the AC-modulation apparatus 170 there is AC-modulation apparatus 170A wherein a single-phase synchronous motor 60A is energized by supply line AC voltage. This motor 60A has a starting capacitor 60A-1 (FIG. 18A), and the motor continuously rotates in the same direction turning its output shaft 62A (FIG. 17) at 6 RPM for rotating a face cam 410 continuously in the same direction at 6 RPM. This face cam has a "heart"-shaped groove 412 for driving a gear train 406 with oscillatory movement, i.e., with drive motion alternately in first and second directions. The gear train drives a carbon brush 66A (FIG. 18A) of a variable transformer 180A for revolving this brush alternately in first and second directions for amplitude modulating an AC line-voltage input to provide a modulation envelope having a shape as shown at 46 in FIG. 2 including a sequence of half waves 43 and 45.

b) Instead of adjusting magnitude of incoming AC voltage as is shown in FIG. 5A by voltage-level-adjusting apparatus 150 (FIG. 5A) positioned in circuit ahead of apparatus 180 which amplitude modulates the adjusted voltage, the second control unit 10A shown in FIG. 18A amplitude modulates the full magnitude of the incoming AC voltage by an AC-voltage-modulating variable transformer 180A positioned in circuit ahead of voltage-level-adjusting autotransformer apparatus 150 A.

c) Instead of reed-switch assemblies 320-1, 320-2, 320-3 and 320-4 which operate self-holding relays 342, 341, 344 and 343, there are two micro switches 345A and 346A (FIG. 18A) mechanically actuated by a protruding lug, for example a screwhead 407 (FIG. 16) mounted on the perimeter of the face cam 410, for sequentially closing these micro switches for the positive half wave 109 (FIG. 10) at 42° before 180° (namely at 138°) and at 18° before 180° (namely at 162°) and also for sequentially closing these microswitches for the negative half wave 111 (FIG. 10) at 42° before 360° (namely at 318°) and at 18° before 360° (namely at 342°). These are electrical degrees not mechanical degrees. These micro switches actuate self-holding relay circuits 345A-1 and 346A-1.

d) A thermal switch 414 (FIG. 18B) senses temperature of transformer oil 112 in the HV tank 110 and opens a circuit through AC feed lines 415 and 416 in control unit 10A for shutting off operation of the whole system in case oil temperature rises above design level, for example 175° F.

e) Instead of a current transformer 90 for shutting off operation of the whole system in case excess current is flowing to the High Voltage output step-up transformer, there is a thermal-overload circuit breaker 90A.

f) Also, movistors 417 (FIG. 18A) are shunted to ground in a few circuit locations for providing "spike protection".

g) There are other differences which will become apparent as this disclosure proceeds.

In FIG. 15 for clarity of illustration of control unit 10A, connections to a terminal strip 405 are omitted. Shown mounted on a panel 72 of the control unit 10A is the drive motor 60A of the AC-modulation apparatus 170A. For example, this motor is a 6 RPM synchronous motor manufactured by the Hurst Manufacturing Division of Emerson Electric in Princeton, Ind., and it directly drives the face cam 410 (FIG. 16) at 6 RPM. Also mounted on panel 72 in FIG. 15 is a variable transformer 180A for example a toroidal-wound, single-winding POWERSTAT variable transformer Type 21 available from Superior Electric in Bristol, Conn.

A step-down transformer 137 mounted on panel 72 energizes a 24 Volt DC power supply 136 (FIG. 18A). A bi-stable impulse relay 199 performs functions similar to those done by a similar impulse relay 122 in the first control unit 10.

Figure 16:
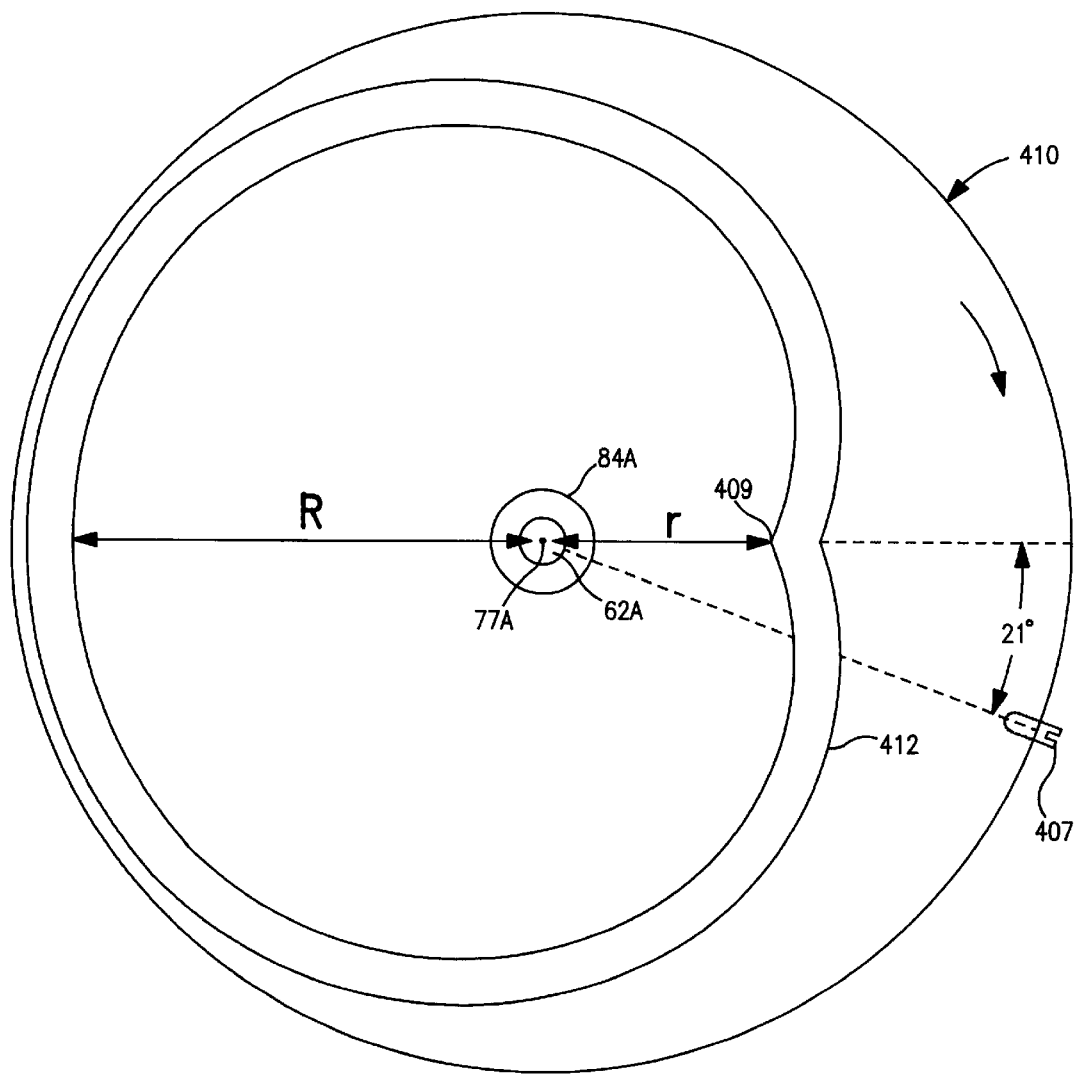
FIG. 16 shows the face cam used in the control unit of FIG. 15. This cam may be called a "heart cam" due to the shape of its groove.

As shown in FIG. 16 the face cam 410 has a "heart"-shaped groove. A hub 84A of this face cam is suitably secured to a drive shaft 62A of the motor 60A having an axis 77A. This face cam is revolved continuously in the same direction at 6 RPM. As an example, it is noted that the face cam 410 as here shown is made of ABS plastic. It also can be made of aluminum or similar mechanically stiff material suitable for machining the groove 412 in this material.

Figure 17:
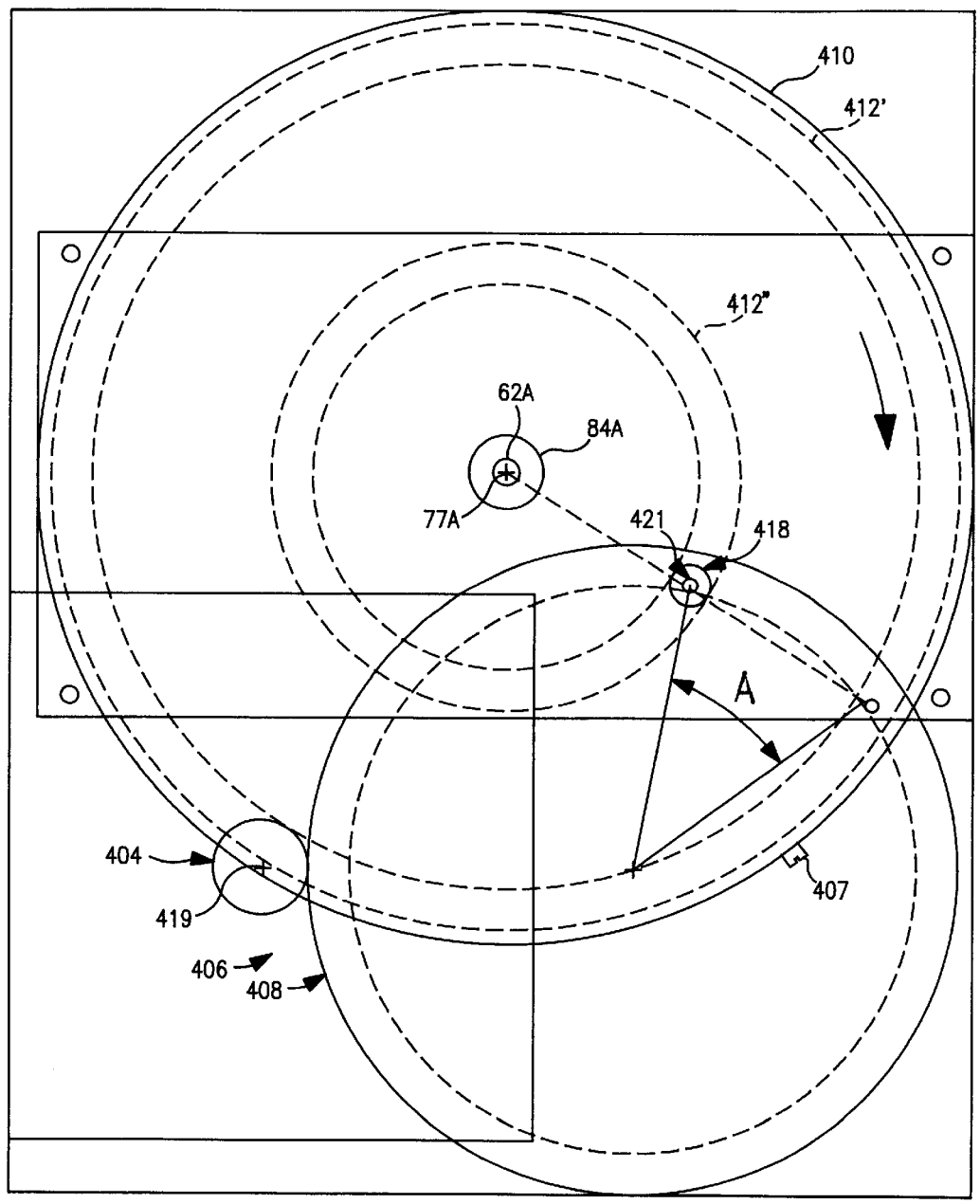
FIG. 17 is a schematic diagram of the face cam and an oscillating gear train driven by a cam follower in engagement with this face cam.

In FIG. 17, the outer dashed groove outline 412' indicates a cam-follower operating position in FIG. 17 of the outermost portion of the groove 412 (FIG. 16). This outermost cam-follower position occurs at the greatest radial distance "R" from the axis of rotation 77A of the cam 410. Similarly, the inner dashed groove outline 412" indicates an innermost cam-follower operating position which occurs at a cusp portion 409 of groove 412, located at a least radial distance "r" from axis 77A.

The protruding screwhead element 407 (FIG. 16) is positioned 21° (mechanical degrees) in advance of the cusp 409, with the face cam 410 shown revolving clockwise in FIG. 16. This protruding element 407 serves to actuate sequentially two microswitches 345A and 346A (FIG. 18A) as will be described later.

A cam follower 418 rides in the groove 412. As shown, this cam follower comprises a small ball bearing freely rotatably mounted on a pin stud 421 protruding from and secured to a large-diameter gear 408 near the periphery of this gear. For example, this gear has 192 teeth around its circumference. As the face cam 410 revolves, the cam follower 418 rides along the groove 412 and causes the large gear 408 to oscillate back and forth through an angular range "A" (FIG. 17) of about 47.1° (mechanical degrees).

This large gear 408 is mounted in a gear train 406 (FIG. 17) including a small-diameter gear 404 driven by the large gear 408 and which, for example, has 28 teeth around its circumference. Thus, oscillatory motion of the large gear 408 through an angular range of about 47.1° causes the small gear 404 to be driven back and forth with an oscillatory motion through an angular range of about 323°.

This small gear 404 is secured to a revolvable carbon brush of the POWERSTAT variable transformer 180A (FIG. 15) for providing oscillatory revolution of this brush mechanism around axis 419. Thus, a carbon brush 66A (FIG. 18A) is alternately revolved about 323° counterclockwise and about 323° clockwise (mechanical degrees). This oscillatory angular motion of about 323° causes the variable transformer 180A to produce amplitude modulation 46 (FIG. 2) of AC voltage 44 in successive half waves 43, 45, etc. Each half wave extends for 180° (electrical degrees) and each has a duration of 10 seconds, thereby providing VLF HV test waves 107 (FIG. 10) each having a time duration (Period "P") of 20 seconds, corresponding with a frequency of 0.05 Hz.

Also, since the face cam 410 always rotates in the same direction, only two micro switches 345A and 346A are used. These microswitches are suitably positioned near the perimeter of the revolving cam 410 so that protruding element 407 provides momentary closure of these microswitches during positive half waves at electrical degrees 42° and 18° before 180° (namely at 138° and 162°, respectively) and also provides their momentary closure during negative half waves at electrical degrees 42° and 18° before 360° (namely at 318° and 342°, respectively). Thus, only two microswitches are used instead of four reed-switch assemblies 320-2, 320-4 and 320-1 and 320-3 which are used in the first control unit 10. These micro switches 345A and 346A provide a sequence of exponential discharges of a capacitive test "LOAD" (FIG. 18B) through resistive discharge paths 276, 285 and 300 (FIG. 18B) providing progressively-reduced Time Constants.

Momentary closure by protruding screwhead element 407 of microswitches 345A and 346A (FIG. 18A) energizes self-holding relay circuits 345A-1 and 346A-1 respectively, for closing their relay contacts 345A-2 and 346A-2. Consequently, the solenoid windings 317 and 318 (FIG. 18B) of resistive-discharge-control relays 288 and 302 remain energized, respectively, for electrical degrees 42° and 18° for lifting their respective armatures 351 and 354 for keeping engaged for 42° and 18° their respective pairs of resistive-discharge-control contacts 352, 286 and 355, 301, thereby providing a sequence of exponential discharges with progressively-reduced Time Constants as shown in FIG. 12 by sequential curves 283, 289 and 305.

To de-energize self-holding relay circuits 345A-1 and 345A-2 (FIG. 18A) at electrical zero degrees, there is a ZERO START micro switch Z.S. S1 (FIG. 15), whose arm momentarily is moved at zero position of POWERSTAT 180A from contact 421 (FIG. 18A) to a contact 422 connected to ground through zero-start relay winding 199. After momentary closure with contact 422, the arm of switch Z.S. S1 shifts back to contact 421 thereby again enabling energization of micro switches 345A and 346A at 42° and 18° during the next half wave output, as cam disc 410 continues rotating in the same direction. Also, zero start relay 199, K1/1, is bi-stable; so its two contact pairs 199A, K1A (FIG. 18A) alternately are closed at 0° (electrical) for providing polarity reversal of each successive half wave output.

The control unit 10A also can be arranged for use with 50 Hz AC input. In order to adapt this unit 10A for 220 V, 50 Hz, the POWERSTAT variable transformer which is shown as a TYPE 21 is replaced by a POWERSTAT TYPE 22 variable transformer. Also, the motor 60A is replaced by a similar 50 Hz synchronous motor providing 6 RPM of its output shaft 62A (FIG. 17).

Figures 1, 18B:
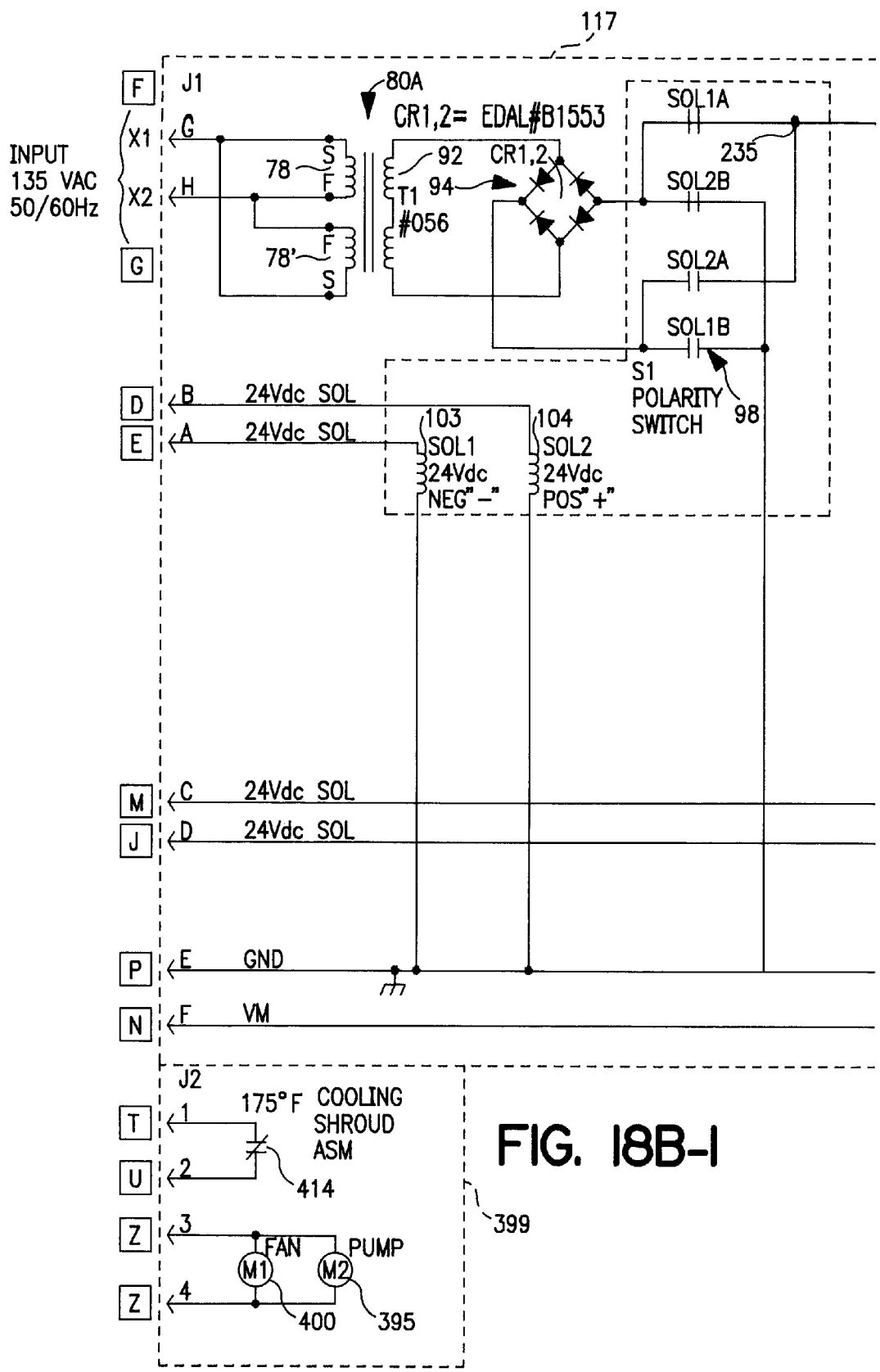
FIG. 18B shows a diagram of circuits in a VLF HV output unit 100A shown in FIGS. 19 and 20. This unit 100A is controlled, for example, by a control unit having a circuit as is shown in FIG. 18A, and it can be energized with either 50 Hz or 60 Hz AC.
Figures 2, 18B:
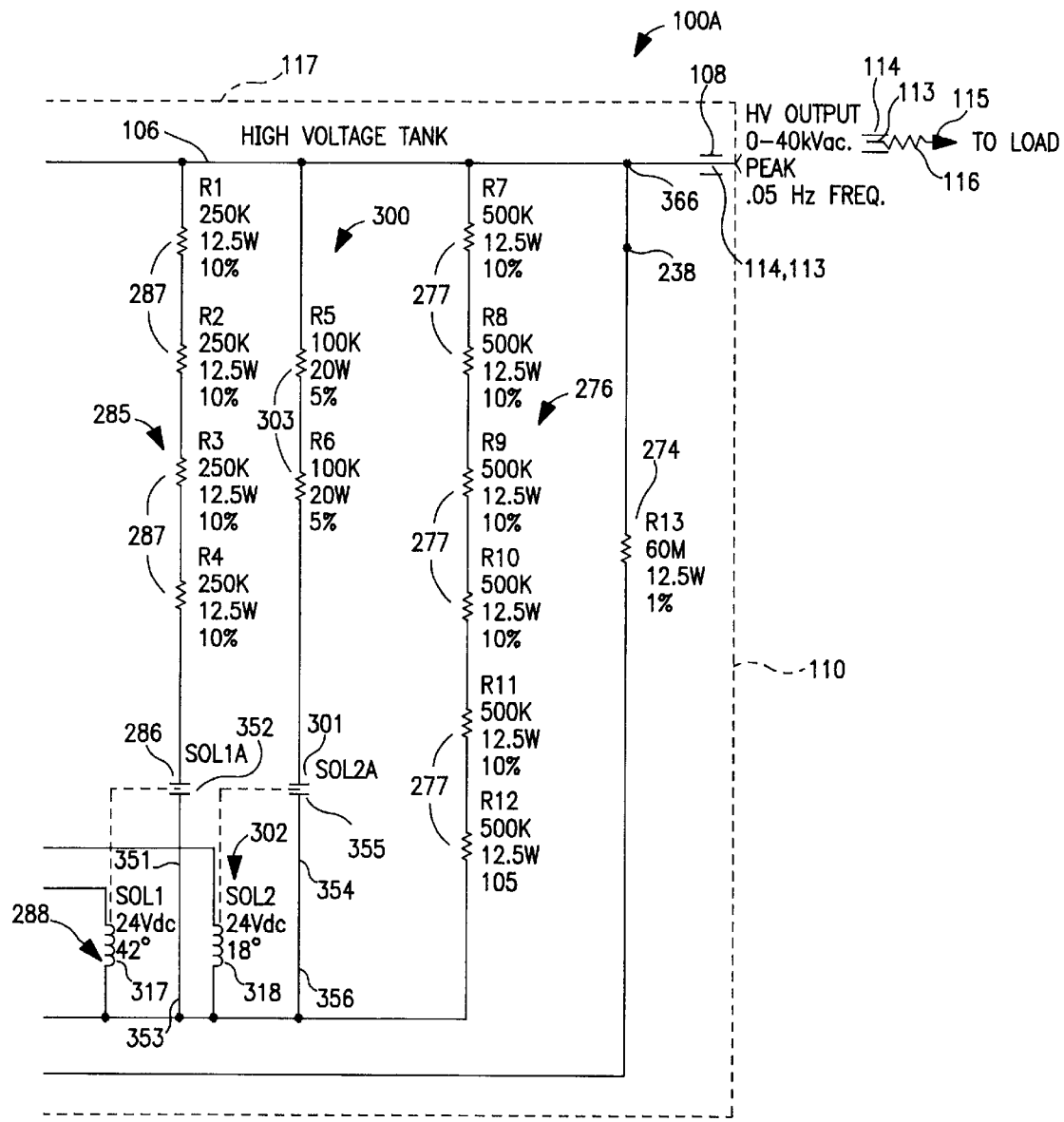

Inviting attention to FIG. 18B, the second output unit 100A is similar to unit 100 (FIG. 5B), except that there is a thermal shut-off switch 414 which is responsive to transformer oil temperature. Also the step-up transformer 80A has two primary windings 78 and 78' for enabling selective use of this output unit 100A with either 220 V, 50 Hz or 115 V, 60 Hz AC.

Figure 19:
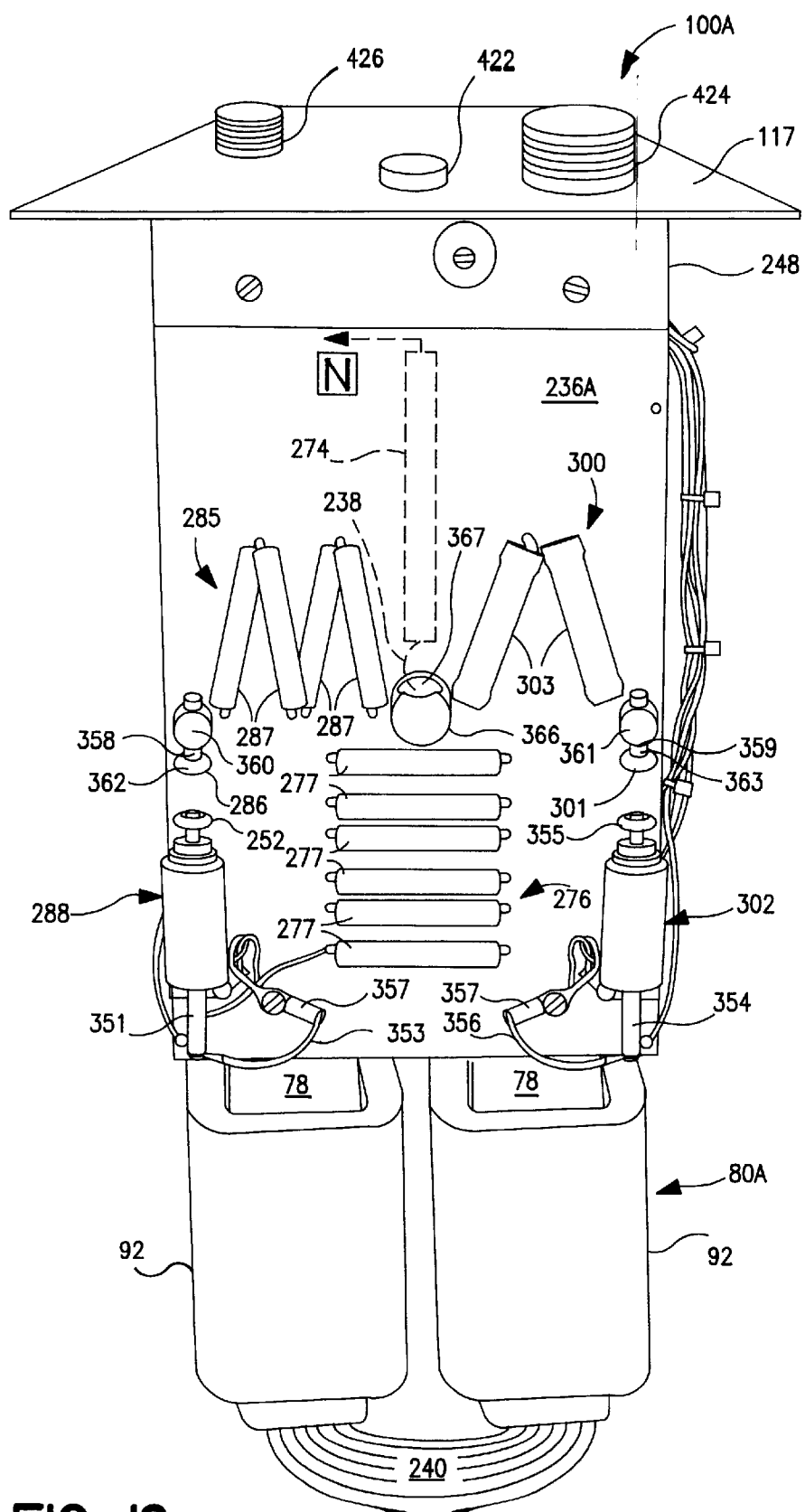
FIGS. 19 and 20 are elevational views of opposite sides of a modified VLF HV unit 100A embodying the invention. This unit 100A is shown removed from its oil-filled tank. It is rated for providing up to 40 kV VLF HV sinusoidal test waves to HV capacitive loads.
Figure 20:
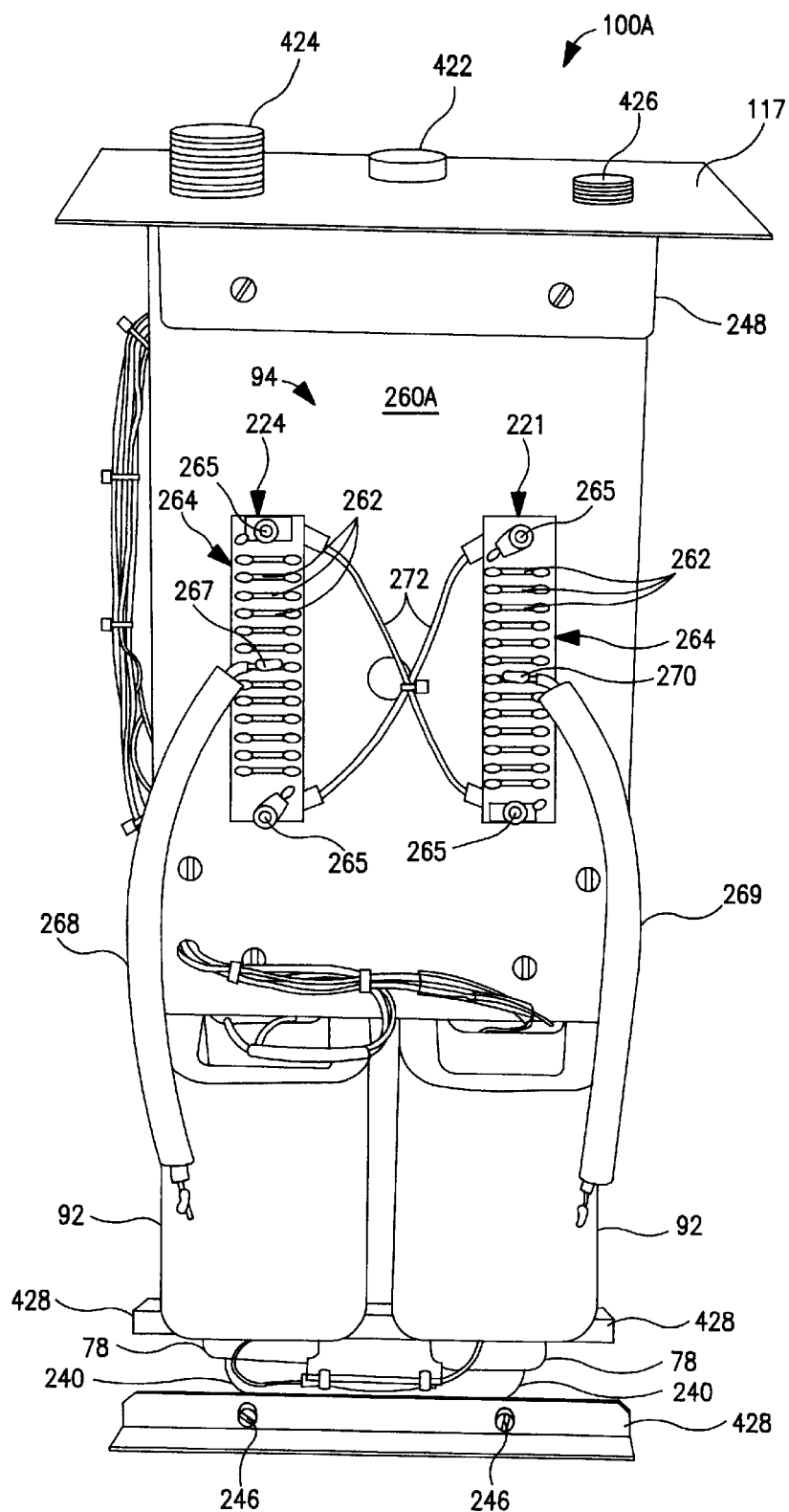

In FIGS. 19 and 20 are shown elevational views of the High Voltage output unit 100A lifted out of its oil-filled tank 110 (FIG. 18B). Insulative panel 236A in FIG. 19 is attached to the tank cover 117 by a bracket 248. This panel 236A is a printed circuit board whose rear surface (not shown) contains printed circuit connections for the following purposes as will be understood from FIG. 18B. These purposes are:

(i) Connecting six resistors 277 in series between HV output stud 366 and ground connection P (FIG. 18B) for providing resistive discharge path 276.

(ii) Connecting four resistors 287 in series for providing resistive discharge path 285 in circuit between HV output stud 366 and a conductive stud 360 that supports vertically movable conductive contact rod 358, which is biased downwardly by spring 362 and carries contact 286.

(iii) Connecting two resistors 303 in series for providing resistive discharge path 300 in circuit between HV output stud 366 and a conductive stud 361 that supports vertically movable conductive contact rod 359, which is biased downwardly by spring 363 and carries contact 301.

(iv) Connecting to ground circuit P (FIG. 18B) terminals 357 for two very flexible braided conductors 353 and 356 which are connected to lower ends of armature rods 351 and 354, respectively.

A meter-feed resistor 274 is shown in dashed outline positioned behind the panel 236A. This resistor 274 has an end connection 238 to the HV output stud 366 with another end connection to circuit lead N (FIG. 18B).

The HV output stud 366 has a socket 367 for receiving a lower end of a well bushing (not shown) similar to the well bushing 108 shown in FIG. 7. An upper end of this well bushing is received in sealed relationship into an outlet 422 in the cover 117 for the tank 110 (FIG. 18B) similar to the well bushing arrangement shown in FIG. 7.

There is an insulated HV cable 114 (FIG. 18B) which extends from the well bushing outlet 422 (FIG. 19) for about 25 feet to a wire-wound resistor 116 having a terminal 115 for connection to a test "LOAD".

Also, in the cover 117 (FIG. 19) is a terminal socket 424 containing eight circuit connectors F, G, D, E, M, J, P and N and another terminal socket 426 containing four circuit connectors T, U, Z and Z.

A pair of non-magnetic base brackets 428 (FIG. 20), for example formed of aluminum (not shown in FIG. 19) straddle and are clamped to the core 240 of the HV step-up transformer 80A by attachments 246 similar to the rods 246 (FIG. 6). These brackets 428 (FIG. 20) are omitted from FIG. 19 for clarity of illustration. They are arranged for seating down against the bottom of tank 110 (FIG. 18B) for stabilizing positioning of the transformer 80A in the tank.

Inviting attention to the elevational view FIG. 20, this view shows the opposite side of the HV unit 10A from that shown in FIG. 19. An HV bridge rectifier 94 similar to the rectifier 94 shown in FIGS. 6 and 6A is mounted on an insulative panel 260A attached by a bracket 248 to the tank cover 117.

The HV secondary winding 92 of step-up transformer 80A is connected by thickly insulated leads 268 and 269 to opposite input terminals 267 and 270 of the HV bridge rectifier 94. Output terminals 221 and 224 of this bridge rectifier are connected to an HV polarity-reversal switch 98 (FIG. 18B). Components of this "POLARITY SWITCH" 98 are similar to those shown in the corresponding polarity-reversal switch 98 in FIG. 8. In FIGS. 19 and 20, the components of the polarity-reversal switch are mounted in the HV unit 100A between the panels 236A and 260A. As is shown in FIG. 18B, the VLF HV output test waves 107 from the polarity reversal switch located between the panels 236A and 260A is connected to the output stud 366 in FIG. 19. As explained above, this stud 366 has a socket 367 into which is seated a lower end of a well bushing 108 (FIG. 18B) similar to the well bushing 108 shown in FIG. 7 out through which extends output cable 114.

Figure 21:
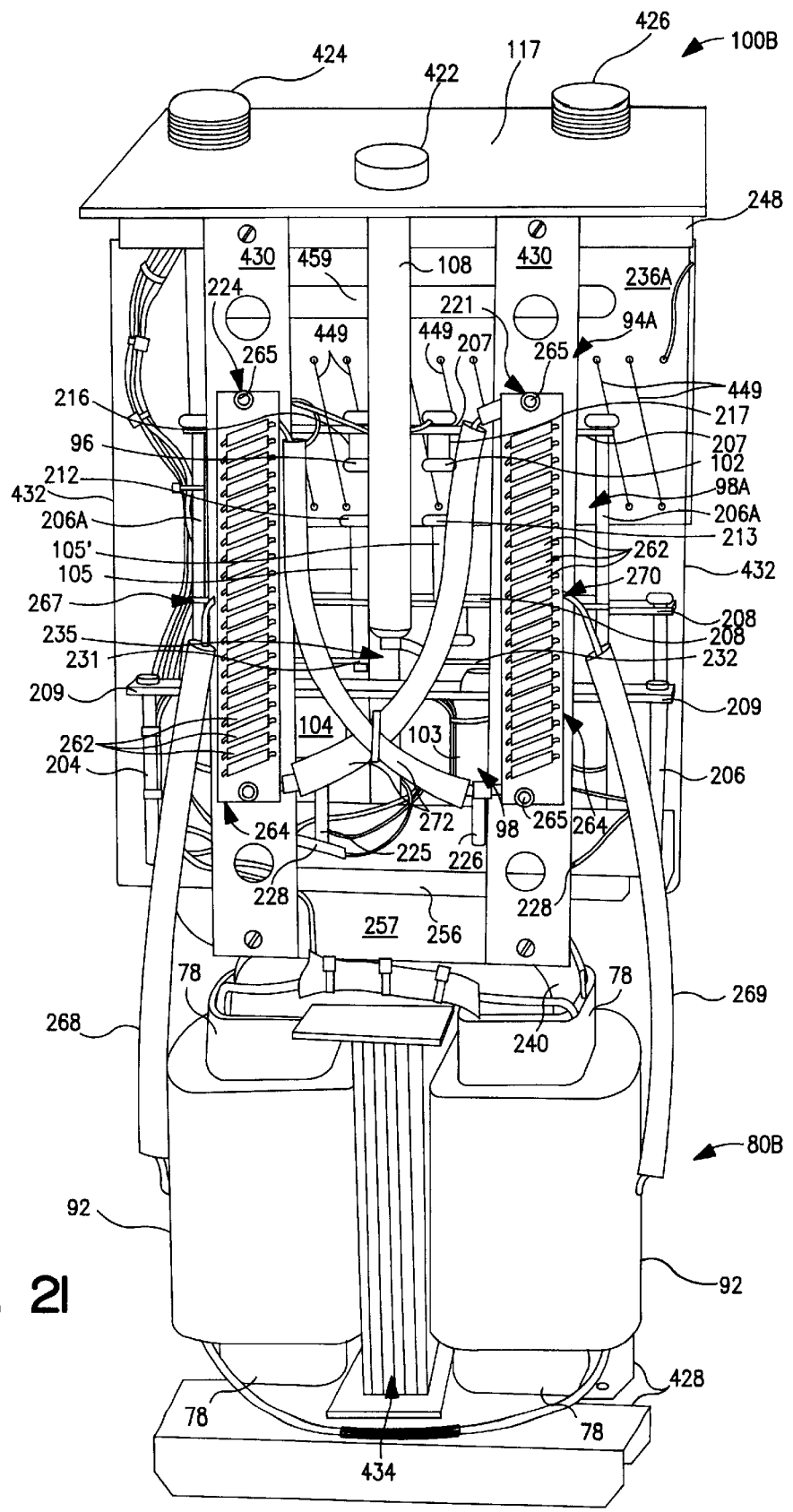
FIGS. 21 and 22 are elevational views of opposite sides of another VLF HV unit 100B embodying the invention shown removed from its oil-filled tank. This unit 100B is rated for providing up to 60 kV VLF HV sinusoidal test waves to HV capacitive load, and it can be energized with either 50 Hz or 60 Hz AC input.
Figure 22:
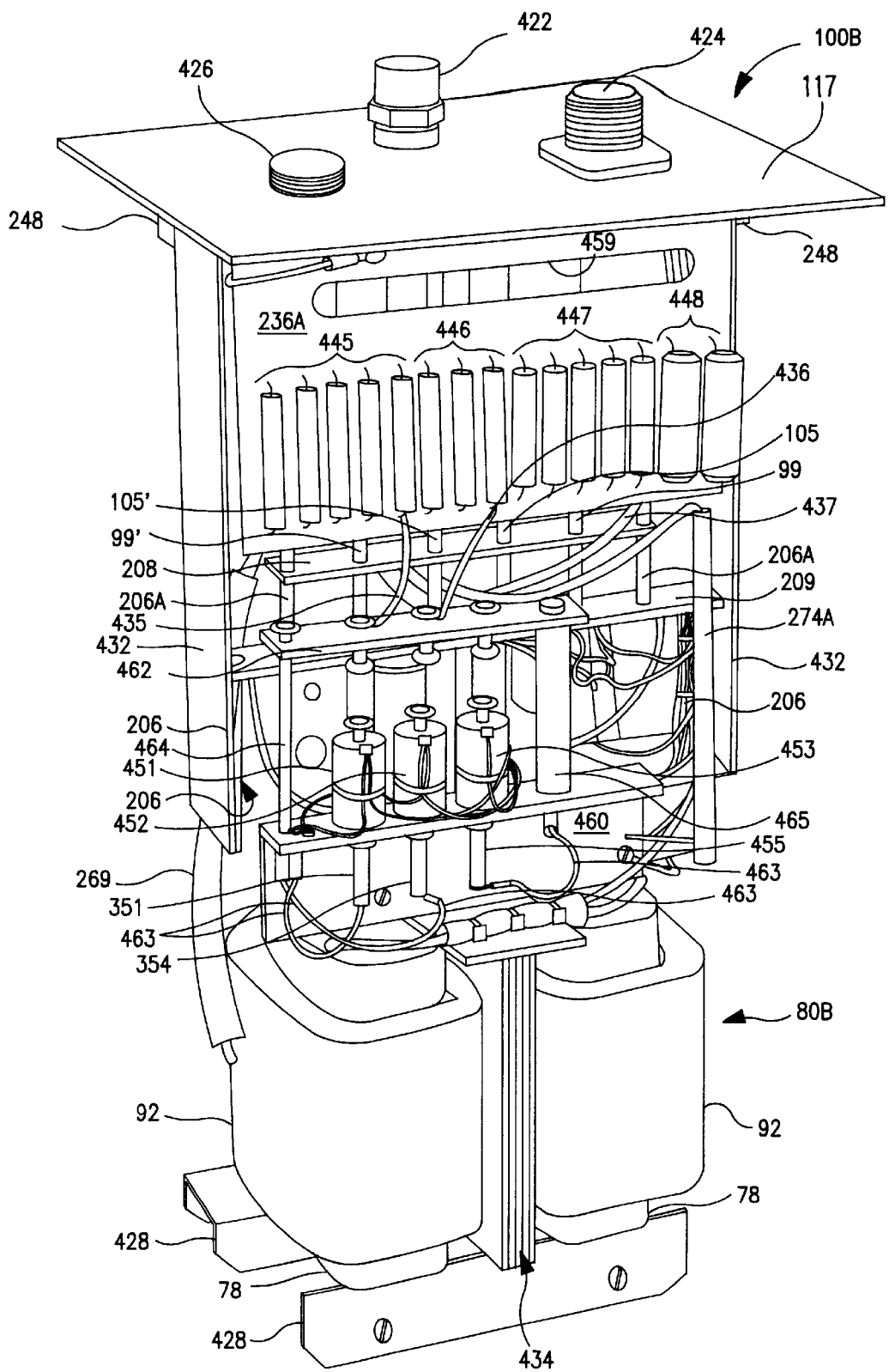

FIGS. 21 and 22 show elevational views of opposite sides of a third output unit 100B lifted out of its oil-filled tank. This unit 100B is rated for output voltages up to 60 kiloVolts. To support a High Voltage bridge rectifier 94A, there are two stiff, vertical, spaced, parallel, insulative strips 430 (FIG. 21) attached to the tank cover 117 by a bracket 248. Lower ends of these strips 430 are attached to a downturned flange 257 of a conductive channel deck 256, for example made of aluminum. Onto these two strips are mounted two insulative rectifier-carrying strips 264 on which are arranged respective rows of multiple diode rectifiers 262 interconnected in a bridge configuration for forming the HV bridge rectifier 94A. To connect each row of diode rectifiers 262 in series, each strip 264 has multiple parallel horizontal printed-circuit connectors (not shown) on its rear surface. Terminals of respective diode rectifiers 262 are soldered to ends of these printed-circuit connectors.

This HV bridge rectifier apparatus 94A is similar to those shown at 94 in FIGS. 6A and 20, except that this rectifier is rated for 60 kV, and each of its two rectifier strips 264 contains 22 individual diode rectifiers, making a total of 44; whereas, the rectifier strips 264 in FIGS. 6A and 20 contain respectively 14 and 12 individual diode rectifiers, making totals of 28 and 24, respectively.

A High Voltage step-up transformer 80B suitable for connection to an electrical input of 135 or 270 volts AC at 50 Hz or 60 Hz is mounted below the channel deck 256, being supported by two base brackets 428. A plurality of layers of non-magnetic insulative material form an insulating divider 434 extending through the winding window (not shown) of the transformer core 240 between the two halves of HV secondary winding 92. Thickly insulated output leads 268 and 269 extend from the secondary winding 92 to input terminals 267 and 270, respectively, of the HV bridge rectifier 94A.

To help support and to ground the conductive channel deck 256, there are a pair of vertical parallel conductive support strips 432, for example formed of aluminum, attached to suitable brackets (not shown) fastened underneath opposite ends of the tank cover 117. Lower ends of these support strips 432 are mechanically and electrically secured to opposite ends of the channel deck 256.

With reference to FIGS. 6 and 8, the supporting structure for the High Voltage polarity-reversing relay 98 is shown including upper, intermediate and lower parallel horizontal bars 207, 208 and 209. The upper and intermediate bars are insulative; the lower bar 209 is conductive. Similarly, the supporting structure for HV polarity-reversing relay 98A (FIG. 21) includes generally similar upper, intermediate and lower parallel horizontal bars 207, 208 and 209.

The lower bar 209 (FIG. 21) supports two solenoid windings 104 and 103 which are attached in suspended relationship beneath this lower bar. This lower bar is conductive and is mounted on upper ends of a pair of conductive vertical struts 204 and 206 whose lower ends are mounted on and grounded to opposite ends of grounded conductive deck 256.

Armature rods 225 and 226 in polarity-reversing relay 98A are vertically slidable within solenoid windings 104 and 103, respectively, and their lower ends are electrically connected by very flexible braided conductors 228 to grounded support bar 209. Construction of this relay 98A (FIG. 21) is generally similar to that as shown in FIG. 8, except that the solenoid windings 104 and 103 are suspended below their support bar 209. Also, for handling higher voltages, vertically-movable elongated members 105, 105' (FIG. 21) and 99, 99' (FIG. 22) are considerably longer than corresponding vertically-movable members shown in FIG. 8.

Mounted on upper ends of armature rods 225 and 226 are vertically-movable horizontal conductive brackets 231 and 232, respectively. Lower ends of vertically-movable elongated members 99, 105 and 105', 99' are mounted on and are lifted by these respective brackets when respective solenoid windings 104 and 103 are energized. For guiding up and down movement of elongated vertical members 99, 105 and 105', 99', they extend through respective guide holes (not shown) in intermediate horizontal insulative guide bar 208 (FIG. 21). This intermediate bar 208 is supported at its ends by a pair of conductive vertical struts 206A whose lower ends are secured in grounded relation to lower conductive bar 209.

With reference again to FIG. 8, the vertically-movable members 105 and 105' are insulators, while the other two members 99 and 99' are conductive and are grounded through armature rods 225, 226 as previously explained. Similarly, in this polarity-reversing relay 98A (FIGS. 21 and 22) the vertically-movable members 105, 105' are insulators, and members 99, 99' are conductive and grounded. Upper ends of the four vertically-movable members 105, 99 and 105', 99' in relay 98A carry four respective toroidal contacts. Only two of these contacts 212 and 213 are seen in FIG. 21. These four toroidal contacts correspond respectively to four toroidal contacts 212, 211 and 213, 214 in relay 98 shown in FIG. 8.

In opposed relation to these four toroidal contacts are four respective upper toroidal contacts carried by lower ends of four vertically-movable, spring-biased conductive contact rods. Only two upper toroidal contacts 96 and 102 and their respective movable spring-biased rods 216 and 217 are seen in FIG. 21. The four upper toroidal contacts and their spring-biased rods correspond to four upper toroidal contacts 96, 95 and 102, 101 and their spring-biased contact rods 216, 215 and 217, 218 in the relay 98.

The four contact rods in relay 98A (FIGS. 21 and 22) are vertically-slidable in guide holes in upper horizontal insulative bar 207. Upper bar 207 is mounted onto upper ends of two vertical struts 206A. The four contact rods in relay 98A are connected in circuit the same as corresponding contact rods in relay 98. In other words, contact rods 216 and 217 (FIG. 21) in relay 98A are both connected to output terminal 224' of bridge rectifier 94A. The other two contact rods (not shown in FIG. 21) in relay 98A are connected to output terminal 221 of bridge rectifier 94A.

Toroidal contacts 212 and 213 (FIG. 21) carried by vertically-movable insulator members 105 and 105' are both connected by very flexible leads (not shown) to a common terminal 235 (FIG. 21) at the lower end of well bushing 108. This common terminal connects to the conductor 113 (FIG. 23B) of an insulated High Voltage output cable 114 which extends up through well bushing 108 and out through outlet 422 in the tank cover 117.

Figures 2, 23A:
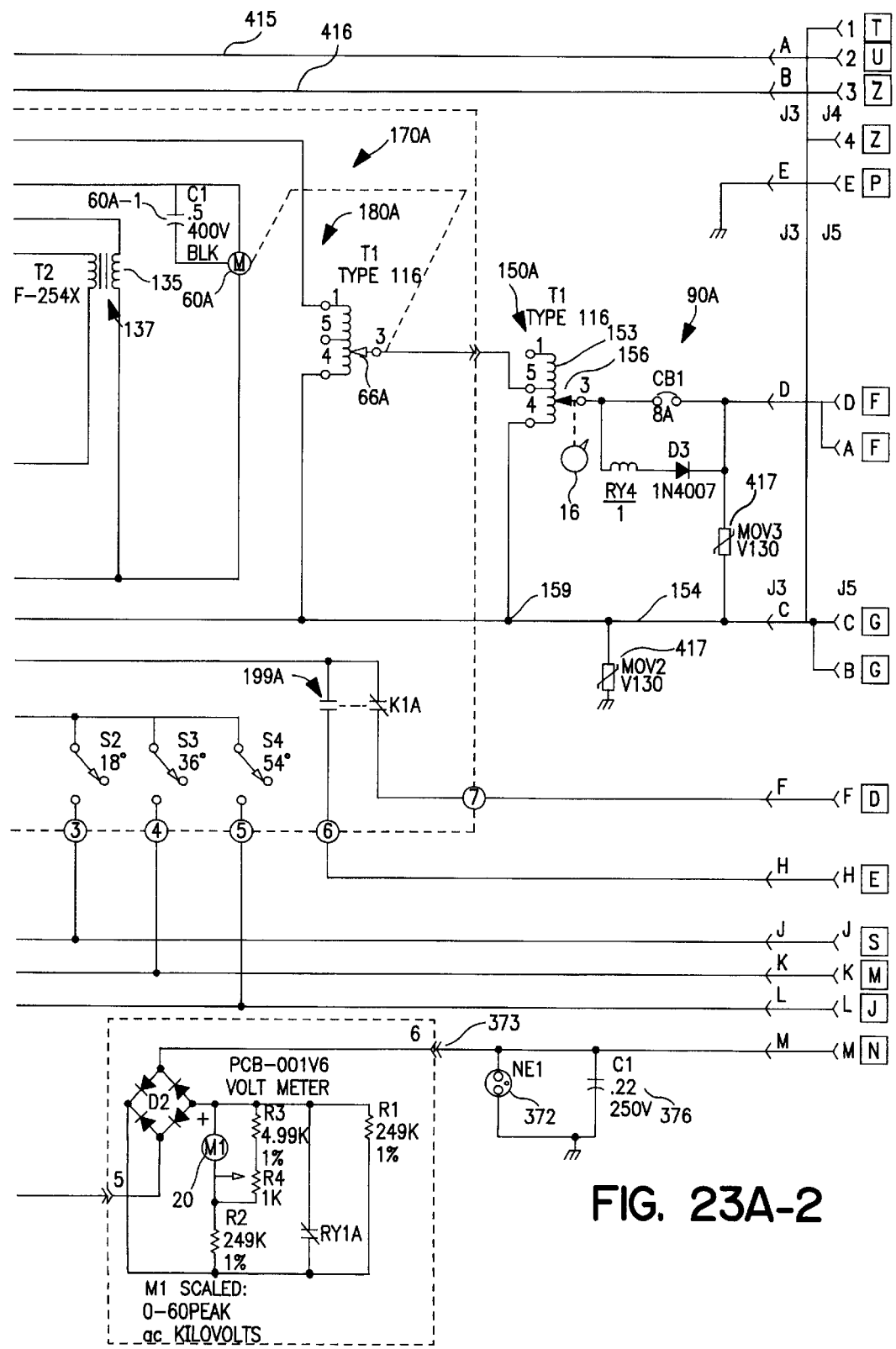
FIG. 23A is a circuit diagram of a control unit (not shown) embodying the invention and suited for use with the VLF HV output unit shown in FIGS. 21 and 22. The output unit shown in FIGS. 21 and 22 may, for example, have a circuit as is shown in FIG. 23B.
Figures 1, 23B:
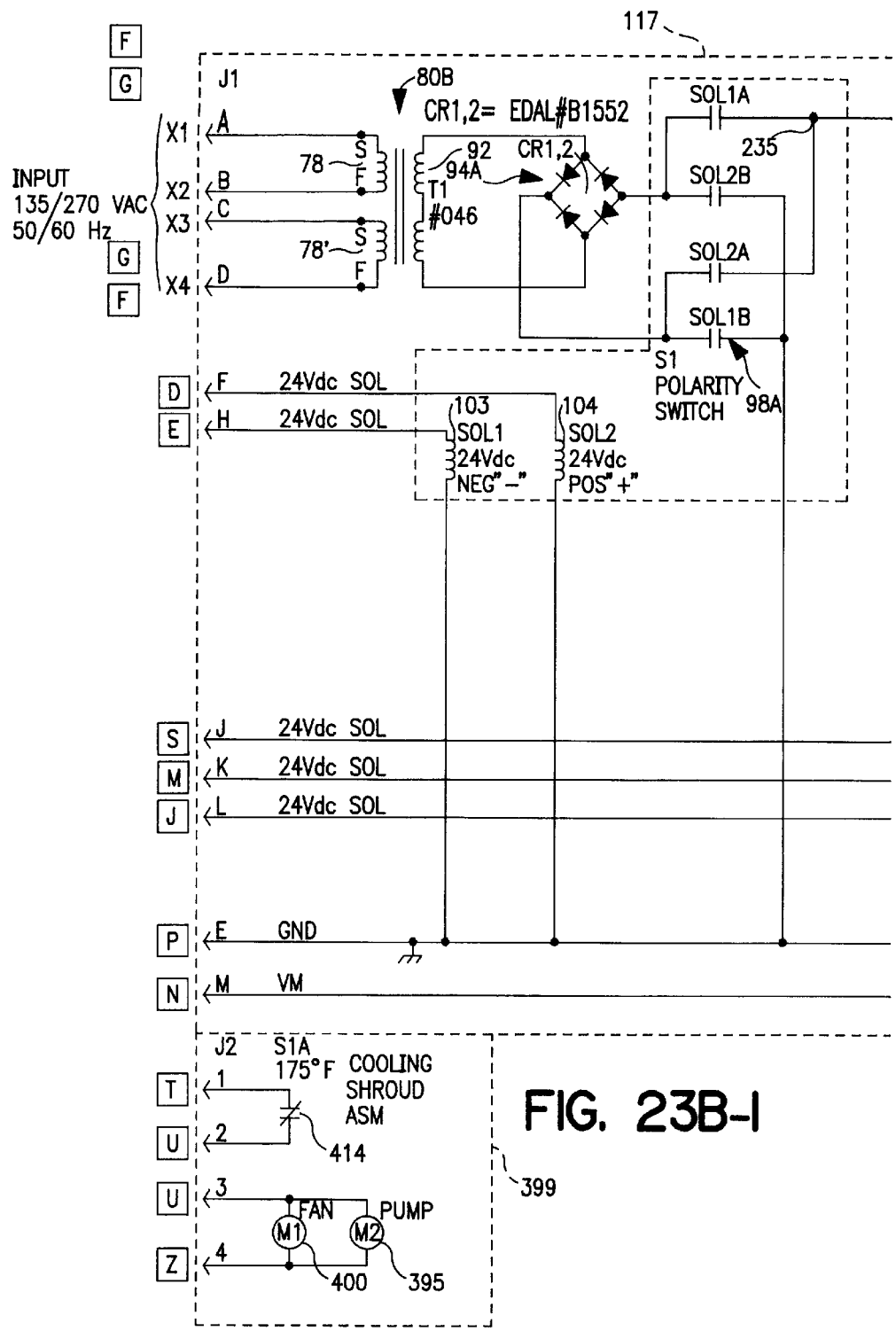
FIG. 23B shows a circuit diagram of the VLF HV output unit 100B seen in FIGS. 21 and 22.
Figures 2, 23B:
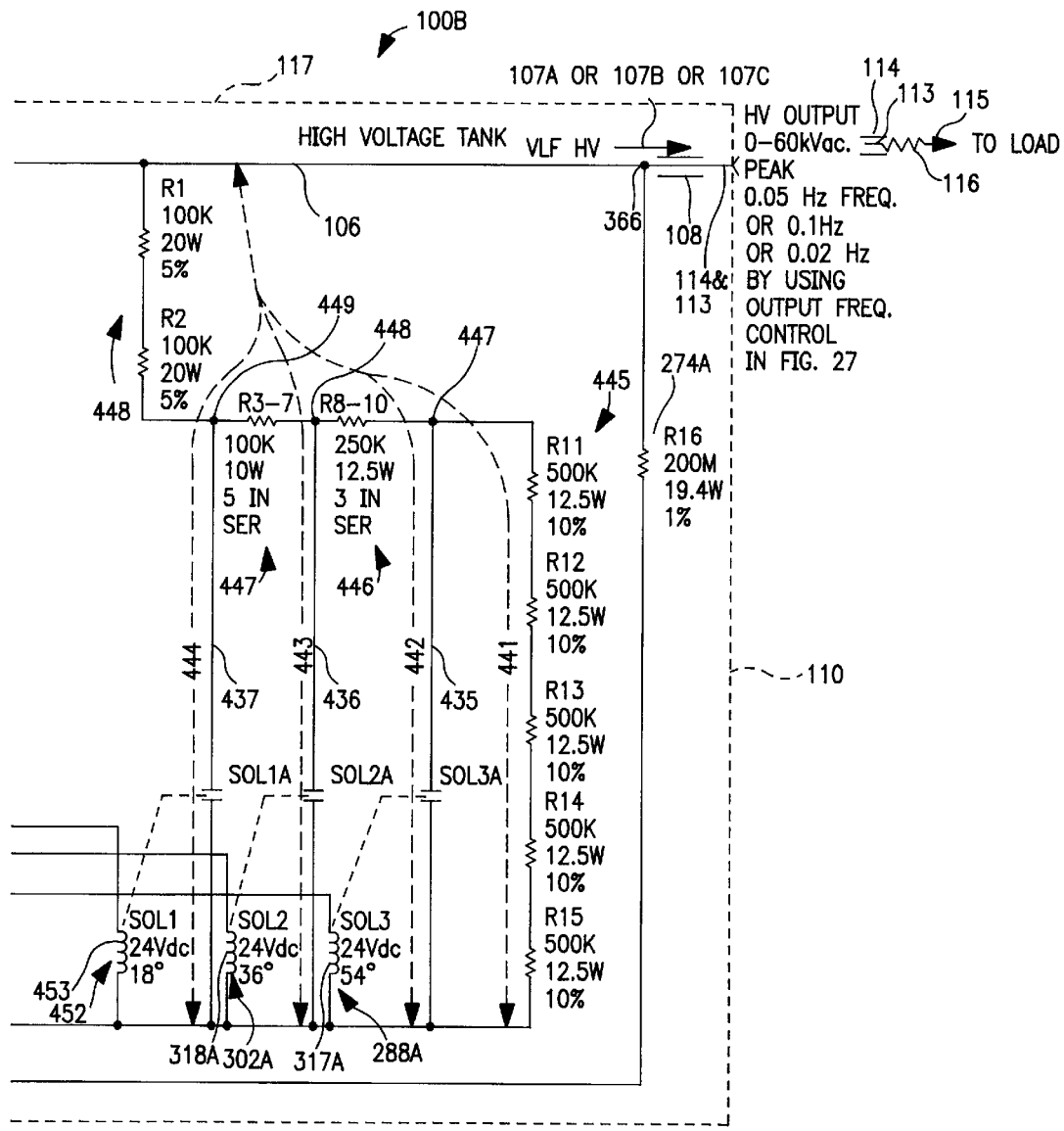

Turning attention to FIGS. 22 and 23B, this output unit 100B provides four sequential resistive discharge paths 441, 442, 443 and 444 of progressively-reduced Time Constants for discharging the capacitive test "LOAD" (FIG. 23B). This third HV output unit 100B operates differently from the first two HV units 100 and 100A in the manner in which the first, second, third and fourth sequential resistive discharge paths are brought into action, as now will be explained.

In the first two HV units 100 and 100A (FIGS. 5B and 18B), the first resistive discharge path 276 itself is directly permanently connected between the HV output line 106 and ground circuit P. The second and third resistive discharge paths 285 and 300 are brought into action by sequentially switching each of them into parallel relationship with the first resistive path 276. The second and third paths 285 and 300 are switched into direct connection between HV output line 106 and ground circuit P. Therefore, at instants of closure of respective solenoid-operated contacts 355, 301 and 352, 286, these contacts close while they are subject to a relatively large voltage differential, because the opposite end of each resistive path 285 and 300 is directly connected to the High Voltage output line 106. Thus, the contacts 286 and 301 are at a relatively high output voltage level at the instants of their respective closure, namely at 26,800 volts and 12,060 volts, respectively, as shown in FIG. 12 at 42° and 18°.

In other words, the second and third resistive discharge paths 285 and 300 in HV units 100 and 100A are initially not included in any discharge circuit. Then, they are individually switched into parallel relationship with resistor path 276 between HV output line 106 and grounded line P for progressively reducing overall discharge resistance.

In distinction to operation of the first and second HV units 100 and 100A, this third HV unit 100B (FIG. 23B) has four series-connected chains of resistors 445, 446, 447 and 448 which are used for providing first, second, third and fourth discharge paths 441, 442, 443 and 444. Initially all four resistor chains 445, 446, 447 and 448 are acting in series for providing a first discharge path 441 extending between HV output line 106 and ground circuit P. Then, sequentially to reduce discharge resistance, first, second and third chains of resistors 445, 446 and 447 are successively "short circuited" directly to ground, i.e., are switched into connection with grounded line P, for providing a second discharge path 442, a third discharge path 443 and a fourth discharge path 444. In this fourth discharge path 444 only resistor chain 448 remains active in circuit between HV output line 106 and ground circuit P.

In summary, all four resistor chains in HV unit 100B initially are in series circuit relationship. The first three resistor chains are progressively removed from active circuit relationship by directly "shorting" them to ground, thereby progressively reducing overall discharge resistance by progressively reducing the number of resistor chains remaining active in discharging the capacitive test LOAD, until only the fourth resistor chain 448 remains active for providing the fourth discharge path 444.

In FIG. 22, four resistor chains 445, 446, 447 and 448 are shown mounted in a row on one side of an insulative panel 236A. The resistors in these chains are all connected in series as shown in FIG. 21 wherein an upper portion of the other side of panel 236A can be seen showing a row of diagonally positioned connections 449 serving to connect in series all resistors in their respective chains 445, 446, 447 and 448 and also serving to connect these four resistor chains in series along the first discharge path 441 as shown in FIG. 23B. An elongated opening 459 in this panel 236A permits free circulation of oil in tank 110.

Three solenoids 451, 452 and 453 are shown in FIG. 22 mounted on a grounded conductive deck 460 having a downturned flange. Toroidal contacts carried by upper ends of respective armature rods 351, 354 and 455 are opposed by respective toroidal contacts mounted on lower ends of vertically-movable downwardly-spring-biased contact rods supported by insulative bar 462. Upper ends of these contacts rods carry upper toroidal contacts, and upper ends of these contact rods are connected by respective "shorting" leads 435, 436 and 437 to junction points 467, 468 and 469 between respective resistor chains 445 and 446, 446 and 447, and 447 and 448. These junctions points 467, 468 and 469 are shown in FIG. 23B for sequentially "shorting" the resistor chains to ground during positive half waves at electrical 54°, 36° and 18° before 180° (namely at 126°, 144° and 162°) and during negative half waves at 54°, 36° and 18° before 360° (namely at 306°, 324° and 342°). Such sequential "shorting" to ground is produced by microswitches S4, S3 and S2 (FIG. 23A) which are sequentially actuated by a protruding element or lug such as screwhead 407 (FIG. 16) on a revolving face cam 410 which has a "heart"-shaped groove. Lower ends of armature rods 351, 354 and 455 (FIG. 22) are connected to grounded deck 460 by very flexible braided conductors, such as shown at 463. The support bar 462 is mounted on upper ends of vertical struts 464 and 465 secured to deck 460.

The Time Constants for discharging a capacitance of 2.2 $\mu$F through resistance discharge paths shown in FIGS. 22 and 23B at 441 (3,950 kOhms), 442 (1,450 kOhms), 443 (700 kOhms) and 444 (200 kOhms) are calculated as follows:

(21) $TC\ (441)=RC=2.2\times10^{-6}\times3.95\times10^{6}=8.69$ seconds

(22) $TC\ (442)=RC=2.2\times10^{-6}\times1.45\times10^{6}=3.19$ seconds

(23) $TC\ (443)=RC=2.2\times10^{-6}\times0.7\times10^{6}=1.54$ seconds

(22) $TC\ (444)=RC=2.2\times10^{-6}\times0.2\times10^{6}=0.44$ seconds

Figure 24:
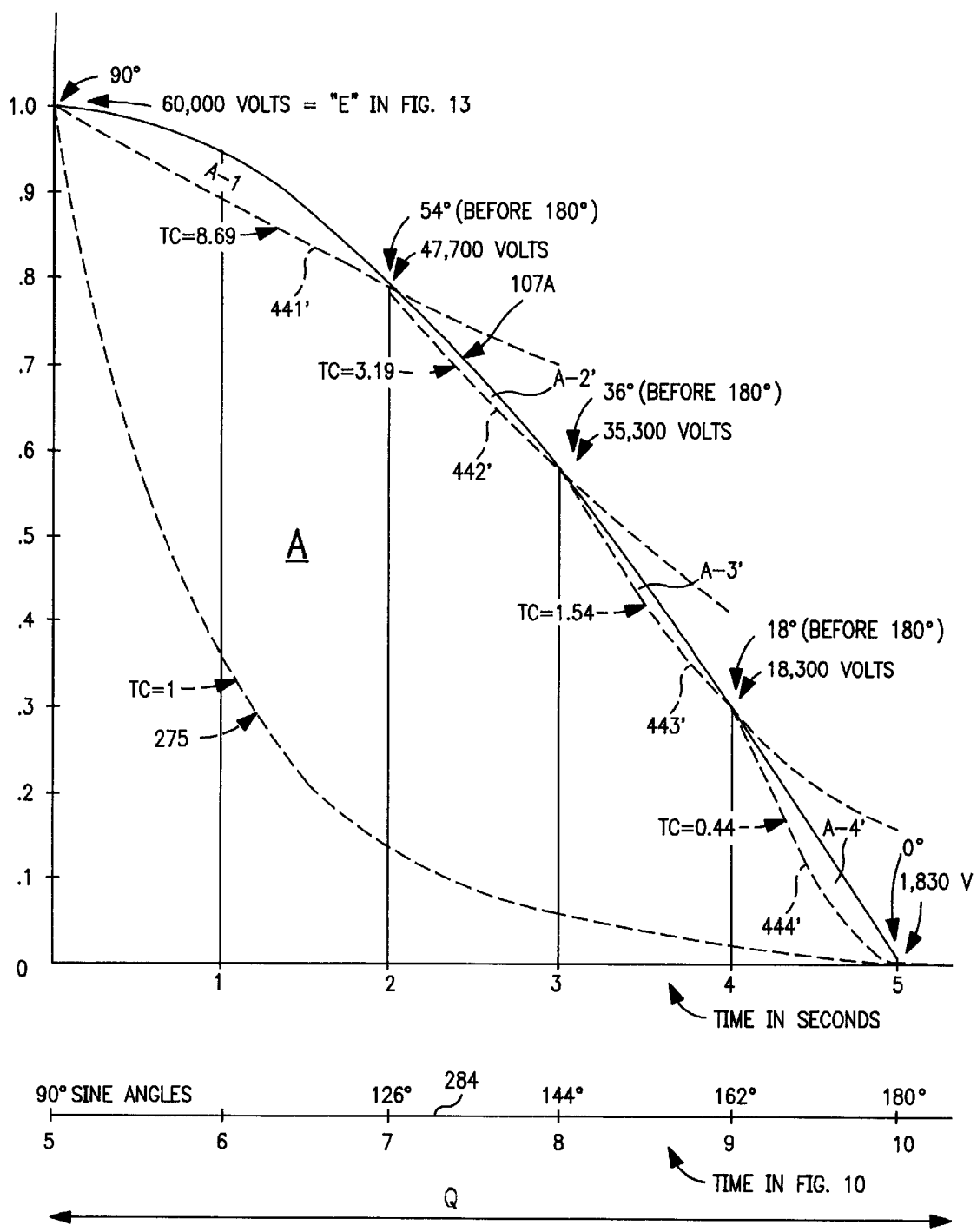
FIG. 24 is a plot similar to FIG. 12 of a VLF HV sinusoidal test wave having a peak voltage of 60,000 volts and a frequency of 0.05 Hz. This

In FIG. 24 are shown four exponential discharge voltage curves 441', 442', 443' and 444' plotted against time and against degrees of the sinusoidal curve 107A. These four exponential discharge curves are provided by sequential operation of discharge paths 441, 442, 443 and 444, respectively, (FIG. 23B) in discharging a test LOAD of 2.2 μF. These four sequential exponential discharge curves are plotted during a decreasing voltage quadrant Q, i.e., during a second half, of a positive half wave of a VLF HV sinusoidal test wave 107A. This positive half wave is shown having a peak voltage of about 60,000 VOLTS at sine angle of 90° and a frequency of 0.05 Hz. The first, second and third of these four exponential discharge curves cross the sine curve 107A at crossing points located at about 54°, 36° and 18°, before 180°, respectively, (namely at about 126°, 144° and 162°). Each such crossing point is used to determine, i.e., to preselect, a desired coordinate position point (preselected in regard to sine angle and voltage) which will become the initial point at which to initiate the next succeeding sequential exponential discharge, as is shown tabulated below in TABLE IV. The fourth exponential discharge curve 444' crosses the sine curve 107A at a crossing point located at about 0° before 180°, namely at about 180°. This TABLE IV applies to plotting of curves shown in FIG. 24.

TABLE IV

FOR FIG. 24

| Initial "E" & Time Constant (T): | Time Difference From Initial Point (Secs): | At Sine Angle: | t/T: | $\epsilon^{-t/T}$ (FIG. 13) & Resulting Voltage: |
|---|---|---|---|---|
| 60,000 V 8.69 | 2 | 54° | 0.23 | 0.795 47,700 V |
| 47 700 V 3.19 | 1 | 36° | 0.31 | 0.74 35,300 V |
| 35,300 V 1.54 | 1 | 18° | 0.65 | 0.52 18,300 V |
| 18,300 V 0.44 | 1 | 0° | 2.27 | 0.10 1,830 V |

FIG. 24 shows that four sequential discharge paths 441, 442, 443 and 444 having respective Time Constants of 8.69, 3.19, 1.54 and 0.44 serve to keep a resulting sequence of four exponential discharge curves 441', 442', 443' and 444' close to the decreasing voltage of sine curve 107A which occurs during the second half of a positive half wave. Thus, resulting "fill in" areas A-1', A-2', A-3' and A-4' which require in-feed of electrical power, are dramatically smaller than area A, which would result from use of only one resistive discharge path having a Time Constant of 1.

Similarly, for the second half of a negative half wave of the VLF HV sinusoidal test wave 107A, the same four discharge paths 441, 442, 443 and 444 are brought into action at about 90°, 54°, 36° and 18° before 360°, respectively, (namely at about 270°, 306°, 324° and 342°). These four exponential discharge paths starting at about 270°, 306°, 324° and 342° during the second half of a negative half wave having a peak voltage of about –60,000 volts at sine angle 270° keep a resulting sequence of exponential discharges close to the decreasing negative voltage of sine curve 107A which occurs during the second half of a negative half wave. Thus, four resulting "fill in" areas during the second half of a negative half wave are all small, similar to corresponding small "fill in" areas A-1', A-2', A-3' and A-4' during the second half of a positive half wave as shown in FIG. 24.

In view of the foregoing explanation provided in regard to equations (21) through (24) and TABLE IV and FIG. 24, it will be understood that FIG. 24 shows an optimum situation, wherein capacitance of the test LOAD is close to about 2.2 μF, thereby providing sequential exponential discharge Time Constants of 8.69, 3.19, 1.54 and 0.44, respectively. These four Time Constants have decreasing relative magnitudes in ratios compared to the final value 0.44 in a relationship of about 19.8 to 1, about 7.3 to 1, about 3.5 to 1, and about 1 to 1.

FIG. 25 is a plot similar to FIG. 24, except that the frequency of the VLF HV sinusoidal test wave 107B is 0.1 Hz having a full-wave period P of ten seconds which is an optimum situation for testing a capacitive LOAD of about 1.1 μF. Since this period of ten seconds is one-half of the period of twenty seconds for frequency 0.05 Hz shown in FIG. 24 for testing a LOAD having a capacitance 2.2 μF, the Time Constants shown in FIG. 25 for the five respective exponential discharge curves 275, 441', 442', 443' and 444' in FIG. 25 are one-half of the Time Constants for the five respective exponential discharge curves shown in FIG. 24, namely being 0.5, 4.35, 1.60, 0.77 and 0.22, respectively. The foregoing four Time Constants 4.35, 1.60, 0.77 and 0.22 have relative magnitudes compared to the value 0.22 in a ratio relationship of about 19.8 to 1, about 7.3 to 1, about 3.5 to 1 and about 1 to 1. In order to provide an output frequency of 0.1 Hz, the face cam 410 (FIG. 16) is driven at a rate of 12 RMP by the motor shaft 62A turning two full revolutions within a time period of ten seconds, i.e., at a rate of 12 RMP.

It will be understood that FIGS. 24 and 25 (and also FIG. 26 soon to be described) each show optimum operating conditions for the method, system and apparatus shown in FIGS. 21, 22, 23A and 23B and 27 (soon to be described) in regard to testing capacitive LOADS whose capacitances are about 2.2 μF, about 1.1 μF and about 5.5 μF, respectively, thereby providing a sequence of decreasing Time Constants having relative magnitudes compared to the value of the final Time Constant in the sequence in a ratio relationship of about 19.8 to 1, about 7.3 to 1, about 3.5 to 1 and about 1 to 1 for the exponential discharge curves 441', 442', 443' and 444' which are optimally correlated with respective sinusoidal test waves 107A (FIG. 24), 107B (FIG. 25) and 107C (FIG. 26).

Figure 27A:
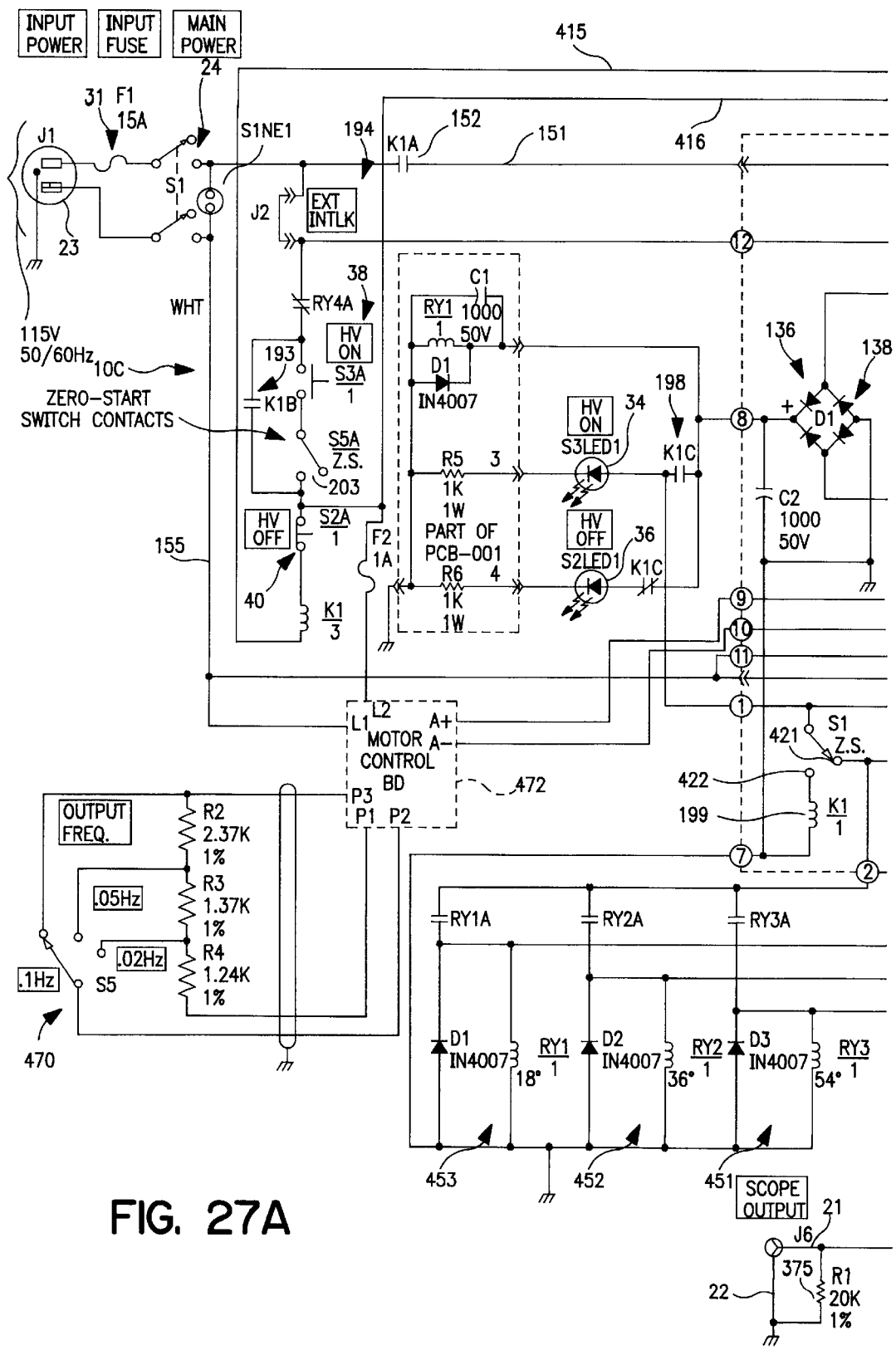
FIG. 27 is a diagram showing a circuit similar to the circuit shown in FIG. 23A, except that this circuit in FIG. 27 enables the frequency of the VLF HV sinusoidal output test wave to be selected between 0.1 Hz, 0.05 Hz and 0.02 Hz by manually setting an output frequency selector switch.
Figure 27B:
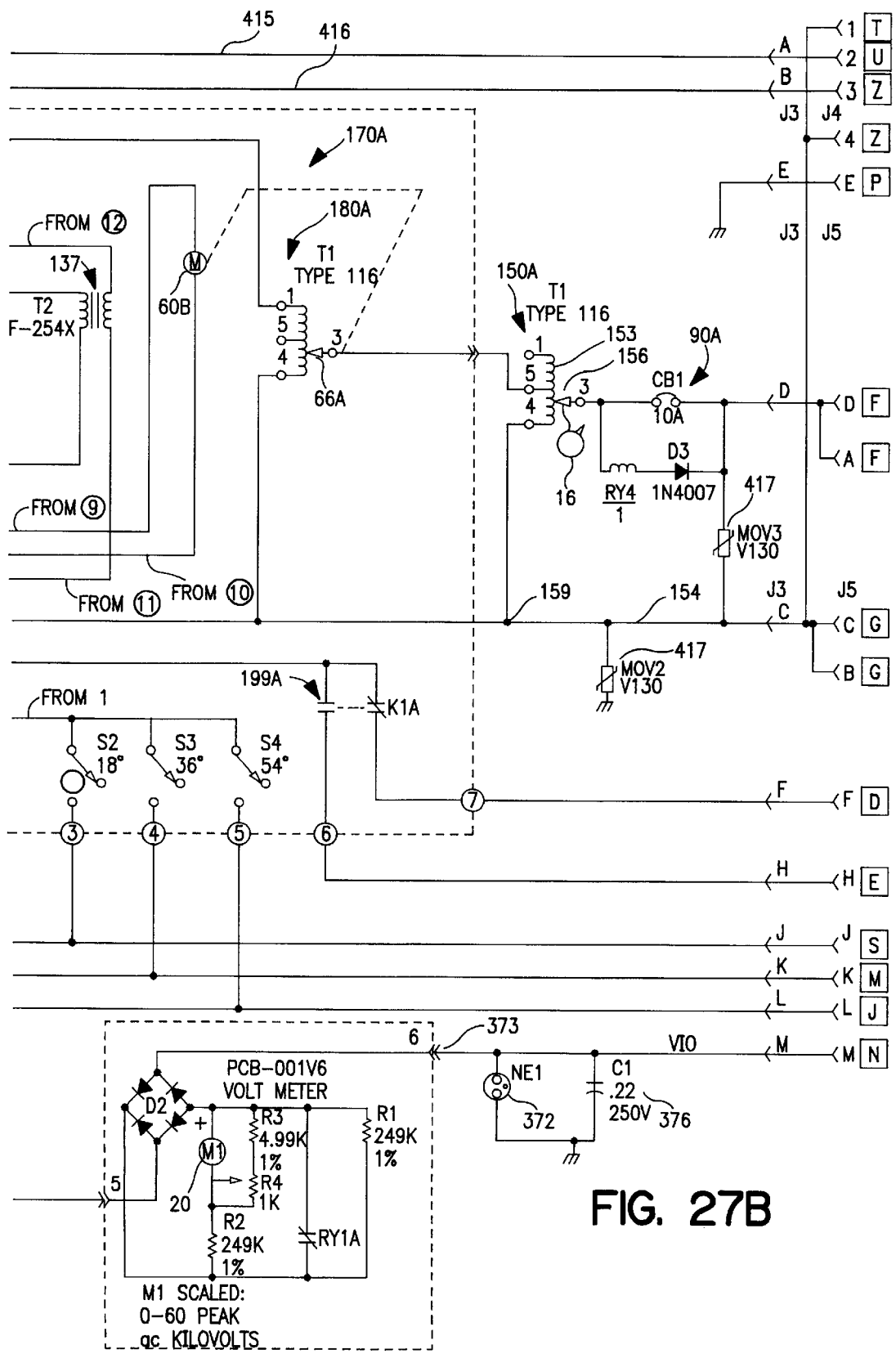

Recent experiments using an output frequency switching circuit as shown in FIG. 27 (soon to be described) have shown that suitable test voltages appear to be provided across a capacitive LOAD and a suitable amount of in-feed power is used when the output frequency is increased by a factor of five from 0.02 Hz to 0.1 Hz, while the capacitance of the LOAD is reduced from 5.5 μF only to about one-half, namely to about 2.8 μF, instead of being reduced to an optimum of one-fifth at about 1.1 μF.

FIG. 26 is a plot similar to FIGS. 24 and 25, except that the VLF HV sinusoidal test wave 107C has a frequency of 0.02 Hz which is an optimum situation for testing a capacitive LOAD of about 5.5 μF. This sinusoidal test wave 107C having frequency of 0.02 Hz has a period P of fifty seconds, which is 2.5 times longer than the period of the test wave 107A in FIG. 24. Since the capacitance of the LOAD tested in FIG. 26 under optimum operating conditions is about 5.5 μF (which is 2.5 times the capacitance of 2.2 μF of the LOAD being tested in FIG. 24), the Time Constants for the five respective exponential discharge curves 275, 441', 442', 443' and 444' in FIG. 26 are 2.5 times the values of the five respective exponential discharge curves in FIG. 24, namely being 2.5, 21.7, 8.0, 3.85 and 1.1. The foregoing four Time Constants 21.7, 8.0, 3.85 and 1.1 have relative magnitudes compared to the value of the final Time Constant in this sequence in a ratio relationship which is the same as for the curves plotted in FIGS. 24 and 25.

In order to provide an output frequency of 0.02 Hz, the face cam 410 (FIG. 16) is driven at a rate of 2.4 RPM by the motor shaft 62A turning at 2.4 RPM for providing two full revolutions of this cam within a full wave time period of 50 seconds.

FIG. 27 is a circuit diagram similar to FIG. 23A, except that this circuit 10C in FIG. 27 interconnected with the HV output circuit shown in FIG. 23B enables the frequency of the VLF HV sinusoidal output test wave to be manually selected between 0.1 Hz, 0.05 Hz and 0.02 Hz by turning an output frequency selection switch 470. The motor 60B (FIG. 27) is a selectable-speed DC motor, for example such as an adjustable-speed "DAYTON" DC Motor, Model No. 4Z535A from Dayton in Niles, Ill. 60714. A motor-speed control circuit board ("MOTOR CONTROL BD") 472 for example as shown in FIG. 27 is obtained from KB Electronics in Coral Springs, Fla. 33065, Model No. KBIC-120, which is rated for an AC working voltage of about 115 to 120 V. The motor-speed selection switch 470 is shown for providing three manually-selectable VLF HV sinusoidal test wave output frequencies: 0.1 Hz, 0.05 Hz and 0.02 Hz. These three output frequencies are obtainable from the HV output unit shown in FIG. 23B by using the control circuit of FIG. 27 to control the HV output unit of 23B. These three output frequencies are provided by motor 60B (FIG. 27) when rotating the face cam 410 (FIG. 16) at 12 RMP, 6 RPM and 2.4 RPM, respectively.

The curves plotted in FIGS. 25, 24 and 26 apply to these three output frequencies 0.1 Hz, 0.05 Hz and 0.02 Hz being used to test capacitive LOADS having capacitances of about 1.1 μF, 2.2 μF and 5.5 μF, respectively, for providing optimum operating test conditions. However, as explained above, recent experiments have shown that suitable test voltages appear to be provided across a capacitive test load and a suitable amount of in-feed power appears to be used, such that the method, system and apparatus shown in FIGS. 21, 22, 23A and 23B and FIG. 27 may be selectively operated at the three output frequencies of 0.1 Hz, 0.05 Hz and 0.02 Hz for testing of capacitive electrical LOADS having capacitances located at values within a range of about 0.5 μF to about 6 μF.

It is noted that the control circuit 10A shown in FIG. 18A can be modified for providing VLF HV sinusoidal output test waves having manually-selectable frequencies of 0.1 Hz, 0.02 Hz and 0.05 Hz by replacing the motor 60A with a motor 60B, for example such as shown in FIG. 27, and by incorporating a manually-operable frequency-selection switch 470 with a MOTOR CONTROL BD 472 together with associated circuitry, for example as shown in FIG. 27.

Although specific presently preferred embodiments of the invention have been disclosed herein in detail, it is to be understood that these examles of the invention have been described for purposes of illustration. This disclosure is not intended to be construed as limiting the scope of the invention, since the described method, systems and apparatus may be changed in detail by those skilled in the Very Low Frequency High Voltage testing art in roder to adapt embodiments of the invention for use in various VLF HV testing situations and circumstances.

What is claimed is:

1. A method for testing capacitive electrical loads using very low frequency (VLF) high voltage (HV) sinusoidal electrical waves comprising the steps of:

providing VLF HV sinusoidal electrical waves having full cycles each including a positive half wave and a negative half wave;

applying the VLF HV sinusoidal electrical waves to a capacitive electrical load; and discharging the capacitive electrical load during a second half of each positive half wave and during a second half of each negative half wave by using a sequence of at least three resistance discharge paths having progressively less resistance.

2. A method claimed in claim 1, wherein:

the second half of each positive half wave extends from 90° to 180°, and a first resistance discharge path is brought into action at a first angle located at about 90°, and second and third resistance discharge paths are brought into action respectively at second and third angles located in sequence between about 125° and about 180°;

the second half of each negative half wave extends from 270° to 360°, and the first resistance discharge path is brought into action at a fourth angle located at about 270°, and the second and third resistance discharge paths are brought into action respectively at fifth and sixth angles located in sequence between about 305° and about 360°; and the first, second and third resistance discharge paths are kept out of action between about 0° and about 90° and also are kept out of action between about 180° and about 270°.

3. A method claimed in claim 2, wherein:

the ratio of the resistance of the first resistance discharge path compared with the resistance of the third resistance discharge path is within a range from about 15 to about 22; and the ratio of the resistance of the second resistance discharge path compared with the resistance of the third resistance discharge path is within a range from about 3 to about 9.

4. A method claimed in claim 3, wherein:

the ratio of the resistance of the first resistance discharge path compared with the resistance of the third resistance discharge path is within a preferred range from about 16.5 to about 21; and the ratio of the resistance of the second resistance discharge path compared with the resistance of the third resistance discharge path is within a preferred range of about 3.6 to about 8.

5. A method claimed in claim 4, wherein:

the ratio of the resistance of the first resistance discharge path compared with the resistance of the third resistance discharge path is within a most preferred range from about 16.5 to about 20.5; and the ratio of the resistance of the second resistance discharge path compared with the resistance of the third resistance discharge path is within a most preferred range from about 3.9 to about 7.7.

6. A method claimed in claim 2, wherein:

the second resistance discharge path is brought into action at an angle located within a range from about 131° to about 145° and also is brought into action at an angle located within a range from about 311° to about 325°; and the third resistance discharge path is brought into action at an angle located within a range from about 156° to about 168° and also is brought into action at an angle located within a range from about 336° to about 348°.

7. A method claimed in claim 6, wherein:

the second resistance discharge path is brought into action at an angle located within a preferred range from about 133° to about 143° and also is brought into action at an angle located within a preferred range from about 313° to about 323°; and the third resistance discharge path is brought into action at an angle located within a preferred range from about 158° to about 166° and also is brought into action at an angle located within a preferred range from about 338° to about 346°.

8. A method claimed in claim 7, wherein:

the second resistance discharge path is brought into action at an angle located within a more preferred range from about 135° to about 141° and also is brought into action at an angle located within a more preferred range from about 315° to about 321°; and the third resistance discharge path is brought into action at an angle located within a more preferred range from about 160° to about 164° and also is brought into action at an angle located within a more preferred range from about 340° to about 344°.

9. A method claimed in claim 1, including the steps of:

discharging the capacitive electrical load during a second half of each positive half wave and during a second half of each negative half wave by using a sequence of at least four resistance discharge paths having progressively less resistance.

10. A method claimed in claim 9, wherein:

the second half of each positive half wave extends from 90° to 180°, and a first resistance discharge path is brought into action at a first angle located at about 90°, and second third and fourth resistance discharge paths are brought into action respectively at second, third and fourth angles located in sequence between about 119° and about 180°;

the second half of each negative half wave extends from 270° to 360°, and the first resistance discharge path is brought into action at a fifth angle located at about 270°, and the second, third and fourth resistance discharge paths are brought into action respectively at sixth, seventh and eighth angles located between about 299° and about 360; and the first, second, third and fourth resistance discharge paths are kept out of action between about 0° and about 90° and also are kept out of action between about 180° and about 270°.

11. A method of testing capacitive loads with very low frequency (VLF) high voltage (HV) sinusoidal electrical waves comprising the steps of:

at very low frequency sinusoidally amplitude modulating AC voltage supplied from an AC electrical supply;

stepping up to high voltage said sinusoidally amplitude-modulated AC voltage for providing a VLF HV sinusoidally amplitude-modulated AC voltage;

demodulating the VLF HV sinusoidally amplitude-modulated AC voltage for providing VLF HV sinusoidal electrical waves;

applying the VLF HV sinusoidal electrical waves to a capacitive electrical load; and during each quadrant of said VLF HV sinusoidal electrical waves having a decreasing absolute magnitude of voltage, discharging the capacitive electrical load through a preselected sequence of resistive discharge paths wherein each successive resistive discharge path in the sequence has less resistance than resistance of a preceding resistive discharge path in the sequence.

12. A method claimed in claim 11, including the steps of:

discharging the capacitive electrical load through a preselected sequence of at least three resistive discharge paths during each such quadrant, including the further steps of:

preselecting a first resistive discharge path in the sequence;

preselecting a second resistive discharge path in the sequence for having less resistance than resistance of the first resistive discharge path in the sequence; and preselecting a third resistive discharge path in the sequence for having less resistance than resistance of the second resistive discharge path in the sequence.

13. A method claimed in claim 11, including the steps of:

discharging the capacitive electrical load through a preselected sequence of four resistive discharge paths during each such quadrant; including the further steps of:

preselecting a first resistive discharge path in the sequence;

preselecting a second resistive discharge path in the sequence for having less resistance than resistance of the first resistive discharge path in the sequence;

preselecting a third resistive discharge path in the sequence for having less resistance than resistance of the second resistive discharge path in the sequence; and preselecting a fourth resistive discharge path in the sequence for having less resistance than resistance of the third resistive discharge path in the sequence.

14. A method claimed in claim 11, including the steps of:

bringing a plurality of at least three resistive discharge paths into action in a preselected sequence during each such quadrant, including the further steps of:

bringing successive first, second and third resistive discharge paths into action together with capacitance of the capacitive electrical load being discharged for providing Time Constants in the sequence;

preselecting a first resistive discharge path in the sequence for providing a first Time Constant;

preselecting a second resistive discharge path in the sequence for providing a second Time Constant in the sequence less than the first Time Constant in the sequence; and preselecting a third resistive discharge path in the sequence for providing a third Time Constant in the sequence less than the second Time Constant in the sequence.

15. A method claimed in claim 14, including the further steps of:

preselecting a first resistive discharge path in the sequence for providing a Time Constant in a range from about 15 to about 19.5 relative to a Time Constant provided by a preselected third resistive discharge path in the sequence; and preselecting a second resistive discharge path in the sequence for providing a Time Constant in a range from about 2.8 to about 6 relative to the Time Constant provided by the third preselected resistive discharge path in the sequence.

16. A system for very low frequency (VLF) high voltage (HV) testing of capacitive electrical AC equipment comprising:

AC voltage amplitude modulating apparatus for producing VLF sinusoidal amplitude-modulation of AC voltage of electric power supplied from an AC electrical power source;

an AC voltage step-up transformer connectable in circuit with the AC voltage amplitude-modulating apparatus for stepping up to HV the VLF sinusoidally amplitude-modulated AC voltage for producing VLF HV sinusoidally amplitude-modulated AC voltage;

demodulation apparatus in circuit with the AC voltage step-up transformer for demodulating the VLF HV sinusoidally amplitude-modulated AC voltage for producing VLF HV sinusoidal electrical waves;

an output circuit for connecting said demodulation apparatus to capacitive electrical AC equipment for applying said VLF HV sinusoidal electrical waves to said capacitive electrical AC equipment;

a plurality of resistive discharge paths;

a second of said plurality of resistive discharge paths having less resistance than resistance of a first of said plurality of resistive discharge paths;

first and second switches; and first and second switch actuators operatively associated with said first and second switches, respectively;

said first switch actuator actuating the first switch for connecting said first resistive discharge path to said output circuit during a second half of each half wave;

said second switch actuator acting subsequently to said first switch actuator for actuating the second switch subsequent to actuation of said first switch for connecting said second resistive discharge path to said output circuit during a second half of each half wave subsequent to connection of said first resistive discharge path to said output circuit.

17. A system claimed in claim 16, in which:

the AC voltage amplitude modulating apparatus comprises:

a transformer having multiple taps each providing a respective AC voltage level corresponding to preselected points on a preselected very low frequency (VLF) high voltage (HV) sinusoidal electrical test wave;

the taps being connected to respective electrical contacts arranged in a predetermined array; and an electrical drive motor for moving an electrical brush into electrical engagement with successive contacts in the array in make-before-break engagement with successive contacts of the array for providing half wave sinusoidal modulation of the AC voltage.

18. A system claimed in claim 17, in which said AC voltage amplitude modulating apparatus includes:

a reversible electrical drive motor;

motor-rotation-direction-reversal mechanism for reversing direction of motor rotation after the electrical brush has completed moving in a first direction for moving the electrical brush in an opposite direction into electrical engagement with successive contacts in the array in make-before-break engagement with successive contacts of the array and for reversing direction of motor rotation after the electrical brush has completed moving in said opposite direction for again moving the brush in said first direction, and so forth for providing half wave sinusoidal modulation of the AC voltage.

19. A system claimed in claim 16, comprising:

a step-up transformer in circuit with said AC voltage amplitude modulation apparatus for providing VLF HV sinusoidal half waves of AC voltage;

rectifier apparatus in circuit with said step-up transformer for rectifying said VLF HV sinusoidal half waves of AC voltage for providing VLF HV sinusoidal electrical half waves; and polarity reversal apparatus in circuit between said rectifier apparatus and said output circuit for feeding VLF HV sinusoidal electrical waves to said output circuit.

20. A system claimed in claim 16, in which:

the AC voltage amplitude modulating apparatus comprises:

a variable-voltage autotransformer;

said variable-voltage autotransformer having a toroidal winding and an electrical brush movable into circuit relationship with respective turns of the toroidal winding;

a heart-shaped cam;

an electric drive for revolving said heart-shaped cam;

a cam follower in engagement with said heart-shaped cam;

said cam follower being moved cyclically back and forth in response to revolving of said heart-shaped cam; and reversible drive mechanism in driving relation with said electrical brush and responsive to cyclical back and forth movement of said cam follower for moving the brush cyclically back and forth in alternate directions into circuit relationship with respective turns of the toroidal winding for providing a half wave sinusoidal modulation of the AC voltage provided by said brush.

21. A system claimed in claim 20, comprising:

a step-up transformer in circuit with said AC voltage amplitude modulation apparatus for providing VLF HV sinusoidal half waves of AC voltage;

rectifier apparatus in circuit with said step-up transformer for rectifying said VLF HV sinusoidal half waves of AC voltage for providing VLF HV sinusoidal electrical half waves; and polarity reversal apparatus in circuit between said rectifier apparatus and said output circuit for feeding VLF HV sinusoidal electrical waves to said output circuit.

22. A system claimed in claim 16, in which:

said switch closers are solenoid-driven armature rods spring-biased downwardly so their respective switches are closed by electrical energization of their solenoids for lifting the armature rods.

23. Apparatus for very low frequency (VLF) high voltage (HV) testing of capacitive AC electrical equipment comprising:

an output line adapted for connection to capacitive AC electrical equipment to be tested;

a step-up transformer suitable for stepping up voltage of VLF half waves of sinusoidally modulated AC electrical power to VLF HV sinusoidally modulated AC voltage;

rectifier apparatus in circuit with the step-up transformer for rectifying VLF HV sinusoidally amplitude modulated AC voltage fed from said step-up transformer to said rectifier apparatus for obtaining VLF HV sinusoidal half waves;

polarity reversal switching apparatus connected in circuit between said rectifier apparatus and said output line for providing positive and negative half waves in alternate succession of VLF HV sinusoidal electrical waves for said output line;

at least first and second resistive discharge paths;

said second resistive discharge path having less resistance than said first resistive discharge path;

first and second selectively operable switches in circuit with said first and second resistive discharge paths, respectively;

said first switch being operable for bringing said first resistive discharge path into resistive discharge relation with said output line during a second half of each positive half wave and also during a second half of each negative half wave for discharging voltage from capacitive AC electrical equipment;

said first switch also being operable for removing said first resistive discharge path from resistive discharge relation with said output line during a first half of each positive half wave and also during a first half of each negative half wave;

said second switch being operable subsequent to said first switch during the second half of each positive half wave and also during the second half of each negative half wave for bringing said second resistive discharge path into resistive discharge relation with said output line subsequent to said first resistive discharge path during the second half of each positive half wave and during the second half of each negative half wave for discharging voltage from capacitive AC electrical equipment faster than said first resistive discharge path; and said second switch also being operable for removing said second resistive discharge path from resistive discharge relation with said output line during the first half of each positive half wave and also during the first half of each negative half wave.

24. Apparatus claimed in claim 23, further comprising:

a third resistive discharge path having less resistance than said second resistive discharge path;

a third selectively operable switch in circuit with said third resistive discharge path;

said third switch being operable subsequent to said second switch during the second half of each positive half wave and also during the second half of each negative half wave for bringing said third resistive discharge path into resistive discharge relation with said output line subsequent to said second resistive discharge path for discharging voltage from capacitive AC electrical equipment faster than said second resistive discharge path; and said third switch also being operable for removing said 1third resistive discharge path from resistive discharge relation with said output line during the first half of each positive half wave and also during the first half of each negative half wave.

25. Apparatus claimed in claim 24, further comprising:

a fourth resistive discharge path having less resistance than said third resistive discharge path;

a fourth selectively operable switch in circuit with said fourth resistive discharge path;

said fourth switch being operable subsequent to said third switch during the second half of each positive half wave and also during the second half of each negative half wave for bringing said fourth resistive discharge path into resistive discharge relation with said output line subsequent to said third resistive discharge path for discharging voltage from capacitive AC electrical equipment faster than said third resistive discharge path; and said fourth switch also being operable for removing said fourth resistive discharge path from resistive discharge relation with said output line during the first half of each positive half wave and also during the first half of each negative half wave.

26. A system claimed in claim 16, in which:

said first and second switches include resiliently-mounted upper first contact and upper second contact, respectively;

said upper first contact and upper second contact are spring-biased downwardly;

the first switch closer includes a first solenoid-driven armature rod, carrying a lower first contact;

the first armature rod is driven by a first solenoid and is lifted by energizing the first solenoid;

the second switch closer includes a second solenoid-driven armature rod carrying a lower second contact;

the second armature rod is driven by a second solenoid and is lifted by energizing the second solenoid;

lifting of the lower first contact into engagement with the upper first contact raises the upper first contact against its downward spring bias;

lifting of the lower second contact into engagement with the upper second contact raises the upper second contact against its downward spring bias; and deenergization of the first and second solenoids allows downward spring bias of the upper first and second contacts suddenly to push down on the lower first and second contacts for suddenly starting downward movement of the first and second armature rods for suddenly separating the lower first and second contacts from engagement with the resiliently mounted downwardly spring biased upper first and second contacts.

27. A system claimed in claim 26, wherein:

said upper first and second contacts are toroidal in configuration and said lower first and second contacts are toroidal in configuration for reducing voltage stress in transformer oil in which all of said toroidal contacts are immersed.

28. Apparatus claimed in claim 23, in which:

said output line, said step-up transformer, said rectifier apparatus, said polarity reversal switching apparatus and at least said first and second resistive discharge paths and said first and second selectively operated switches are immersed in transformer oil;

an oil filter and an oil cooler are in fluid circuit communication with said transformer oil; and a pump circulates transformer oil through said fluid circuit including said filter and said cooler.

29. Apparatus for testing capacitive AC electrical equipment by applying to the capacitive AC electrical equipment very low frequency (VLF) high voltage (HV) sinusoidal electrical full waves, said apparatus comprising:

an electrical output connection for applying VLF HV sinusoidal electrical full waves to capacitive AC electrical equipment;

a voltage step-up transformer for receiving VLF half waves of sinusoidally amplitude modulated voltage of AC electrical power;

said voltage step-up transformer having first and second transformer output terminals for providing VLF HV half waves of sinusoidally modulated voltage of the AC electrical power;

a demodulator having first and second demodulator input terminals connected to said first and second transformer output terminals, respectively, and having first and second demodulator output terminals for providing VLF HV sinusoidal electrical half waves;

a polarity-reversing relay having first, second, third and fourth relay input contacts and having first, second, third and fourth relay output contacts positioned in opposed relation to said first, second, third and fourth relay input contacts, respectively;

said first and second relay input contacts both being connected to said first demodulator output terminal;

said third and fourth relay input contacts both being connected to said second demodulator output terminal;

said first and fourth relay output contacts both being connected to said electrical output connection and said second and third relay output contacts both being connected to a grounded return circuit;

said polarity-reversing relay having a first contact closer operatively associated with said first and second relay input contacts and operatively associated with said first and second relay output contacts for bringing into engagement said first and second relay input contacts with said first and second relay output contacts, respectively;

said polarity-reversing relay having a second contact closer operatively associated with said third and fourth relay input contacts and operatively associated with said third and fourth relay output contacts for bringing into engagement said third and fourth relay input contacts with said third and fourth relay output contacts, respectively; and said first and second contact closers being selectively operable during alternate VLF HV sinusoidal electrical half waves for providing said electrical output connection with VLF HV sinusoidal electrical full waves.

30. Apparatus claimed in claim 29, further comprising:
a tank for containing transformer oil;
said tank having a removable cover mountable on said tank in sealed relationship with said tank for holding transformer oil in the tank; and wherein:
said electrical output connection,
said voltage step-up transformer,
said demodulator,
said polarity-reversing relay, and
said contact closers
are all components of the apparatus mounted below the cover in removable association together with the cover, whereby:
mounting the cover on the tank submerges all of said components of the apparatus in transformer oil contained within the tank, and
removing the cover from mounted relation on the tank removes all of said components of the apparatus together with the cover from the transformer oil in the tank.

31. Apparatus claimed in claim 30, further comprising:
an oil filtering and cooling circuit being in communication with transformer oil in the tank for filtering and cooling the transformer oil;

said oil filtering and cooling circuit including a filter, a cooling radiator and a pump for pumping oil through said filter and through said radiator;
a shroud enclosure mounted on the tank; and
said radiator being positioned outside of the tank within said shroud enclosure.

32. Apparatus claimed in claim 31, further comprising:
a pancake-type fan positioned within said shroud enclosure for providing ambient air flow through the radiator.

33. Apparatus claimed in claim 32, wherein:
said demodulator is a bridge rectifier having first, second, third and fourth rows of series-connected diode rectifiers;
the first row being connected in series between the first demodulator input terminal and the first demodulator output terminal;
the second row being connected in series between the second demodulator input terminal and the second demodulator output terminal;
the third row being connected in series between the first demodulator input terminal and the second demodulator output terminal; and
the fourth row being connected in series between the second demodulator input terminal and the first demodulator output terminal.

34. Apparatus claimed in claim 33, wherein:
said tank containing transformer oil and with the cover mounted thereon in sealed relationship including all said components of the apparatus and with said external shroud enclosure and radiator and pancake fan is portable.

35. Apparatus claimed in claim 29, wherein:
said first and second contact closers are first and second solenoids, respectively, having first and second conductive ferromagnetic armature rods which are lifted by electrically energizing said first and second solenoids;
said first and second relay output contacts are both lifted by said first armature rod;
said third and fourth relay output contacts are lifted by said second armature rod; and
said second and third relay output contacts are connected to ground through said first and second armature rods, respectively.

36. Apparatus claimed in claim 35, wherein:
said first, second, third and fourth relay input contacts are resiliently mounted spring-biased downwardly;
said first, second, third and fourth relay input contacts are toroidal; and
said first, second, third and fourth relay output contacts are toroidal.

37. Apparatus claimed in claim 30, further comprising:
at least first, second and third resistive discharge paths each having less resistance than a preceding path;
said first path being connected in a circuit between said electrical output connection and said grounded return circuit;
first and second switches;
said first switch being operable for placing said second path in a circuit between said electrical output connection and said grounded return circuit; and
said second switch being operable subsequent to said first switch for placing said third path in a circuit between said electrical output circuit and said grounded return circuit.

38. Apparatus claimed in claim 37, wherein:
said first and second switches are operated by first and second solenoids, respectively.

39. Apparatus claimed in claim 37, wherein:
said first resistive discharge path is in series with said second and third resistive discharge paths;
said first switch "shorts" said first path for placing said second and third paths in circuit between said output electrical connection and said grounded return circuit; and
said second switch "shorts" said second path for placing said third path in circuit between said output electrical connection and said grounded return circuit.

40. control apparatus for controlling application of very low frequency (VLF) high voltage (HV) sinusoidal electrical full waves to capacitive AC electrical equipment for testing the equipment, said control apparatus comprising:
an input circuit for supplying AC electrical power;
a variable-voltage AC transformer energizable from said AC electrical power input circuit;
said variable-voltage AC transformer having a movable element for varying output voltage of said variable-voltage transformer;
a drive mechanism for driving said movable element continuously along a predetermined cyclically repeatable path for amplitude-modulating AC voltage suppliable from said input circuit to said variable-voltage AC transformer to form VLF sinusoidally amplitude-modulated half waves of the AC voltage;
said variable-voltage AC transformer having an output connection;
a step-up transformer having a primary winding in circuit with said output connection and having a secondary winding connected to a full-wave rectifier having an output circuit for supplying VLF HV sinusoidal half waves;
a polarity reversal circuit connect to said latter output circuit for converting said VLF HV sinusoidal half waves into VLF HV sinusoidal full waves;
said polarity reversal circuit being connectable to capacitive AC electrical equipment for applying VLF HV sinusoidal full waves to such capacitive AC electrical equipment for testing such equipment;
an ON/OFF switch in said input circuit for turning ON and OFF input of AC electrical power;
said ON/OFF switch being in circuit with said drive mechanism for energizing said drive mechanism from said AC electrical power input circuit upon turning ON said ON/OFF switch for continuously driving said movable element along said predetermined cyclically repeatable path;
a signal for indicating that HV is ON;
said signal being energized upon energization of said variable-voltage AC transformer;
a manually-operable HV ON switch in circuit with said variable-voltage AC transformer and in circuit with said AC electrical power input circuit;
said manually-operable HV ON switch being manually holdable in its ON condition and returning to an off condition upon release of manual holding;
a ZERO-START switch responsive to said movable element;
said ZERO-START switch being closed only when said movable element during continuously movement along said cyclically repeatable path is momentarily at a position corresponding to a zero voltage of said amplitude-modulated AC voltage;
said ZERO-START switch being in series with said HV ON switch;
a relay-operating winding in series with both said HV ON switch and said ZERO-START switch;
first relay contacts in circuit with both said variable voltage AC transformer and said AC electrical power input circuit;
said first relay contacts being closable by energization of said relay-operating winding for energizing said variable-voltage AC transformer from said AC electrical power input circuit;
second relay contacts in circuit with said HV ON switch and said AC electrical power input circuit;
said second relay contacts being closeable by energization of said relay winding for by-passing said HV ON switch;
whereby turning said ON/OFF switch to its ON condition causes said movable element to become continuously driven along said predetermined cyclically repeatable path; and
whereby manually holding said HV ON switch in its ON condition while said movable element is being driven until such time as said movable element is momentarily at said position corresponding to a zero voltage thereby causes said ZERO START switch to complete a circuit between said AC electrical power input circuit and said relay winding, said completed circuit passing through said ZERO-START switch in its ON condition and through said HV ON switch being manually held in its ON condition for energizing said relay winding for closing said first relay contacts for supplying AC electrical power from said input circuit to said variable voltage AC transformer and for signalling that HV is ON and for closing said second relay contacts for by-passing said manually-operable HV ON switch,
whereby an operator in response to such signalling can release holding of the HV ON switch which now is by-passed by closure of said second relay contacts for continuing application of VLF HV sinusoidal electrical full waves to capacitive electrical equipment for testing the equipment.

41. Apparatus claimed in claim 37, wherein:
said first and second switches are operated by electromagnetic actuation.

42. Apparatus claimed in claim 29, further comprising:
at least first, second, and third resistive discharge paths connected in a series circuit between said electrical output connection and said grounded return circuit;
said second path having less resistance than said first path;
said third path having less resistance than said second path;
at least first and second switches;
said first switch being connected in a first switch circuit bridging across said third path;
said first switch being closable during a second half of each half wave, thereby shorting said first switch circuit for removing the resistance of said third path from said series circuit during a second half of each half wave;
said second switch being connected in a second switch circuit bridging across said second path; and
said second switch being closable during a second half of each half wave subsequent to closure of the first switch during the second half of each half wave, thereby shorting said second switch circuit across said second path for removing the resistance of said second path from said series circuit subsequent to removal of the resistance of said third path from said series circuit during the second half of each half wave.

43. Apparatus claimed in claim 42, wherein:

both said first and second switches are closed electromagnetically; and said second switch is closed electromagnetically subsequent to closure of said first switch during the second half of each half wave of the VLF HV sinusoidal electrical full waves.

44. A system for testing capacitive AC electrical equipment by applying to such equipment very low frequency (VLF) high voltage (HV) sinusoidal electrical full waves, said system comprising:

a control unit; and an HV output unit electrically connectable with and disconnectable from said control unit;

said control unit further comprising:

an input circuit for infeeding AC electrical power;

a variable-voltage AC transformer connected to said input circuit and having a movable element for varying output voltage of said variable-voltage transformer;

a drive mechanism for driving said movable element for modulating AC voltage infed from said input circuit to form VLF sinusoidal half waves of the AC voltage; and zero-start circuitry for starting at zero voltage output from said variable-voltage transformer of the VLF sinusoidal half waves of AC voltage;

said HV output unit further comprising:

an electrical output connection for applying VLF HV sinusoidal electrical full waves to capacitive AC electrical equipment;

a voltage step-up transformer for receiving VLF half waves of sinusoidally modulated voltage of AC electrical power;

said voltage step-up transformer having first and second transformer output terminals for providing VLF HV half waves of sinusoidally modulated voltage of the AC electrical power;

a demodulator having first and second demodulator input terminals connected to said first and second transformer output terminals, respectively, and having first and second demodulator output terminals for providing VLF HV sinusoidal electrical half waves;

a polarity-reversing relay having first, second, third and fourth relay input contacts and having first, second, third and fourth relay output contacts positioned in opposed relation to said first, second, third and fourth relay input contacts, respectively;

said first and second relay input contacts both being connected to said first demodulator output terminal;

said third and fourth relay input contacts both being connected to said second demodulator output terminal;

said first and fourth relay output contacts both being connected to said electrical output connection and said second and third relay output contacts both being connected to a grounded return circuit;

said polarity-reversing relay having a first contact closer operatively associated with said first and second relay input contacts and operatively associated with said first and second relay output contacts for bringing into engagement said first and second relay input contacts with said first and second relay output contacts, respectively;

said polarity-reversing relay having a second contact closer operatively associated with said third and fourth relay input contacts and operatively associated with said third and fourth relay output contacts for bringing into engagement said third and fourth relay input contacts with said third and fourth relay output contacts, respectively; and said first and second contact closers being selectively operable during alternate VLF HV sinusoidal electrical half waves for providing said electrical output connection with VLF HV sinusoidal electrical full waves.

45. A system claimed in claim 44, wherein:

said HV output unit further comprises:

at least first, second and third resistive discharge paths each having less resistance than a preceding path;

said first path being connected in a circuit between said electrical output connection and said grounded return circuit;

first and second switches;

said first switch being operable during a second half of each half wave for placing said second path in a circuit between said electrical output connection and said grounded return circuit; and said second switch being operable subsequent to said first switch during a second half of each half wave for placing said third path in a circuit between said electrical output circuit and said grounded return circuit.

46. A system claimed in claim 45, wherein:

said HV output unit further comprises:

a tank for containing transformer oil;

said tank having a removable cover mountable on said tank in sealed relationship with said tank for holding transformer oil in the tank; and wherein:

said electrical output connection, said voltage step-up transformer, said demodulator, said polarity-reversing relay, and said contact closers are all components of the HV output unit mounted below the cover in removable association together with the cover, whereby:

mounting the cover on the tank submerges all of said components of the HV output unit in transformer oil contained within the tank, and removing the cover from mounted relation on the tank removes all of said components of the HV output unit together with the cover from the transformer oil in the tank.

47. A system claimed in claim 46, wherein said HV output unit further comprises:

an oil filtering and cooling circuit in communication with transformer oil in the tank for filtering and cooling the transformer oil;

said oil filtering and cooling circuit including a filter, a cooling radiator and a pump for pumping oil through said filter and through said radiator;

an enclosure mounted on the tank; and said radiator being positioned outside of the tank within said enclosure.

48. A system claimed in claim 47, wherein said Hv output unit further comprises:

a pancake-type fan positioned within said enclosure for providing ambient air flow through the radiator.

49. A system claimed in claim 48, wherein said control unit further comprises:
   a second variable-voltage AC transformer connected in circuit with the variable-voltage AC transformer; and
   a manual control for adjusting AC voltage output from said second variable voltage AC transformer for adjusting voltage of the VLF HV sinusoidal electrical full waves.

50. A system for very low frequency (VLF) high voltage (HV) testing of capacitive electrical AC equipment comprising:
   AC voltage amplitude-modulating apparatus for producing VLF sine-wave shape amplitude-modulation of AC voltage of AC electric power;
   an AC voltage step-up transformer connectable in circuit with the AC voltage amplitude-modulating apparatus for stepping up to HV the VLF sine-wave shape amplitude-modulated AC voltage for providing VLF HV sine-wave shape amplitude-modulated AC voltage;
   demodulation apparatus in circuit with the AC voltage step-up transformer apparatus for demodulating the VLF HV sine-wave shape amplitude-modulated AC voltage for producing VLF HV sinusoidal electrical waves;
   an output circuit suitable for connecting said demodulation apparatus to capacitive electrical AC equipment for applying said VLF HV sinusoidal electrical waves to said capacitive electrical AC equipment for testing such equipment;
   a plurality of resistive discharge paths;
   said plurality of resistive discharge paths including first and second resistive discharge paths;
   said second resistive discharge path having less resistance than resistance of said first resistive discharge path;
   first and second electromagnetically-operated switches; and
   first and second relays operatively associated with said first and second electromagnetically-operated switches, respectively;
   said first relay actuating the first electromagnetically-operated switch for connecting said first resistive discharge path to said output circuit during a second half of each half cycle of said VLF sinusoidal electrical waves;
   said second relay acting subsequently to said first relay for actuating the second electromagnetically-operated switch subsequent to actuation of the first electromagnetically-operated switch for connecting said second resistive discharge path to said output circuit during a second half of each such half cycle subsequent to connection of said first resistive discharge path to said output circuit.

51. A system claimed in claim 50 in which:
   said plurality of resistive discharge paths includes another resistive discharge path;
   said other resistive discharge path being connected to said output circuit by-passing said first and second electromagnetically-operated switches.

52. A system claimed in claim 50 in which:
   said AC voltage amplitude-modulating apparatus includes an output frequency selector,
   said output frequency selector enabling selection of any one of three different output frequencies; and
   a manually-operable control for operating said output frequency selector for selecting one of said output frequencies.

53. A system claimed in claim 52 in which:
   said three different output frequencies are about 0.1 Hertz (Hz), about 0.05 Hz, and about 0.02 Hz.

54. A system claimed in claim 50 comprising:
   a plurality of resistive discharge paths;
   said plurality of resistive discharge paths including first, second and third resistive discharge paths;
   said second resistive discharge path having less resistance than resistance of said first resistive discharge path;
   said third resistive discharge path having less resistance than said resistance of said second resistive discharge path;
   a first, second and third electromagnetically-operated switches;
   first, second and third relays for actuating said first, second and third electromagnetically-operated switches, respectively;
   said first relay actuating the first electromagnetically-operated switch for connecting said first resistive discharge path to said output circuit during a second half of each half cycle of said VLF sinusoidal electrical waves;
   said second relay acting subsequently to said first relay for actuating the second electromagnetically-operated switch subsequent to actuation of the first electromagnetically-operated switch for connecting said second resistive discharge path to said output circuit during a second half of each such half cycle subsequent to connection of said first resistive discharge path to said output circuit; and
   said third relay acting subsequently to said second relay for actuating the third electromagnetically-operated switch subsequent to actuation of the second electromagnetically-operated switch for connecting said third resistive discharge path to said output circuit during a second half of each such half cycle subsequent to connection of said second resistive discharge path to said output circuit.

55. A system claimed in claim 54, in which:
   said plurality of resistive discharge paths includes another resistive discharge path;
   said other resistive discharge path being connected to said output circuit; and
   said other resistive discharge path by-passing said first, second and third electromagnetically-operated switches.

56. A system claimed in claim 50, in which:
   each of said electromagnetically-operated switches includes first and second contacts;
   the first contact being movable and being electromagnetically operated into closing engagement with the second contact;
   the second contact being movable; and
   the second contact being compliantly spring-biased toward the second contact for avoiding contact bounce and jitter upon closing engagement of the first contact with the second contact.

57. A system claimed in claim 56, in which:
   the first contact is vertically movable between a lower open position and an upper closed position;
   the first contact is electromagnetically moved from its lower open position to its upper closed position; and the first contact is downwardly spring-biased toward its lower open position, thereby preventing inadvertent closure of an electromagnetically-operated switch because electromagnetic movement thereof from its lower open position to its upper closed position is required to overcome downward spring-bias in addition to downward pull of gravitational force.

58. Apparatus for very low frequency (VLF) high voltage testing of capacitive AC electrical equipment comprising:

an output line adapted for connection to capacitive AC electrical equipment to be tested;

step-up voltage apparatus for stepping up voltage of VLF half waves of sinusoidally amplitude-modulated AC electrical power to VLF high voltage sinusoidally amplitude-modulated AC voltage;

a high voltage bridge rectifier in circuit with the step-up voltage apparatus for rectifying VLF high voltage sinusoidally amplitude-modulated AC voltage fed from said step-up voltage apparatus to said high voltage bridge rectifier apparatus for obtaining VLF high voltage sinusoidal half waves;

polarity reversal switching apparatus connected in circuit between said rectifier apparatus and said output line for providing positive and negative half waves in alternate succession of VLF high voltage sinusoidal electrical waves for said output line;

at least first, second and third resistive discharge paths;

said second resistive discharge path having less resistance than said first resistive discharge path;

said third resistive discharge path having less resistance than said second resistive discharge path;

first and second selectively operable switches;

said first resistive discharge path being connected in circuit with said output line in resistive discharge relation with said output line;

said first resistive discharge path by-passing said first and second selectively operable switches;

said first switch being operable for bringing said second resistive discharge path into resistive discharge relation with said output line during a second half of each positive half wave of the VLF high voltage sinusoidal electrical waves and also during a second half of each negative half wave of the VLF high voltage sinusoidal electrical waves for discharging voltage from capacitive AC electrical equipment at a faster discharge rate than said first resistive discharge path;

said first switch also being operable for removing said first resistive discharge path from resistive discharge relation with said output line during a first half of each positive half wave of the VLF high voltage sinusoidal electrical waves and also during a first half of each negative half wave of the VLF high voltage sinusoidal electrical waves;

said second switch being operable subsequent to said first switch during the second half of each positive half wave of the VLF high voltage sinusoidal electrical waves and also during the second half of each negative half wave of the VLF high voltage sinusoidal electrical waves for bringing said third resistive discharge path into resistive discharge relation with said output line subsequent to said second resistive discharge path during said second half of each positive half wave and during said second half of each negative half wave for discharging voltage from capacitive AC electrical equipment at a faster discharge rate than said second resistive discharge path; and said second switch also being operable for removing said second resistive discharge path from resistive discharge relation with said output line during the first half of each positive half wave of the VLF high voltage sinusoidal electrical waves and also during the first half of each negative half wave of the VLF high voltage sinusoidal electrical waves.

59. Apparatus claimed in claim 58, including:

a tank suitable for containing transformer oil;

said apparatus being mounted in said tank and being submerged in transformer oil in said tank;

said high voltage bridge rectifier being positioned in said tank closer to said step-up voltage apparatus than said first and second selectively operable switches; and said polarity reversal switching apparatus being positioned in said tank intermediate said high voltage bridge rectifier and said first and second selectively operable switches.

* * * * *